US008653893B2

(12) United States Patent
Tsuchi

(10) Patent No.: US 8,653,893 B2
(45) Date of Patent: Feb. 18, 2014

(54) OUTPUT CIRCUIT, DATA DRIVER CIRCUIT AND DISPLAY DEVICE

(75) Inventor: Hiroshi Tsuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 427 days.

(21) Appl. No.: 13/155,023

(22) Filed: Jun. 7, 2011

(65) Prior Publication Data

US 2011/0298777 A1 Dec. 8, 2011

(30) Foreign Application Priority Data

Jun. 8, 2010 (JP) ................................ 2010-130848
Jun. 8, 2010 (JP) ................................ 2010-130849
Apr. 22, 2011 (JP) ................................ 2011-096240

(51) Int. Cl.
*H03F 3/45* (2006.01)
*G06F 3/038* (2013.01)

(52) U.S. Cl.
USPC ............ 330/255; 330/253; 330/257; 345/204

(58) Field of Classification Search
USPC ................... 330/253, 255, 257; 345/204–215
See application file for complete search history.

(56) References Cited

U.S. PATENT DOCUMENTS 5,311,145 A 5/1994 Huijsing et al.
2007/0176913 A1 8/2007 Satou

FOREIGN PATENT DOCUMENTS

JP 6-326529 A 11/1994
JP 2007-208316 A 8/2007

*Primary Examiner* — Robert Pascal
*Assistant Examiner* — Khiem Nguyen
(74) *Attorney, Agent, or Firm* — Foley & Lardner LLP

(57) ABSTRACT

An output circuit includes a differential input stage, an output amplifier stage, a current control circuit; an input terminal, an output terminal. The current control circuit includes a first circuit that includes a second current source connected between a first power supply terminal and the second current mirror, and exercises control of switching between activating the second current source to couple a current from the second current source to a current on an input side of the first current mirror, and deactivating the second current source, depending on whether or not the input voltage is higher by more than a first preset value than the output voltage; and a second circuit that includes a third current source connected between the second power supply terminal and the first current mirror, and exercises control of switching between activating the third current source to couple a current from the third current source to a current on an input side of the second current mirror, and deactivating the third current source, depending on whether or not the input voltage is lower by more than a second preset value than the output voltage.

31 Claims, 25 Drawing Sheets

OUTPUT RANGE OF LCD (LIQUID CRYSTAL DISPLAY) DRIVER

OUTPUT RANGE OF OLED (ORGANIC LIGHT-EMITTING DIODE) DISPLAY DRIVER

HIGH SLUE RATE OUTPUT CIRCUIT OF EXAMPLE 1 OF THE PRESENT INVENTION

OUTPUT CIRCUIT, DATA DRIVER CIRCUIT AND DISPLAY DEVICE

TECHNICAL FIELD

REFERENCE TO RELATED APPLICATION

This application is based upon and claims the benefit of the priorities of Japanese patent applications No. 2010-130848 filed on Jun. 8, 2010, No. 2010-130849 filed on Jun. 8, 2010, and No. 2011-096240 filed on Apr. 22, 2011, the disclosures of which are incorporated herein in its entirety by reference thereto.

This invention relates to an output circuit, a data driver and a display device.

BACKGROUND

In these days, a liquid crystal display (LCD) device, featured by thin thickness, lightweight and low power consumption, has come into widespread use as a display device, and is predominantly used as a display in a mobile telephone set, such as a mobile phone or a cellular phone, a PDA (Personal Digital Assistant) or in a mobile equipment, such as notebook PC. Only recently, the technology for a large screen size liquid crystal display or the technology adapted for a moving picture has made progress such that it becomes possible to manufacture not only a display for a mobile device but a fixed large screen size display device or a large screen liquid crystal TV set. For a liquid crystal display, a liquid crystal display of an active matrix driving system that allows for high definition display is being used. A display device of the active matrix driving system, making use of an organic light-emitting diode (OLED), is also being developed as thin type display device.

Referring to FIGS. 24A to 24C, a typical arrangement of a thin type display device of the active matrix driving system (liquid crystal display and an organic light emitting diode display) will be briefly described. FIG. 24A is a block diagram showing essential portions of a thin type display device. FIG. 24B is a diagram showing essential portions of a unit pixel of a display panel provided in a liquid crystal display device. FIG. 24C is a diagram showing essential portions of a unit pixel of a display panel provided in an organic light emitting diode display device. It is noted that the unit pixel of each of FIGS. 24B and 24C is shown by a schematic equivalent circuit.

Referring to FIG. 24A, a thin type display device of the active matrix driving system includes a power supply circuit 940, a display controller 950, a display panel 960, a gate driver 970 and a data driver 980. The display panel 960 includes a plurality of unit pixels which are arranged in a two dimensional matrix, and each of which includes a pixel switch 964 and a display element 963. For example, in a color SXGA (Super eXtended. Graphics Array) panel, including 1280×3 pixel columns by 1024 pixel rows, a plurality of scan lines 961 and a plurality of data lines 962 are arrayed in a latticed configuration. The scan line 961 provides a scan signal output from the gate driver 970 to the unit pixel, while the data line 962 provides a gray scale voltage signal from the data driver 980 to the unit pixel. It is noted that the gate driver 970 and the data driver 980 are controlled by the display controller 950, which also supplies a necessary clock signal CLK and control signals. Video data is supplied as a digital signal to the data driver 980. The power supply circuit 940 supplies necessary power necessary to the data driver 980 and to the gate driver 970. The display panel 960 includes a semiconductor substrate. In particular, in a large screen display device, the semiconductor substrate composed of an insulating substrate, such as substrate formed of glass or plastics, on which pixel switches are formed by thin film transistors (TFTs), is in a widespread use.

In the above display device, the scan signal controls on and off of the pixel switch 964, such that, when the pixel switch 964 is turned on, a gray scale voltage signal corresponding to video data, is applied to a display elements 963. The luminance of the display element 963 is varied in response to the gray scale voltage signal to display an image.

Each screen image data is rewritten in one frame period which is approximately 0.017 second in case of 60 Hz driving. Each scan line 961 sequentially selects sequentially a pixel row (pixel switches 964 are turned on) on a per line basis and in a selected period, each data line 962 supplies a gray scale voltage signal via the pixel switch 964 to each display element 963. There are cases where a plurality of pixel rows corresponding to a plurality of scan lines are selected simultaneously, or where the frame frequency exceeds 60 Hz.

In the liquid crystal display device, the display panel 960 includes a semiconductor substrate, an opposite substrate and a liquid crystal sealed in a gap between the two substrates, as shown in FIGS. 24A and 24B. The semiconductor substrate includes unit pixels which are arranged in a matrix array, and each of which includes the pixel switch 964 and a transparent electrode 973, and the opposite substrate includes a transparent electrode 974 the size of the opposite substrate. It is noted that the display element 963 that makes up the unit pixel includes a pixel electrode 973, an opposite substrate electrode 974, a liquid crystal capacitance 971 and an auxiliary capacitance 972. A backlight as light source is provided on the reverse surface of the display panel.

When the pixel switch 964 is turned on by the scan signal supplied on the scan line 961, the gray scale voltage signal from the data line 962 is applied to the pixel electrode 973. The transmission of light from the backlight, passing through the liquid crystal, is changed due to a potential difference between each pixel electrode 973 and the opposite substrate electrode 974. This potential difference is maintained for a certain time interval by the liquid crystal capacitance 971 and the auxiliary capacitance 972 even after the pixel switch 964 for display is turned off (made non-conductive).

It is noted that, in driving the liquid crystal device, the voltage polarity of each pixel electrode 973 is switched to be positive or negative with respect to a common voltage of the opposite substrate electrode 974, usually on a per-frame period basis, in order to prevent liquid crystal from deterioration (inverted driving). Typical inverted driving includes dot inversion driving which provides for different voltage polarities between neighboring pixels, and column inversion which provides for different voltage polarities between neighboring pixels columns. In the dot inversion driving, gray scale voltage signals of different voltage polarities are output on the data line 962 from one selection period (data period) to the next. In the column inversion driving, the gray scale voltage signal is output to the same voltage polarity for respective selection periods (respective data periods) within one frame period, and gray scale voltage signals of different voltage polarities are output from one frame period to the next.

In the organic light emitting diode, the display panel 960 is formed by a semiconductor substrate on which there are arrayed unit pixels in a matrix configuration, as shown in FIG. 24A. Each unit pixel includes a pixel switch 964, an organic light emitting diode 982 and a thin film transistor (TFT) 981. The organic light emitting diode 982 is an organic film sandwiched between two thin film electrode layers. The thin film transistor (TFT) 981 controls a current supplied to the organic light emitting diode 982. The TFT 981 and the organic light emitting diode 982 are connected in series between power supply terminals 984 and 985 which are supplied with different power supply voltages. There is also provided an auxiliary capacitance 983 that holds a control terminal voltage of the TFT 981. A display element 963 corresponding to one pixel includes the TFT 981, organic light emitting diode 982, power supply terminals 984, 985 and the auxiliary capacitance 983.

When the pixel switch 964 is turned on by the scan signal supplied on a scan line 961, the gray scale voltage signal from the data line 962 is applied to the control terminal of the TFT 981. The current corresponding to the gray scale voltage signal is supplied by the TFT 981 to the organic light emitting diode 982, which emits light with luminance according to the current, thereby making display. The gray scale voltage signal, applied to the control terminal of TFT 981, is kept for a certain time interval by the auxiliary capacitance 983, even after the pixel switch is turned off, thereby maintaining the state of light emission. The pixel switch 964 and the TFT 981 are shown to be formed by Nch transistors, however, these may also be formed by Pch transistors. The organic light emitting diode may also be connected to the power supply terminal 984. It is noted that, in driving the organic light emitting diode display device, no driving inversion, as used in the liquid crystal device, is necessary, such that a gray scale voltage signal, corresponding to the pixel, is output on a per selection period (one data period) basis.

In addition to the display configuration of the organic light emitting diode display device, in which display is in response to the gray scale voltage signal from the data line 962, there is another configuration in which display is done in response to a gray scale current signal output from a data driver. The display configuration disclosed herein is restrictively in response to the gray scale voltage signal output from the data driver. It should be noted however that the present invention is not limited to this display configuration.

In FIG. 24A, it suffices that the gate driver 970 supplies a scan signal which is at least a binary signal. On the other hand, the data driver 980 has to drive each data line 962 with multi-level gray scale voltage signals correlated with the number of gray scales. Hence, the data driver 980 includes an output circuit that amplifies a gray scale voltage signal corresponding to video data, and that outputs the so amplified signal to the data line 962.

In mobile equipment for high-end use, notebook PC, monitors or television receiver, having a thin type display device, there is recently an increasing need for higher image quality. More specifically, there is about to be raised a demand for multi-color display for not less than 16800000 colors for video data with 8 bits for each of R, G and B, for higher quality for moving pictures, and for three-dimensional display. In order to meet such demand, the frame frequency, that is, the driving frequency of rewriting each picture image, has to be increased to 120 Hz or even higher. If the frame frequency is increased by a factor of N, each data output period is reduced to 1/N.

It is demanded of the data driver of the display device to output a voltage with a high precision correlated with the increase in gray levels as well as to drive a data line at a high speed. It is thus demanded of an output circuit of the data driver 980 to have a high driving capability in order to charge or discharge the data line capacitance at a high speed. On the other hand, to ensure uniformity in writing of a gray scale voltage signal in the display element, there is also raised a demand for symmetry in the slew rate of the data line driving waveform at the time of charging/discharging. However, current consumption is increased as the driving capability of the output circuit is raised. Thus, the output circuit also suffers the problem of increased power consumption and heat generation.

The following techniques are disclosed to implement high speed driving of the data line of the display device.

FIG. 25 is a drawing cited from FIG. 1 of Patent Document 1 (JP Patent Kokai Publication No. JP-P2007-208316A). This output circuit includes a differential input stage 50, including a P-type differential input stage 60A and an N-type differential input stage 60B, a current mirror 70, a push-pull output stage 80, a first auxiliary current source 60C, a second auxiliary current source 60D, a control circuit 90 and an output auxiliary circuit 100. The P-type differential input stage 60A includes a first current source 51, connected between the power supply VDD and a node N1, and PMOS transistors (Pch transistors) 61 and 62 that have coupled sources connected to the node N1, drains connected to nodes N13 and N14, respectively and gates connected to IN and OUT, respectively.

The N-type differential input stage 60B includes a second current source 52, connected between a node N2 and a power supply VSS, and NMOS transistors (Nch transistors) 63 and 64 that have sources connected in common to a node N2, drains connected to nodes N11 and N12, respectively and gates connected to IN and OUT, respectively.

The current mirror 70 causes a first power supply current to flow through nodes N12 and N14, while causing a second power supply current, correlated with the first power supply current, to flow through nodes N11 and N13. In the current mirror 70, a PMOS transistor 71, a resistor 73 and an NMOS transistor 75 are connected in series between VDD and VSS, while a PMOS transistor 72, a resistor 74 and an NMOS transistor 76 are connected in series between VDD and VSS. The PMOS transistor 71 has its gate and drain coupled together, while the NMOS transistor 75 has its gate and drain coupled together. The NMOS transistors 75 and 76 have gates coupled together.

A push-pull output stage 80 includes a PMOS transistor 81 that has source connected to the power supply VDD, a gate connected to a node N11 and a drain connected to OUT, and an NMOS transistor 82 that has a source connected to VSS, a gate connected to N13 and a drain connected to OUT. A phase compensation capacitance 83 is connected between a gate (node N11) and a drain of the PMOS transistor 81. A phase compensation capacitance 84 is connected between a gate (node N13) and a drain of the NMOS transistor 82.

The first auxiliary current source 60C includes a third current source 53 that has one end connected to the power supply VDD, and a PMOS transistor 65 that has a source connected to the other end of the third current source 53, a gate connected to a node N15 and a drain connected to a node N1. The first auxiliary current source 60C also includes a PMOS transistor 65-9 that has a source connected to the other end of a third current source 53, a gate connected to a node N17 and a drain connected to a node N1. The second auxiliary current source 60D includes a fourth current source 54 that has one end connected to the power supply VSS, and an NMOS transistor 66 that has a source connected to the other end of the fourth current source 54, a gate connected to a node N16 and a drain connected to a node N2. The second auxiliary current source 60D also includes an NMOS transistor 66-10 that has a source connected to the other end of a fourth current source 54, a gate connected to a node N18 and a drain connected to a node N2.

The control circuit 90 includes a controller 93, an output stage auxiliary unit 94 and current sources 91 and 92. Of these, the current source 91, controller 93 and the current source 92 are connected in series between VDD and VSS. In addition, an output stage auxiliary unit 94 is connected between nodes N11 and N13. The controller 93 includes an NMOS transistor 93-1 (first detection transistor) that has a drain connected to a node N15, a gate connected to IN and a source connected to OUT, and a PMOS transistor 93-2 (second detection transistor). The PMOS transistor 93-2 has a source connected to OUT, a gate connected to IN and a drain connected to a node N16. The controller 93 detects the potential difference between IN and OUT and, based on the result of detection of the potential difference between IN and OUT, controls the gate potentials of the PMOS transistors 65 and 94-7 and the NMOS transistors 66 and 94-8.

The output stage auxiliary unit 94 includes a PMOS transistor 94-7 that has a source connected to node N11, a gate connected to N15 and a drain connected to OUT, and a PMOS transistor 94-8 that has a source connected to node N13, a gate connected to node N16 and a drain connected to OUT.

The output auxiliary circuit 100 includes a current source 101, connected between the power supply VDD and node N17, and a current source 102 connected between node N18 and the power supply VSS. The output auxiliary circuit 100 also includes a diode-connected PMOS transistor 113 that has a source connected to the power supply VDD, and a PMOS transistor 111 that has a source connected to the drain of the PMOS transistor 113, a gate connected to node N11 and a drain connected to node N18. The output auxiliary circuit 100 also includes a PMOS transistor 114 that has a source connected to the drain of PMOS transistor 113, a gate connected to node N17 and a drain connected to node N11, and a diode-connected NMOS transistor 116 that has a source connected to the power supply VSS. The output auxiliary circuit 100 also includes an NMOS transistor 112 that has a source connected to the drain of the NMOS transistor 116 that has a gate connected to node N13 and a drain connected to node N17, and an NMOS transistor 115 that has a source connected to a drain of the NMOS transistor 116, a gate connected to node N18 and a drain connected to node N13.

The PMOS transistor 111 controls the voltage at the gates (node N18) of NMOS transistors 66-10 and 115, based on the potential at the node N11, while managing control to fix the potential at node N13 by the NMOS transistor 115. The NMOS transistor 112 operates complementarily with respect to the PMOS transistor 111 to control the gates of PMOS transistors 65-9 based on the potential at the node N13 as well as to fix the potential at the node N11 by the PMOS transistor 114.

The control circuit 90 exercises control to detect the input/output potential difference (93) at the time of input variations to turn on output stages 81 and 82 deeply and to increase the current in the differential input stage 50 to raise the slew rate (amount of output voltage variation per unit time).

The output auxiliary circuit 100 suppresses a through current (short circuit current) in the output stage 80.

When the input terminal is at the same voltage as the output terminal, the transistors 93-1 and 93-2 of the controller 93 and the transistors 94-7 and 94-8 of the output stage auxiliary unit 94 are all turned off. When the voltage at the input terminal IN is markedly changed towards the VDD side with respect to the voltage at the output terminal OUT, the NMOS transistor 93-1 is turned on to pull up the gate of the PMOS transistor 94-7 (node N15) to the voltage at the output terminal OUT. This causes the PMOS transistor 94-7 to be turned on to pull down the gate voltage of the PMOS transistor 81 of the output stage 80 (node N11), instantaneously. The PMOS transistor 81 is turned on to quickly charge the output terminal OUT from the power supply VDD to approach to the voltage at the input terminal IN.

When the gate of the PMOS transistor 94-7 (node N15) is pulled down at this time, the PMOS transistor 65 of the first auxiliary current source unit 60C of the differential input stage 50 is turned on. The current in the third current source 53 is added to the current in the first current source 51 in driving the PMOS differential pairs 61 and 62 to accelerate charging/discharging at the capacitance 84.

When the voltage at the output terminal OUT approaches to that at the input terminal IN, the NMOS transistor 93-1 of the controller 93 is turned off. Then, the transistor 94-7 of the output stage auxiliary unit 94 is also turned off to halt the charging at the output terminal OUT automatically. The voltage at the node N15 is the power supply voltage VDD and the PMOS transistor 65 of the first auxiliary current source 60C is turned off.

When the voltage at the input terminal IN is changed towards the VDD side, the transistor 93-2 of the controller 93, NMOS transistor 94-8 of the output stage auxiliary unit 94 and the NMOS transistor 66 of the second auxiliary current source 60D are off. If, on the other hand, the voltage at the input terminal IN is markedly changed towards the VSS side, the transistor 93-2 of the controller 93 and the NMOS transistor 94-8 of the output stage auxiliary unit 94 are turned on to pull up the gate voltage (node N16) of the NMOS transistor 82 of the output stage 80 instantaneously to quickly discharge the output terminal OUT. As the voltage at the output terminal OUT approaches to that at the input terminal IN, the discharging halts automatically. The NMOS transistor 66 of the second auxiliary current source 60D of the differential input stage 50 is also turned on as long as the transistor 93-2 of the controller 93 is in operation. The driving current of the Nch differential pair 63 and 64 is increased to a current value which is the sum of the current at the second current source 52 and that at the fourth current source 54 to accelerate the charging/discharging at the capacitance 83. At this time, the NMOS transistor 93-1 of the controller 93, PMOS transistor 94-7 of the output stage auxiliary unit 94 and the PMOS transistor 65 of the first auxiliary current source 60C are all turned off.

The control circuit 90 is in operation when the voltage at the input terminal IN is markedly changed with respect to the voltage at the output terminal OUT to cause the output terminal OUT to approach quickly to the voltage at the input terminal IN. On the other hand, the auxiliary current sources 53 and 54 of the differential input stage 50 are connected to the respective differential pairs, depending on the operation of the control circuit 90, such as to accelerate charging/discharging of the capacitances 83 and 84. This allows driving the output terminal OUT quickly to a voltage that will prevail after change of the voltage at the input terminal IN.

The phase compensation capacitances 83 and 84, respectively connected between the gates and the drains of the output stage transistors 81 and 82 (output terminal OUT), are of sufficiently large capacitance values as compared with the parasitic capacitances of the elements.

[Patent Document 1] JP Patent Kokai Publication No. JP-P2007-208316A

[Patent Document 2] JP Patent Kokai Publication No. JP-A-6-326529

SUMMARY

The above mentioned Patent Documents are incorporated herein by reference thereto. The following analysis is given from a viewpoint of the present disclosure.

The circuit shown in FIG. 25 suffers a problem that, if the voltage at the output terminal OUT is changed in high speed, a large through current flows through the output stage 80 due to capacitive coupling of the phase compensation capacitance 83 or 84. Such problem has been elucidated by the analysis conducted by the present inventor.

As the gate voltages of the transistors 81 and 82 of the output stage 80 in response to the output current from the differential input stage 50, the gate voltages of the transistors 81 and 82 of the output stage 80 (voltages at nodes N11 and N13) are both pulled down during charging at the output terminal OUT. The phase compensation capacitances 83 and 84 are also charged/discharged in response to changes in the output terminal voltage.

On the other hand, the gate voltages of the transistors 81 and 82 of the output stage 80 (voltages at the nodes N11 and N13) are both raised. The phase compensation capacitances 83 and 84 are also charged/discharged in keeping according to the change in the voltage at the output terminal.

However, the change in voltage of the gate (node N11 or N13) of the PMOS transistor 81 or the NMOS transistor 82 of the output stage 80 (node N11 or N13) brought about by the on-operation of PMOS transistor 94-7 or the NMOS transistor 94-8, in turn brought about respectively by the turning on of the NMOS transistor 93-1 or the PMOS transistor 93-2 of the control circuit 90, is quicker than the change in the gate voltage of the PMOS transistor 81 or the NMOS transistor 82 of the output stage 80 which occurs in response to the output current from the differential input stage 50. Thus, only gate voltage change of one of the transistors 81 and 82 of the output stage is in effect. That is, there is produced no such operation that the gate voltages of the transistors 81 and 82 during charging/discharging at the output terminal in accordance with the output current from the differential input stage 50 are both pulled up or pulled down.

Hence, during charging at the output terminal, the charging/discharging of the phase compensation capacitance 84 is unable to catch up with rapid change in the voltage at the output terminal, as a result of which, due to capacitive coupling of the phase compensation capacitance 84, the gate potential (potential at N13) is increased to turn on the NMOS transistor 82. The through current flows through the PMOS transistor 81 and the NMOS transistor 82 of the output stage 80.

On the other hand, during discharging at the output terminal, the charging/discharging of the phase compensation capacitance 83 is unable to catch up with rapid changes in the voltage at the output terminal. The gate potential of the PMOS transistor 81 of the output stage 80 is lowered to turn on the PMOS transistor 81. A through current flows through the PMOS transistor 81 and the NMOS transistor 82 of the output stage 80.

In order to prevent such a through current, there is provided the output auxiliary circuit 100 that may come into operation in response to changes in the gate voltage of the PMOS transistor 81 and the NMOS transistor 82 of the output stage 80, as shown in FIG. 25.

For example, when the voltage at the input terminal IN is markedly changed towards the VDD side with respect to the voltage at the output terminal OUT, the control circuit 90 comes into operation to pull down the gate potential of the PMOS transistor 81 of the output stage 80. The voltage at the output terminal OUT rapidly approaches to that at the input terminal IN.

With rapid rise of the voltage at the output terminal OUT, the gate voltage of the NMOS transistor 82 of the output voltage 80 also is going to increase due to capacitive coupling of the phase compensation capacitance 84.

If there lacks the output auxiliary circuit 100 in FIG. 25, and the gate voltage of the NMOS transistor 82 is markedly increased, large through current is produced in the output stage 80 to flow from the power supply VDD to the power supply VSS.

On the other hand, when the gate potential of the PMOS transistor 81 of the output stage 80 is pulled down, the PMOS transistor 111 of the output stage 100 is turned on to pull up the gate potential of the NMOS transistor 115. The NMOS transistor 115 is thus turned on to suppress the gate potential of the NMOS transistor 82 of the output stage 80 from rising. It is noted that the NMOS transistor 115 has a drain connected to the gate of the transistor 82 of the output stage 80, a source connected to VSS via diode-connected NMOS transistor 116. The NMOS transistor 82 of the output stage 80 may thus be suppressed from being turned on to suppress the through current in the output stage 80.

When the voltage at the input terminal IN is changed markedly towards the VSS side, the gate potential of the NMOS transistor 82 of the output stage 80 is pulled up to turn on the NMOS transistor 112 of the output auxiliary circuit 100. This lowers the gate potential of the PMOS transistor 114 to turn on the PMOS transistor 114. The PMOS transistor 114 has a drain connected to the gate of the PMOS transistor 81 of the output stage 80, and has a source connected to the power supply VDD via diode-connected PMOS transistor 113. This suppresses the gate voltage of the PMOS transistor 81 of the output stage 80 from decreasing to prevent the PMOS transistor 81 of the output stage 80 from being turned on, thereby suppressing a through current from flowing through the output stage.

The output auxiliary circuit 100 also includes an NMOS transistor 65-9 and a PMOS transistor 66-10 that activate the auxiliary current sources 53 and 54 of the differential input stage 50, when the gate voltages of the output stage transistors 81 and 82 are changed in keeping with the charging/discharging at the output terminal. When the auxiliary current sources 53 and 54 of the differential input stage 50 are activated, charging/discharging of the capacitances 83 and 84 is accelerated.

That is, in FIG. 25, the transistors 65 and 66-10 are turned on in response to the operation of the control circuit 90 and the output auxiliary circuit 100, at the time of charging of the output terminal, thus activating both the auxiliary current sources 53 and 54 of the differential input stage 50. The transistors 66 and 65-9 are turned on at the time of discharging at the output terminal, thus activating both the auxiliary current sources 53 and 54 of the differential input stage 50.

Referring to FIG. 23, the output range of the display data driver will now be explained. It is noted that FIGS. 23A and 23B are the drawing prepared by the present inventors for explanation of the problem inherent in the related technique. FIG. 23A shows the output range of the LCD driver. VDD and VSS stand for the high potential power supply voltage and the low potential power supply voltage, respectively. VSS in general stands for the ground potential=0V. The LCD driver effects polarity inversion driving between the positive electrode (high potential side) and the negative electrode (low potential side) with respect to the common voltage COM of the opposite substrate electrode which is in the vicinity of a mid-point between the power supply voltages VDD and VSS.

FIG. 23B shows an output range of the OLED driver of an active matrix driving system (voltage programming configuration). In the OLED driver, there is no polarity inversion driving necessary for LCD. FIG. 23B shows a case for the output range being between VSS+Vdif and VDD. The potential difference may be an electrode-to-electrode potential difference necessary for an OLED element formed on the display panel to emit light or may also be based on threshold voltages of transistors on the display panel that control the current supplied to the OLED element.

The output range of the output circuit of the data driver driving the positive output range (differential amplifier) of FIG. 23A and that of the output circuit of the data driver driving the output range (differential amplifier) of FIG. 23B are in the high potential side. Hence, these output circuits may be driven by differential amplifiers composed only of the Nch differential input stage to the exclusion of the Pch differential stage. On the other hand, the output range of the output circuit of the data driver driving the negative electrode output range (differential amplifier) of FIG. 23A is in the low potential side, and hence may be driven by a differential amplifiers composed only of a Pch differential input stage to the exclusion of the N-type differential stage. In case the conductivity type of the differential stage is just one of Pch and Nch, the number of transistors composing the differential amplifier may be reduced to save the area (to lower the cost).

However, if the differential amplifier of the differential stage is to be one of a Pch-type differential pair and an Nch-type differential pair, it is difficult to implement slew rate symmetry of the data line driving waveform at the time of charging/discharging. By the slew rate symmetry of the data line driving waveform at the time of charging/discharging is meant that the sign of the change of the output voltage of the rising and falling waveforms per unit time is opposite or symmetrical, with the absolute value of the change being the same.

For example, if the P-type differential input stage 60A (differential pairs 61 and 62 and the current source 51) is deleted in the output circuit of FIG. 25, the circuit 60C becomes unable to operate, because the circuit 60C is devoid of the destination of current delivery (Pch differential input stage 60A) from the auxiliary current source 53. Hence, the operation of the differential input stage 50 is just that of the N-type differential input stage 60B and the second auxiliary current source 60D.

At this time, the output current of the N-type differential input stage 60B may directly operate on the capacitance 83 or the gate of the PMOS transistor 81 of the output stage 80 connected to the drain of one 63 of the transistors of the differential pair of the Nch differential input stage 60B (node N11). However, the output current of the N-type differential input stage 60B may only indirectly operate on the capacitance 84 or the gate of the NMOS transistor 82 of the output stage 80 connected to the node N13 only via resistor 74 between the drain of the NMOS transistor 63 (node N11) and the node N13. Hence, the amplifying operation by the output current of the N-type differential input stage 60B at the time of charging becomes non-symmetrical with respect to that at the time of discharging. As a result, the data line driving waveform at the rise time tends to be non-symmetrical with respect to that at the fall time.

It is seen from the above analysis that the above described related technique suffers from an increased number of the additional transistors, increased circuit area and high cost, even granting that, by addition of the control circuit 90, auxiliary current sources 53 and 54 of the differential input stage 50 or the output auxiliary circuit 100, it is possible to suppress the through current in the output stage to provide for a high slew rate.

If the differential stage is composed of the single conductivity type differential pair, it is difficult to provide for symmetry of the driving voltage waveform at the time of charging/discharging of the load capacitance (capacitive load connected to the output terminal).

It is therefore an object of the present invention to provide an output circuit capable of accommodating a high-speed operation and suppressing power consumption, a data driver provided with the output circuit, and a display device.

It is another object of the present invention to provide an output circuit being able to have symmetric output voltage waveform in the charging/discharging of the load capacitance even in case a differential pair is composed of the single conductivity type differential pair, a data driver provided with the output circuit, and a display device.

The present invention has in general the following configuration, though not in the limiting fashion. The reference numerals of respective components, shown enclosed in parentheses, are only for assisting in understanding of the present invention and are not for restricting the present invention.

According to the present invention, there is provided an output circuit comprising a differential input stage (170, 130, 140, 150, 160), an output amplifier stage (110), a current control circuit (120), an input terminal (1), an output terminal (2) and first to fourth power supply terminals (E1 to E4). The differential input stage includes: a first current source (113);

a first differential pair (111, 112) driven by the first current source (113) and including a pair of transistors differentially receiving an input signal (VI) at the input terminal (1) and an output signal (VO) at the output terminal (2);

a first current mirror (130) of a first conductivity type that is connected between the first power supply terminal (E1) and first and second nodes (N1, N2) and that receives an output current of the first differential pair;

a second current mirror (140) of a second conductivity type that is connected between the second power supply terminal (E2) and third and fourth nodes (N3, N4);

a first connection circuit (150) connected between the second node (N2), to which an input of the first current mirror is connected, and the fourth node (N4), to which an input of the second current mirror is connected; and a second connection circuit (160) connected between the first node (N1), to which an output of the first current mirror is connected, and the third node (N3), to which an output of the second current mirror is connected.

The output amplifier stage (110) includes:

a first transistor (101) of the first conductivity type (P type) that is connected between the third power supply terminal (E3) and the output terminal (2), and that has a control terminal connected to the first node (N1); and a second transistor (102) of a second conductivity type (N type) that is connected between the output terminal (2) and the fourth power supply terminal (E4) and that has a control terminal of the second transistor connected to the third node (N3).

According to the present invention, the current control circuit (120) includes at least one out of a first circuit and a second circuit.

The first circuit includes a second current source (123) connected to the first power supply terminal (E1) and a circuit (103, 105, 121). The first circuit includes exercises control of switching between activating the second current source (123) to couple a current (15) from the second current source (123) to one of an input current to the first connection circuit (150) and an output current from the first connection circuit (150), and deactivating the second current source, depending on whether or not a voltage difference between the output voltage (VO) at the output terminal (2) and a voltage at the first power supply terminal (E1) by comparison is greater by more than a first preset value (threshold value of transistor (103)) than a voltage difference between the input voltage (VI) at the input terminal (1) and the voltage at the first power supply terminal.

The second circuit includes a third current source (124) connected to the second power supply terminal (E2) and a circuit (104, 122, 106) and exercises control of switching between activating the third current source (124) to couple a current (I6) from the third current source (124) to the other of an input current to the first connection circuit (150) and an output current from the first connection circuit and deactivating the third current source (124), depending on whether or not a voltage difference between the output voltage (VO) at the output terminal (2) and a voltage at the second power supply terminal is greater by more than a second preset value (absolute threshold value of transistor 104) than a voltage difference between the input voltage (VI) at the input terminal (1) and the voltage at the second power supply terminal.

According to the present invention, the current control circuit (120) includes:

a first load element (121) and the second current source having one ends connected in common to the first power supply terminal (E1);

a third transistor (103) of a second conductivity type that has a first terminal connected to the output terminal (2), a second terminal connected to the other end of the first load element (121) and a control terminal connected to the input terminal (1); and a fourth transistor (105) of a first conductivity type that has a first terminal connected to the other end of the second current source (123), a second terminal connected to a preset node (node N4 or a first terminal of a transistor (143) whose second terminal is connected to N4) on an input side of the second current mirror (140), and a control terminal connected to a connection node (3) between the other end of the first load element (121) and a second terminal of the third transistor (103);

a second load element (122) and a third current source (124) having one ends connected in common to the second power supply terminal (E2);

a fifth transistor (104) of a first conductivity type that has a first terminal connected to the output terminal (2), having a second terminal connected to the other end of the second load element (122) and having a control terminal connected to the input terminal (1); and a sixth transistor (106) of a second conductivity type that has a first terminal connected to the other end of the third current source (124), a second terminal connected to a preset node (node N2 or a first terminal of a transistor (133) whose second terminal is connected to N2) on the input side of the first current mirror (130) and a control terminal connected to a connection node (4) between the other end of the second load element (122) and a second terminal of the fifth transistor (104).

The current control circuit (120) may include:

a first load element (121) and the second current source (123) having one ends connected in common to the first power supply terminal (E1);

a third transistor (103) of a second conductivity type that has a first terminal connected to the output terminal (2), a second terminal connected to the other end of the first load element (121) and a control terminal connected to the input terminal (1); and a fourth transistor (105) of a first conductivity type that has a first terminal connected to the other end of the second current source (123), a second terminal connected to a preset node on an input side of the first current mirror (130) (node N2 or the first terminal of transistor (133) that has a second terminal connected to N2), and a control terminal connected to a connection node (3) between the other end of the first load element (121) and the second terminal of the third transistor (103);

a second load element (122) and the third current source (124) having one ends connected in common to the second power supply terminal (E2);

a fifth transistor (104) of the first conductivity type that has a first terminal connected to the output terminal (2), a second terminal connected to the other end of the second load element (122) and a control terminal connected to the input terminal (1); and a sixth transistor (106) of a second conductivity type that has a first terminal connected to the other end of the third current source (124), a second terminal connected to a preset node (node N4 or the first terminal of transistor (143) whose second terminal is connected to N4) on the input side of the second current mirror (140) and a control terminal connected to a connection node (4) between the other end of the second load element (122) and a second terminal of the fifth transistor (104).

According to the present invention, there are provided a data driver of a display device including the output circuit, and the display device including the data driver.

According to the present invention, it is possible to accommodate a high-speed operation and to suppress power consumption. According to the present invention, it is also possible to implement output voltage waveform symmetry during charging/discharging even in case of simplifying the configuration of the differential pair to a single conductivity type.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
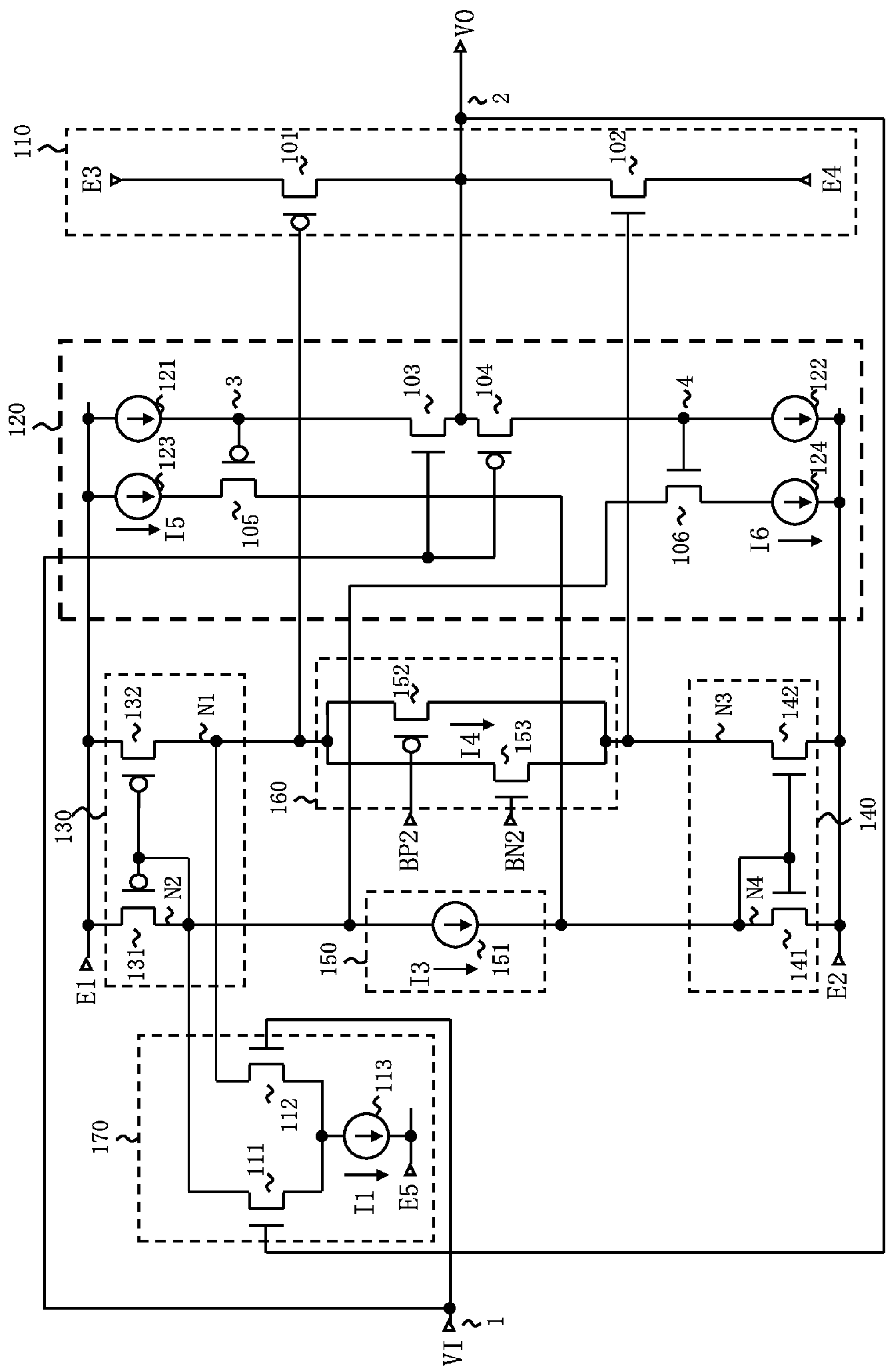
FIG. 1 is a diagram showing the configuration of a first exemplary embodiment of the present invention.

Preferred modes of the present invention will now be described with reference to the drawings.

In one of the preferred modes of the present invention, the output circuit includes an input terminal (1) for receiving a signal, an output terminal (2) for outputting a signal, a differential input stage (170, 130, 140, 150 and 160), an output amplifier stage (110) and a current control circuit (120).

The differential input stage includes:

a first differential stage (170) that has a pair of inputs for differentially receiving an input signal (VI) at the input terminal (1) and an output signal (VO) at the output terminal (2);

a first current mirror (130) that includes a pair of transistors of the first conductivity type (P type) connected between the first power supply terminal (E1) and the first and second nodes (N1, N2), and that differentially receives at the first and second nodes (N1, N2), a pair of output currents of a pair of outputs of the first differential stage (170);

a second current mirror (140) that includes a pair of transistors of the second conductivity type (N type), connected between the second power supply terminal (E2) and third and fourth nodes (N3, N4);

a first floating current source circuit (150) connected between the second node (N2), to which an input of the first current mirror (130) is connected, and the fourth node (N4), to which an input of the second current mirror (140) is connected; and a second floating current source circuit (160) connected between the first node (N1), to which an output of the first current mirror (130) is connected, and the third node (N3), to which an output of the second current mirror (40) is connected.

The output amplifier stage (110) includes:

a first transistor (101) of the first conductivity type (P type) that is connected between the third power supply terminal (E3) and the output terminal (2) and that has a control terminal connected to the first node (N1); and a second transistor (102) of the second conductivity type (N type) that is connected between the fourth power supply terminal (E4) and the output terminal (2) and that has a control terminal connected to the third node (N3).

The current control circuit (120) includes:

a third transistor (103) of the second conductivity type (N type) that has a first terminal (source terminal) connected to the output terminal (2) and a control terminal (gate terminal) connected to the input terminal (1);

a first load element (121) that is connected between the first power supply terminal (E1) and a second terminal (drain terminal) of the third transistor (103);

a fourth transistor (104) of the first conductivity type (P type) that has a first terminal (source terminal) connected to the output terminal (2) and a control terminal (gate terminal) connected to the input terminal (1);

a second load element (122) that is connected between the second power supply terminal (E2) and a second terminal (drain terminal) of the fourth transistor (104);

a second current source (123) and a fifth transistor (105) of the first conductivity type (P type) that are connected in series between the first power supply terminal (E1) and a preset node on the input side of the second current mirror (N4 or a first terminal (source terminal) of a transistor (143) that has a second terminal (drain terminal) connected to N4); and a third current source (124) and a sixth transistor (106) of the second conductivity type (N type) connected in series between the second power supply terminal (E2) and a preset node on the input side of the first current mirror (node N2 or a first terminal (source terminal) of a transistor (133) whose second terminal (drain terminal) is connected to the node N2).

The control terminal (gate terminal) of the fifth transistor (105) is connected to a connection node (3) between the third transistor (103) and the first load element (121). The control terminal (gate terminal) of the sixth transistor (106) is connected to a connection node (4) between the fourth transistor (104) and the second load element (122).

The current control circuit (120) includes:

a third transistor (103) of the second conductivity type (N type) that has a first terminal (source terminal) connected to the output terminal (2) and a control terminal (gate terminal) connected to the input terminal (1);

a first load element (121) connected between the first power supply terminal (E1) and a second terminal (drain terminal) of the third transistor (103);

a fourth transistor (104) of the first conductivity type (P type) that has a first terminal (source terminal) connected to the output terminal (2) and a control terminal (gate terminal) connected to the input terminal (1);

a second load element (122) connected between the second power supply terminal (E2) and a second terminal (drain terminal) of the fourth transistor (104);

a second current source (123) and a fifth transistor (105) of the first conductivity type (P type) connected in series between the first power supply terminal (E1) and a preset node on the input side of the first current mirror (node N2 or a first terminal (source terminal) of a transistor (133) whose second terminal (drain terminal) is connected to the node N2); and a third current source (124) and a sixth transistor (106) of the second conductivity type (N type) connected in series between the second power supply terminal (E2) and a preset node on the input side of the second current mirror (node N4 or a first terminal (source terminal) of a transistor (143) whose second terminal (drain terminal) is connected to the node N4).

The control terminal (gate terminal) of the fifth transistor (105) is connected to the connection node (3) between the third transistor (103) and the first load element (121). The control terminal (gate terminal) of the sixth transistor (106) is connected to a connection node (4) between the fourth transistor (104) and the second load element (122).

The following describes exemplary embodiments of the present invention. It is noted that exemplary embodiments 1 to 9 correspond to exemplary embodiments 1 to 9 in the JP Patent Application No. 2010-130848 and exemplary embodiments 10 to 18 correspond to exemplary embodiments 1 to 9 in the JP Patent Application No. 2010-130849. Exemplary embodiment 19 corresponds to exemplary embodiment 10 in the JP Patent Application No. 2010-130848 and JP Patent Application No. 2010-130849. Exemplary embodiment 20 corresponds to exemplary embodiment 11 in the JP Patent Application No. 2010-130848 and JP Patent Application No. 2010-130849.

<Exemplary Embodiment1>

FIG. 1 shows an arrangement of an output circuit of Exemplary Embodiment 1 of the present invention. In the present Exemplary Embodiment 1, an output circuit preferably drives an interconnect load, and includes a differential input stage, an output amplifier stage 110 and a current control circuit 120. The differential input stage differentially receives an input voltage VI at an input terminal 1 and an output voltage VO at an output terminal 2. The output amplifier stage 110 receives first and second outputs of the differential input stage at nodes N1 and N3 to perform a push-pull operation to output at an output terminal 2 an output voltage VO correlated with the input voltage VI. The current control circuit 120 detects a potential difference between the input voltage VI and the output voltage VO to control the currents of current mirrors 130 or 140 in response to the potential difference.

Referring to FIG. 1, the output circuit of the present Exemplary Embodiment is implemented as a voltage follower in which the output terminal 2 is connected back to an inverting input terminal of a differential input stage 170 so that the output voltage VO is changed to follow the input voltage VI of the non-inverting input terminal of the differential input stage 170 in an in-phase state. Exemplary Embodiment 2 and so forth are of similar arrangements.

The differential input stage includes a first differential input stage 170, a first current mirror 130 (Pch current mirror), a second current mirror 140 (Nch current mirror) and first and second connection circuits 150 and 160.

The first differential input stage 170 includes a pair of Nch transistors (differential pair transistors) (112, 111) and a current source 113. The Nch transistors (112, 111) have sources coupled together and have gates connected to the input terminal 1 fed with the input voltage VI and to the output terminal 2 outputting the output voltage VO. The current source 113 has its one end connected to a fifth power supply terminal (E5), and other end connected to coupled sources of the pair of Nch transistors (differential pair transistors) (112, 111).

The first current mirror 130 includes a pair of Pch transistors (132, 131) that have sources connected in common to a first power supply terminal E1 that supplies a high potential power supply voltage, drains connected to first and second nodes N1 and N2, respectively, and gates coupled together and connected to the node N2 which is a drain node of the Pch transistor 131. The first node N1 and the second node N2 respectively operate as an output and an input of the current mirror 130. The drain nodes of the Nch differential pair transistors (112, 111) (outputs of the differential pair) are connected respectively to the first and second nodes N1 and N2, respectively. The Pch MOS transistor and the Nch MOS transistor are abbreviated herein to Pch transistor and Nch transistor, respectively.

The second current mirror 140 includes a pair of Nch transistors (142, 141) that have sources connected in common to a second power supply terminal E2 that supplies a low potential power supply voltage, and drains connected respectively to a third node N3 and to a fourth node N4, and gates connected in common to the fourth node N4 which is a drain node of the Nch transistor 141. The nodes N3 and N4 serve as an output and an input of the Nch current mirror 140, respectively.

The first connection circuit 150 includes a floating current source circuit 151 connected between the node N2 as the input node of the first current mirror 130 and the node N4 as the input node of the second current mirror 140. The first connection circuit 150 is also referred to below as a first floating current source circuit 150.

The second connection circuit 160 includes a floating current source circuit made up of a Pch transistor 152 and an Nch transistor 153 that are connected in parallel between nodes N1 and N3. The node N1 is the output node of the first current mirror 130 and the node N3 is the output node of the second current mirror 140. The gates of the Pch transistor 152 and the Nch transistor 153 are supplied with bias voltages BP2 and BN2, respectively. The second connection circuit 160 is referred to below as a second floating current source circuit 160.

Similarly to the second connection circuit 160, the first connection circuit 150 may be formed by a floating current source composed of a Pch transistor and an Nch transistor connected in parallel to each other. The first connection circuit 150 may be formed by a floating current source composed of an Nch transistor and a Pch transistor, the gates of which are supplied with bias voltages and which are connected in series with each other between input nodes (nodes N2 and N4) of the current mirrors 130 and 140. In the latter configuration, the current flowing between the input nodes of the current mirrors 130 and 140 (nodes N2 and N4) is controlled substantially to a constant current.

The output amplifier stage 110 includes a Pch transistor 101 and an Nch transistor 102. The Pch transistor 101 is connected between a third power supply terminal E3, supplying a high power supply voltage for output, and the output terminal 2, and has a gate connected to the node N1 of the differential input stage. The Nch transistor 102 is connected between a fourth power supply terminal E4, supplying a low power supply voltage for output, and the output terminal 2, and has a gate connected to the node N3 of the differential input stage. It is also possible to connect E1 and E3 to a common power supply VDD and to connect E2 and E4 to a common power supply GND. The power supplies will be described later on.

The current control circuit 120 includes an Nch transistor 103 and a Pch transistor 104, which have sources connected together and connected to the output terminal 2, gates connected together and connected to the input terminal 1. The current control circuit 120 also includes as load element, a current source 121 connected between a drain terminal of an Nch transistor 103 and the first power supply terminal E1. The current control circuit also includes, as load element, a current source 122 connected between a drain terminal of a Pch transistor 104 and the second power supply terminal E2. The current control circuit also includes a current source 123 and a Pch transistor 105 connected in series with each other between the first power supply terminal E1 and the node N4 of the differential input stage. The current control circuit also includes a current source 124 and an Nch transistor 106 connected in series with each other between the second power supply terminal E2 and the node N2 of the differential input stage. The gate of the Pch transistor 105 is connected to a connection node 3 of the Nch transistor 103 and the current source 121. The gate of the Nch transistor 106 is connected to a connection node 4 of the Pch transistor 104 and the current source 122. In FIG. 1, also a configuration is possible wherein the source of the Pch transistor 105 is connected to the first power supply terminal E1, and the current source 121 is connected between the drain of the Pch transistor 105 and the node N4. In the same way, a configuration is possible wherein the source of the Nch transistor 106 is connected to the second power supply terminal E2, and the current source 124 is connected between the drain of the Pch transistor 106 and the node N2. The same may apply for Exemplary Embodiments explained subsequently. In another configuration, the Pch transistor 105 may be deleted and the current source 123 may have its activation and deactivation controlled using the potential of the node 3 as a control signal. By the activation and deactivation of the current source 123 is meant that the current source 123 outputs a current during the time of activation and halts outputting a current during the time of deactivation. In similar manner, the Nch transistor 106 may be deleted and the current source 124 may have its activation and deactivation controlled using the potential of the node 4 as a current source. By the activation and deactivation of the current source 124, it is again meant that the current source 124 outputs a current during the time of activation and halts outputting a current during the time of deactivation.

The load element is not limited to a current source. It suffices that the load element is able to vary the potential of the node 3 or 4 in response to the operation of the transistor 103 or 104 to enable the current sources 123 or 124 to be switched between activation and deactivation. More specifically, the current source 121 or 122 that composes a load element may be replaced by a resistance element or a diode. The configuration in which the load element is formed by a diode will be described later as Exemplary Embodiment 7.

Referring to FIG. 1, the current control circuit 120 comes into operation when the input voltage VI at the input terminal 1 is markedly varied with respect to the output voltage VO at the output terminal 2. The current control circuit 120 thus sums a current I5 of the current source 123 at the node N4 (source current) to the input side current of the second current mirror 140 of the differential input stage (drain current of Nch transistor 141). This increases the current value to accelerate charging operation at the output terminal 2. Alternatively, the current control circuit 120 sums a currents I6 of the current source 124 at node N2 (sink current) to the input side current of the first current mirror 130 of the differential input stage (drain current of the Pch transistor 131). This also increases the current value to accelerate the discharging operation at the output terminal 2.

The following describes the operation of the output circuit shown in FIG. 1. The currents of the current sources 113, 123 and 124 in the output stabilized state are designated as I1, I5 and I6, respectively. The current of the floating current source circuit 151 is designated as I3 and the sum current of the floating current sources 152, and 153 is designated as I4 (=I3). The input voltage VI is a step voltage.

Initially, the operation of the output circuit other than the current control circuit 120 will be described. When the input voltage VI at the input terminal 1 is appreciably changed towards the voltage at the first power supply terminal E1, with respect to the output voltage VO at the output terminal 2, the Nch differential pair transistors 111 and 112 are turned off and on, respectively. A current flowing from an input end (node N2) of the Pch current mirror 130 to the Nch differential pair (a drain current of transistor 111) is decreased, while a current flowing from an output end (node N1) to the Nch differential pair (a drain current of transistor 112) is increased. Hence, the difference between the drain current of transistor 111 and the drain current of transistor 112 is increased.

Since the drain current of the transistor 111 of the Nch differential pair (111, 112) is decreased, the drain current of the diode-connected Pch transistor 131 is decreased, and hence the gate-to-source voltage (absolute value) of the Pch transistor 131 is correspondingly decreased. Hence, the gate potential of the Pch transistor 131 rises. Consequently, the drain current of the Pch transistor 132 that has a gate connected to the gate of the Pch transistor 131, is also decreased. While the drain current of the Pch transistor 132 is decreased, the current drawn from the drain (node N1) of the Pch transistor 132 to the Nch differential pair (drain current of transistor 112) is increased. This brings about the discharging operation at the node N1 to lower the potential at the node N1.

With the decrease of the potential at the node N1, the gate-to-source voltage (absolute value) of the Pch transistor 152 of the floating current source (152, 153) becomes smaller and hence the drain current of the Pch transistor 152 gets decreased. It is noted that the gate voltage of the transistor 152 is equal to the voltage BP2. On the other hand, the output current of the Nch current mirror 140 (drain current of the Nch transistor 142) is a current folded back from the current I3 of the floating current source circuit 151, and is kept at approximately the same value as that in the output stabilized state. Hence, a drain current of the Pch transistor 152 is decreased. Since a drain current of the Nch transistor 142 remains unchanged, there is produced a discharging operation at the drain (node N3) of the Nch transistor 142, as a result of which the potential at the drain (node N3) of the Nch transistor 142 is decreased. Since the drain current of the Nch transistor 142 (node N3) is lowered, a gate-to-source voltage of Nch transistor 153 of the floating current source (152, 153) is enlarged, so that the current value of the Nch transistor 153 is increased, and the potential at the node N1 decreases further.

With the decrease of the potential at the node N1, a gate-to-source voltage of the Pch transistor 101 of the output amplifier stage 110 (an absolute value of the voltage difference between the node N1 and the third power supply terminal E3) is increased. A charging current by the Pch transistor 101 of the output amplifier stage 110 from the third power supply terminal E3 to the output terminal 2 is increased. On the other hand, since the potential at the node N3 is decreased, a gate-to-source voltage of the Nch transistor 102 of the output amplifier stage 110 is decreased. A discharging current by the Nch transistor 102 of the output amplifier stage 110 from the output terminal 2 to the fourth power supply terminal E4 also is decreased. This raises the output voltage VO at the output terminal 2. When the output voltage VO approaches close to the input voltage VI, the difference between the current values of the transistors 111 and 112 of the Nch differential pair becomes smaller. The potentials at respective nodes of the floating current source (152, 153) and the Pch current mirror 130 as well as the currents at respective transistors keep on to be restored towards equilibrium states. The output stabilized state is reached when the output voltage VO has become equal to the input voltage VI.

On the other hand, when the input voltage VI at the input terminal 1 has markedly varied towards the power supply voltage at the second power supply terminal E2 (lower voltage) with respect to the output voltage VO at the output terminal 2, the transistors 111 and 112 of the Nch differential pair are respectively turned on and off. The current flowing from an input end (node N2) of the current mirror 130 to the Nch differential pair, that is, the drain current of transistor 111 is increased as compared with that in the output stabilized state. The current flowing from an output end (node N1) of the Pch current mirror 130 to the Nch differential pair, that is, the drain current of transistor 112, is decreased. The difference between the drain current of the transistor 111 and the drain current of the transistor 112 of the Nch differential pair thus becomes larger.

With the increase of the drain current of the transistor 111 of the Nch differential pair, the drain current of the diode-connected Pch transistor 131 is increased, and the gate-to-source voltage (absolute value) of the Pch transistor 131 is correspondingly increased. Hence, the gate potential at the Pch transistor 131 is decreased. As a result, the drain current of the Pch transistor 132, that has a gate to the gate of the Pch transistor 131, is also increased. On the other hand, since the drain current of the Pch transistor 132 is increased, and the current drawn from the drain of the Pch transistor 132 (node N1) towards the Nch differential pair, that is, the drain current of the transistor 112, also is decreased, there is brought about the charging operation at the drain of the Pch transistor 132 (node N1). Hence, the potential at the node N1 rises.

With the increase of the potential at the node N1, a gate-to-source voltage (absolute value) of the Pch transistor 152 of the floating current source (152, 153) is increased, and hence the current flowing through the Pch transistor 152 is increased. On the other hand, the output current of the Nch current mirror 140 (drain current of the Nch transistor 142) is a current folded from the current I3 of the floating current source circuit 151 and is kept at a value approximately equal to that in the output stabilized state. Since the current flowing through the Pch transistor 152 is increased, and the drain current of the Nch transistor 142 remains unchanged, there is brought about the charging operation at the node N3 occurs, thus causing rise in the potential at the node N3.

As a result, the potential at the node N1 rises, and a gate-to-source voltage (absolute value) of the Pch transistor 101 of the output amplifier stage 110 is decreased. Hence, the charging current by the Pch transistor 101 of the output amplifier stage 110 from the third power supply terminal E3 to the output terminal 2 is decreased. On the other hand, since the potential at the node N3 is increased, a gate-to-source voltage of the Nch transistor 102 of the output amplifier stage 110 is increased, the discharge current by the Nch transistor 102 of the output amplifier stage 110 from the output terminal 2 to the fourth power supply terminal E4 is increased. When the output voltage VO approaches close to the input voltage VI, the difference between the drain current of the transistor 111 and the drain current of the transistor 112 in the Nch differential pair becomes smaller. The potentials at respective nodes of the floating current source (152, 153) as well as the Pch current mirror 130 and the currents at respective transistors keep on to be restored towards equilibrium states. The output stabilized state is reached when the output voltage VO has become equal to the input voltage VI.

The following describes the operation of the current control circuit 120. The operation of the current control circuit 120 can be regarded as an additive operation to the normal differential amplifying operation not under control by the current control circuit 120. When the input voltage VI at the input terminal 1 is markedly changed towards the voltage at the first power supply terminal E1 (high voltage) with respect to the output voltage VO at the output terminal 2, and the gate-to-source voltage of the Nch transistor 103 exceeds its threshold voltage Vtn, the Nch transistor 103 is turned on. That is, when the voltage difference between the output voltage VO and the voltage VE1 of the first power supply terminal E1, differs from the voltage difference between the input voltage VI and the voltage VE1 of the first power supply terminal E1 by a value more than the threshold value Vtn of the Nch transistor 103, that is, when (VI−VO)>Vtn>0, the Nch transistor 103 is turned on As a result, the voltage at the connection node 3 of the drain of the Nch transistor 103 and the current source 121 is pulled down from the voltage of the first power supply terminal E1 towards the output voltage VO, so that the Pch transistor 105, whose gate is connected to the connection node 3, is turned on.

In this manner, the current I5 of the current source 123 is supplied via the Pch transistor 105 in an on-state to an input end (node N4) of the Nch current mirror 140. At this time, the Pch transistor 104 is turned off and the voltage at a connection node 4 of the drain of the Pch transistor 104 and the current source 122 is set so as to be equal to the voltage at the second power supply terminal E2. The Nch transistor 106 having a gate connected to the connection node 4, is turned off.

When the input voltage VI is appreciably changed in a direction towards the first power supply terminal E1 (high voltage) with respect to the output voltage VO, during a normal differential amplifier operation of the output circuit of FIG. 1, not under control by the current control circuit 120, the potentials at nodes N1 and N3 are pulled down due to change in the output current of the Nch differential pair, that is, decrease/increase of the drain currents of the Nch transistors 111 and 112. This brings about charging at the output terminal 2 by the transistors 101 and 102 of the output amplifier stage 110. When the current I5 of the current source 123 of the current control circuit 120 is fed to the node N4 in addition to the charging at the output terminal 2, the input current of the Nch transistor 140 (a drain current of the Nch transistor 141) is increased. Hence, an output current of the Nch current mirror 140 (a drain current of the Nch transistor 142) is increased to further augment the discharging at the node N3. This lowers the potential at the node N3. On the other hand, since the potential at the node N3 is lowered, a gate-to-source voltage of the Nch transistor 153 of the floating current source (152, 153) is increased to increase the drain current of the Nch transistor 153, thus further augmenting the discharging at the node N1. Hence, the potential at the node N1 is decreased.

As a result, the decrease in the potentials at the nodes N1 and N3 is promoted. A gate-to-source voltage (absolute value) of the Pch transistor 101 of the output amplifier stage 110 is enlarged further. A gate-to-source voltage of the Nch transistor 102 of the output amplifier stage 110 is decreased quickly, and the output voltage VO of the output terminal 2 rises faster. That is, the current I5 supplied from the current control circuit 120 is summed to the current output from the first floating current source circuit 150 and the resulting current is supplied and added to the input current to the Nch transistor 140. Thus, the charging operation at the output terminal 2 is accelerated to speed up the rise of the output voltage VO.

When the output voltage VO approaches to the input voltage VI such that a voltage difference therebetween (a gate-to-source voltage of the Nch transistor 103) becomes lesser than the threshold voltage of the Nch transistor 103, the Nch transistor 103 then is turned off. That is, when a difference between the voltage difference between the output voltage VO and the first power supply terminal voltage VE1 is smaller than a voltage difference between the input voltage VI and the first power supply terminal voltage VE1 by a value not larger than the threshold value Vtn of the Nch transistor 103 (VI−VO≤Vtn), the Nch transistor 103 is turned off. The voltage at the connection node 3 is increased so that the Pch transistor 105 is turned off. Hence, the current I5 from the current source 123 to the node N4 halts and the action of accelerating the charging at the output terminal 2 also halts. From this time on, the circuit operation moves to the normal differential amplifier operation which is not under control by the current control circuit 120, described above, and the output terminal 2 is charged. When the output voltage VO has become equal to the input voltage VI, the output stabilized state is reached.

When the input voltage VI at the input terminal 1 markedly changes with respect to the output voltage VO at the output terminal 2 towards the second power supply terminal E2 (low voltage side), such that the absolute value of the gate-to-source voltage of the Pch transistor 104 exceeds its threshold voltage (absolute value), the Pch transistor 104 is turned on. That is, when a difference between the voltage difference between the output voltage VO and the second power supply terminal voltage VE2 of the second power supply terminal E2 exceeds a voltage difference between the input voltage VI and the voltage VE2 of the second power supply terminal E2 by a value more than the absolute value of the threshold value Vtp of the Pch transistor 104 (VI−VO<Vtp<0, that is, |VI−VO|>|Vtp|), the Pch transistor 104 is turned on.

When the Pch transistor 104 is turned on, a voltage at the connection node 4 (a gate voltage of the Nch transistor 106) is pulled up so that the Nch transistor 106 is turned on. This causes the current I6 of the current source 124 to be taken as a sink current from the input end of the Pch current mirror 130 (node N2) into the current control circuit 120. At this time, the Nch transistor 103 is turned off and the connection node 3 has a voltage of the first power supply terminal E1. The Pch transistor 105 is turned off.

In the output circuit of FIG. 1, during the normal differential amplifier operation which is not under control by the current control circuit 120, when the input voltage VI changes markedly with respect to the output voltage VO towards the power supply terminal E2 (low voltage side), as described above, potentials at the nodes N1 and N3 are pulled up due to change in the output current of the Nch differential pair (increase/decrease of drain currents of the Nch transistors 111 and 112). This causes the discharging operation at the output terminal 2 by the transistors 101 and 102 of the output amplifier stage 110. When the current I6 of the current source 124 is taken as a sink current at the node N2, to add to this discharging operation at the output terminal 2, the current value of the input current of the Pch transistor 131 of the Pch current mirror 130 is increased. Hence, the output current of the Pch current mirror 130 (a drain current of the Pch transistor 132) is also increased to augment the charging operation the node N1. This further raises the potential at the node N1. Since the potential at the node N1 is increased, gate-to-source voltage (absolute value) of the Pch transistor 152 of the floating current source (152, 153) is increased to increase the drain current of the Pch transistor 152 to augment the charging operation at the node N3 further. Hence, the potential at the node N3 rises.

As a result, the potential rise at the nodes N1 and N3 is promoted to decrease the gate-to-source voltage (absolute value) of the Pch transistor 101 of the output amplifier stage 110 as well as to further increase the gate-to-source voltage of the Nch transistor 102 of the output amplifier stage 110. Hence, the output voltage VO at the output terminal 110 is decreased quickly. That is, the current I6 of the current source 124 of the current control circuit 120 is summed to the current supplied to the first floating current source circuit 150 to add to the input current of the Pch current mirror 130 to accelerate the discharging operation at the output terminal 2 and the decreasing of the output voltage VO.

When the output voltage VO approaches to the input voltage VI such that a voltage difference therebetween (absolute value) becomes lesser than a threshold voltage of the Pch transistor 104 (absolute value), the Pch transistor 104 then is turned off. That is, when the absolute value of a difference between the voltage difference between the output voltage VO and the second power supply terminal voltage VE2 is smaller than a voltage difference between the input voltage VI and the second power supply terminal voltage VE2 by a value not larger than an absolute value of the threshold value Vtp of the Pch transistor 104 (|VI−VO|≤|Vtp|), the Pch transistor 104 then is turned off. The voltage at the connection node 4 is decreased so that the Nch transistor 106 is turned off. Hence, a sink current I5 from the node N4 halts and the action of accelerating or discharging at the output terminal 2 also halts. From this time on, the circuit operation transfers to the normal differential amplifier operation not under control by the current control circuit 120, described above, to discharge the output terminal 2. When the output voltage VO has become equal to the input voltage VI, the output stabilized state is set.

It is seen from above that the current control circuit 120 is in operation when there is a great voltage difference between the input voltage VI and the output voltage VO to accelerate the charging or discharging operation at the output terminal 2. The operation of the current control circuit 120 halts automatically when the output voltage VO approaches to the input voltage VI. In case the change in the input voltage VI is small such that a voltage difference between the input voltage VI and the output voltage VO is less than the threshold voltage of the Nch transistor 103 or the threshold voltage (absolute value) of the Pch transistor 104, the current control circuit 120 is not in operation. It is noted that the transistors 103 and 104 are elements of sufficiently small sizes. Preferably, the gate parasitic capacitances of the transistors 103 and 104, connected to the input terminal 1, are suppressed to small values to allow suppressing the increase in the input capacitance of the output circuit of FIG. 1 to a smallest value possible.

<Symmetry and Area of the Output Voltage Waveform During Charging and Discharging>

The following describes an output voltage waveform in the present Exemplary Embodiment.

The operational effect of the current I6 of the current control circuit 120, when the input voltage VI changes markedly towards the side the second power supply terminal E2 (low voltage side) includes an effect for increasing the current on the input side of the Pch current mirror 130 (131, 132). This effect is the same as the effect of the driving current I1 of the Nch differential pair (112, 111) flowing through the transistor 111 to increase the input side current of the Pch current mirror 130 (131, 132). That is, the current I6 of the current control circuit 120 has an effect equivalent to the amplification effect by the Nch differential pair (112, 111).

On the other hand, the operational effect of the current I5 of the current control circuit 120, when the input voltage VI changes markedly towards the side the first power supply terminal E1 (high voltage side) includes an effect for increasing the current on the input side of the Nch current mirror 140 (141, 142). This effect may be regarded to be equivalent to that in case there is provided the Pch differential pair.

Hence, the charging and discharging operation may be regarded to be equivalent to the operation of a differential amplifier provided with both the Nch differential pair and the Pch differential pair.

Hence, in FIG. 1, the operation equivalent to the operation of a differential amplifier including both an Nch differential pair and a Pch differential pair may be implemented by adjusting respective currents I5 and I6 of the current sources 123 and 124 of the current control circuit 120 in consideration of the current I1 of the current source driving the Nch differential pair. Output voltage waveform symmetry both in charging and in discharging may be implemented with ease.

According to the Exemplary Embodiment of FIG. 1, a differential input stage may be composed by a differential pair of a single conductivity type, and hence the number of elements and a circuit area may be reduced.

<Phase Compensation Capacitance>

The following describes the phase compensation capacitance in the present Exemplary Embodiment.

In the Exemplary Embodiment shown in FIG. 1, a phase compensation capacitance may be provided to ensure output stability in the feedback connection configuration. In FIG. 1, a phase compensation capacitance may be provided between the output terminal 2 and one node (node N1 or N3) or both nodes (nodes N1 and N3) of the Pch transistor 101 and the Nch transistor 102 of the output amplifier stage 110. By adjusting the currents I5 and I6 of the respective current sources 123 and 124 of the current control circuit 120, depending on the connection of the phase compensation capacitance, it is possible to provide speedy charging/discharging of the phase compensation capacitance as well as to render the output voltage waveform at the time of charging symmetrical to that at the time of discharging.

<Driving Speed and Power Consumption>

The following describes the driving speed and the power consumption in the present Exemplary Embodiment.

In the present Exemplary Embodiment, the current control circuit 120 is in operation, when the input voltage VI is changed vitally with respect to the output voltage VO, such as to effect acceleration of charging and discharging operations.

It is only when the output voltage VO is changed markedly that the charging/discharging is accelerated. Since the time duration of such change is short enough in comparison with the data outputting period, the increase of power consumption due to the operation of the current control circuit 120 is sufficiently small.

In case a change in the input voltage VI is small or after the output voltage VO reaches the input voltage VI, the operation of the current control circuit 120 is in a halt Hence, the output terminal 2 may be speedily charged/discharged to allow high speed driving of a data line load, even if an idling current in the output stabilized state (currents I1, I2 and I3 and currents in the Pch transistors 111, 112 of the output amplifier stage 110) is reduced to suppress static power consumption. It is thus possible to provide the output circuit of FIG. 1 which is low in power consumption and high in driving speed.

<Supply Voltage for Power Supply Terminal>

The following described the supply voltage for power supply terminals in the present Exemplary Embodiment. For example, if the configuration of FIG. 1 is used as an output circuit that drives an output range of an OLED driver of FIG. 23B, power supply voltages of the first and third power supply terminals E1 and E3 may both be made the high-potential power supply voltage VDD, while those of the second, fourth and fifth power supply terminals E2, E4 and E5 may all be low-potential power supply voltages VSS.

Figure 23A:
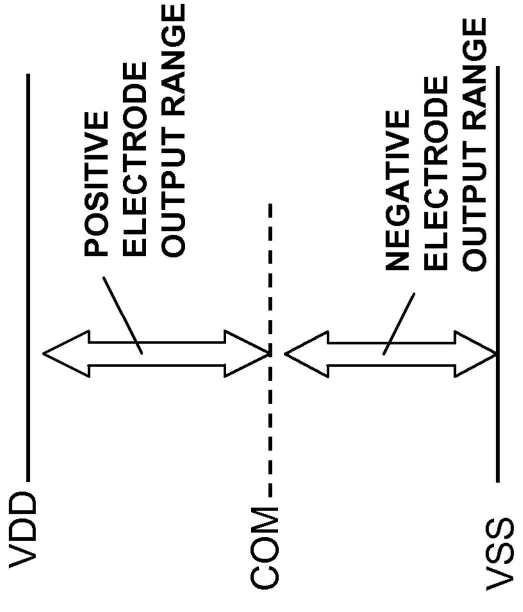
FIG. 23A RELATED ART
FIG. 23A is a schematic view showing an example output range of an LCD driver and FIG. 23B is a schematic view showing an example output range of an OLED display driver.
Figure 23B:
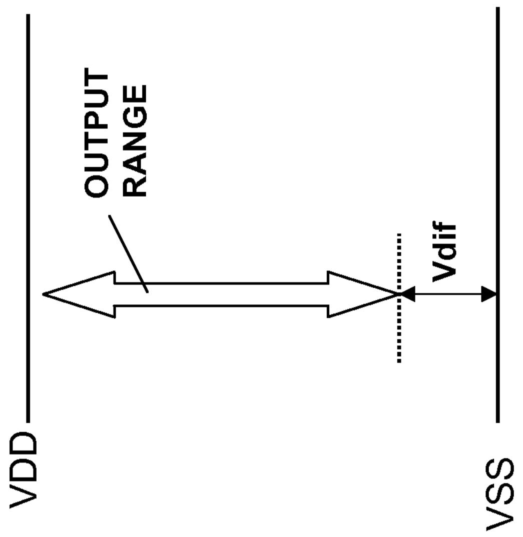
FIG. 23B RELATED ART

On the other hand, if the configuration of FIG. 1 is used as an output circuit that drives a positive output range and a negative output range of an LCD driver of FIG. 23A, power supply voltages of the first and third power supply terminals E1 and E3 may both be made the high-potential power supply voltage VDD, while those of the second, fourth and fifth power supply terminals E2 and E4 and E5 may all be the low-potential power supply voltage VSS. There are occasions wherein there are further provided a power supply voltage VML corresponding to a lower limit of a positive output range in the vicinity of a common voltage (COM) and a power supply voltage VMH corresponding to an upper limit of a negative output range in the vicinity of the common voltage. In the case of the output circuit driving the positive output range, the power supply voltages of the first and third power supply terminals E1 and E3 may both be made high-potential power supply voltages VDD. The power supply voltages of the second and fourth power supply terminals E2 and E4 may both be made VML, while that of the fifth power supply voltage E5 may be made VSS. In particular, the power supply voltage difference across the power supply terminals E3 and E4 of the output amplifier stage 110, flown through by a large current, may be reduced to decrease power consumption which depends on (current×voltage). This also has an advantageous effect of suppressing heat generation.

Regarding the power supply voltage of the fifth power supply terminal E5, connected to the current source 113 of the differential input stage 170, the lower limit of the range of operation of the differential input stage 170 is a voltage higher than the voltage of the fifth power supply terminal E5 by a value equal to the threshold voltage of the Nch differential pair transistors 112, 111.

Even in case the threshold voltage of the Nch differential pair transistors 112 and 111 is of a larger value, such is not deterrent to the driving of the positive output range of from VML to VDD, as long as the voltage at the fifth power supply terminal E5 is VSS. The voltage at the fifth power supply terminal E5 may, of course, be set at VML in case the threshold voltage of the Nch differential pair transistors 112 and 111 is almost zero.

The power supply voltages of the first and third power supply terminals E1 and E3 may both be VDD, those of the second and fifth power supply terminals E2 and E5 may both be VSS and only that of the fourth power supply terminal E4 may be VML.

In FIG. 1, the first and second power supply terminals of the current control circuit 120 are E1 and E2, respectively. However, these power supply terminals may be isolated from the power supply terminals of the current mirrors 130 and 140. In this case, the first and second power supply terminals may be fitted to the third and fourth power supply terminals E3 and E4 of the output amplifier stage 110.

<Comparison Between the Present Exemplary Embodiment and the Related Technique>

Figure 25:
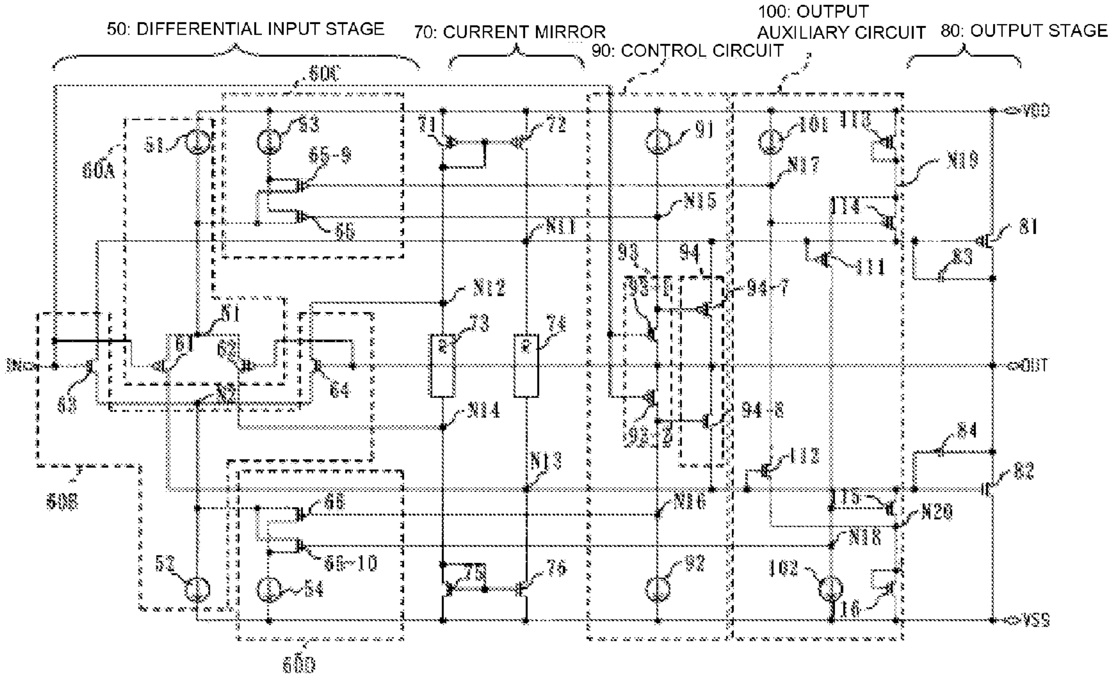
FIG. 25 PRIOR ART
FIG. 25 is a circuit diagram showing a configuration of the related technique (Patent Document 1).

The following describes the current control circuit 120 of the present Exemplary Embodiment of FIG. 1, compared with the related technology shown in FIG. 25.

The current control circuit 120 in FIG. 1, on one hand, and transistors 93-1 and 93-2 and current sources 91 and 92 of the control circuit 90, and transistors 65, 66, 65-9 and 66-10 and auxiliary current sources 53, and 54 of the differential input stage 50 in FIG. 25, on the other hand, both come into operation to provide a source or sink current, when the input voltage has markedly changed.

However, the two differ as to destinations of the current sourcing or sinking operation.

In the output circuit of FIG. 25, connection is made such as to increase driving currents of the Nch differential pair (63, 64) and the Pch differential pair (61, 62). Hence, to establish symmetry in an output voltage waveform, it is necessary that the differential input stage of the output circuit has both the Nch and the Pch differential pairs.

On the other hand, the current sources 123 and 124 of the current control circuit 120 in the Exemplary Embodiment of FIG. 1 are connected so that the currents I5 and I6 will be summed to the currents on the input sides of the current mirrors 130 and 140 such as to increase current values. The arrangement comes into operation when the input voltage is changed markedly to effect an operation of amplification equivalent to that of the Nch and the Pch differential pairs. Hence, with the Exemplary Embodiment of FIG. 1, the output voltage waveform may readily be made symmetrical, even in case the differential input stage is composed only of a differential pair of the single conductivity type.

Moreover, since the differential pair is allowed to be composed of a single conductivity type differential pair, it is possible to reduce the number of elements, circuit area and the static power consumption of the differential pairs.

In addition, in the Exemplary Embodiment of FIG. 1, additive currents I5 and I6 from the current control circuit 120 are summed to the input currents of the current mirrors 130 and 140 without the interposition of the differential pair. Hence, the Exemplary Embodiment of FIG. 1 is not affected by the on-resistance of the differential pairs and has high response characteristics to charging/discharging acceleration.

Moreover, in the Exemplary Embodiment of FIG. 1, the through current of the differential input stage 110 by capacitive coupling of a phase compensation capacitance is hardly produced in the charging/discharging acceleration at the output terminal 2 by the current control circuit 120. This is due to the fact that, since the output current of the current mirror 130 or 140 is increased by the current I5 or I6 from the current control circuit 120, not only the voltage change at the gates (nodes N1 and N3) of the transistors 101 and 102 of the output amplifier stage 110 is accelerated, but the charging of the phase compensation capacitance is accelerated in case the phase compensation capacitance is provided between the output terminal 2 and the gate of one of the Pch transistor 101 or the Nch transistor 102 of the output amplifier stage 110 (N1 or N3) or between the output terminal 2 and the gates of both of the Pch transistor 101 and the Nch transistor 102 of the output amplifier stage 110 (N1 and N3). Hence, in FIG. 1, it is not necessary to provide an additive circuit for suppressing the through current such as an auxiliary output circuit 100 of FIG. 25.

<Exemplary Embodiment2>

Figure 2:
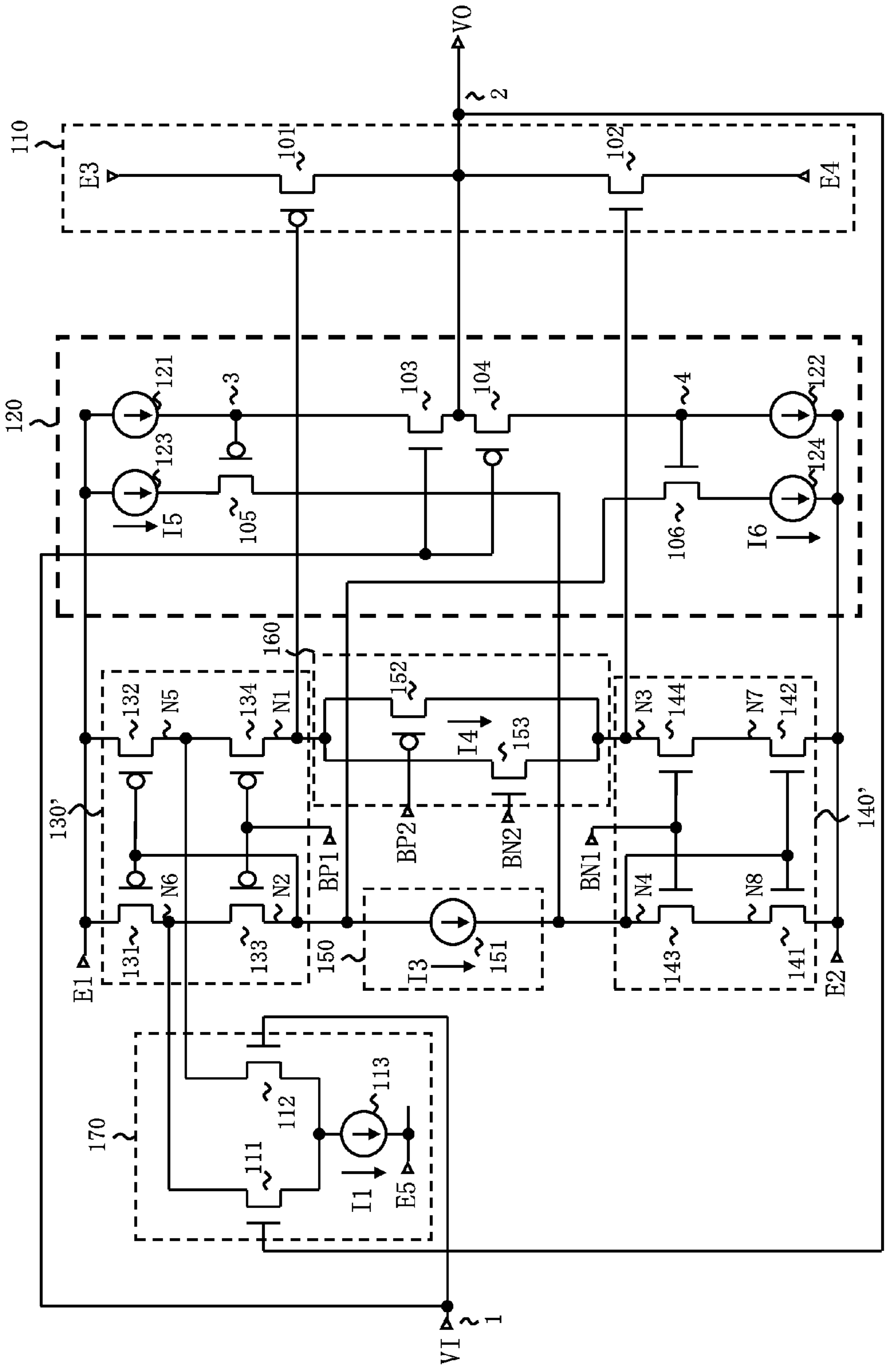
FIG. 2 is a diagram showing the configuration of a second exemplary embodiment of the present invention.

The following describes Exemplary Embodiment 2 of the present invention. FIG. 2 shows an arrangement of an output circuit according to Exemplary Embodiment 2 of the present invention. In the output circuit of FIG. 2, cascoded low voltage current mirrors 130' and 140' are provided in place of the current mirrors 130 and 140 of FIG. 1. Similarly to the output circuit of FIG. 1, the output circuit of FIG. 2 includes a differential input stage that differentially receives an input voltage VI and an output voltage VO, an output amplifier stage 110 and a current control circuit 120. As in FIG. 1, the output amplifier stage 110 receives first and second outputs (nodes N1 and N3) of the differential input stage to effect a push-pull operation to output the output voltage VO in accordance with the input voltage VI at the output terminal 2. The current control circuit 120 detects a potential difference between the input voltage VI and the output voltage VO to control the current of the current mirrors 130' or 140' in response to the potential difference. Exemplary Embodiment 2 is similar to Exemplary Embodiment 1 except as to the configuration of the current mirrors 130' and 140'.

The differential input stage includes a first differential stage 170, a Pch current mirror 130', an Nch current mirror 140' and first and second floating current source circuit 150 and 160. In the following, the configurations of the current mirrors 130' and 140' are described, and detailed description of the first differential stage 170, first and second floating current source circuit 150, 160 and the current control circuit 120 is dispensed with.

The Pch current mirror 130' is composed of a cascoded low voltage current mirror connected between the first power supply terminal E1 and pair nodes N1 and N2.

Specifically, the Pch current mirror 130' includes Pch pair transistors 132 and 131 of a first stage, that have gates connected common and sources connected in common to the first power supply terminal E1, and Pch pair transistors 134 and 133 of a second stage that have gates connected in common to receive a bias voltage BP1. The sources and the drains of the Pch pair transistors 134 and 133 are connected to the drains of the Pch pair transistors 132 and 131 of the first stage and to the pair nodes N1 and N2, respectively. The coupled gates of the Pch pair transistors 132 and 131 of the first stage are connected to the node N2. Nodes N1 and N2 serve as an output and an input of the Pch current mirror 130', respectively. Outputs of the Nch differential pair transistors 112 and 111 of the first differential stage 170 are connected respectively to a connection node (node N5) of the Pch transistors 132 and 134 and to a connection node (node N6) of the Pch transistors 131 and 133.

The Nch current mirror 140' is composed of a cascoded low voltage current mirror connected between the second power supply terminal E2 and the pair nodes N3 and N4. Specifically, the Nch current mirror is composed of Nch transistors 142, and 141 of a first stage and Nch transistors 144 and 143 of a second stage. The Nch transistors 142 and 141 have gates connected together, and sources connected in common to the second power supply terminal E2. The Nch transistors 144 and 143 have gates connected together to receive a bias voltage BN1, sources connected to the drains of the Nch transistors 142 and 141 of the first stage and drains connected to the nodes N3 and N4, respectively. The gates of the Nch transistors 142 and 141 of the first stage, connected in common, are connected to the node N4. The nodes N3 and N4 serve as an output and an input of the Nch current mirror 140'.

A current source 123 of the current control circuit 120 is connected via a transistor 105 to an input end (node N4) of the Nch current mirror 140', and a current source 124 is connected via a transistor 106 to an input end (node N2) of the Pch current mirror 130'.

The following describes the operation of the output circuit, shown in FIG. 2. In the below, initially, the operation of the portion of the output circuit other than the current control circuit 120 is described. When the input voltage VI of the input terminal 1 is markedly changed with respect to the output voltage VO of the output terminal 2 towards the voltage at the first power supply terminal E1 (high voltage), the Nch differential pair transistors 111 and 112 are turned off and on, respectively. A current flowing from the connection node (node N6) of the Pch transistors 131 and 133 on the input side of the current mirror 130' towards the Nch differential pair (a drain current of transistor 111) is decreased and becomes smaller than in the output stabilized state. On the other hand, a current flowing from the connection node (node N5) of the Pch transistors 132 and 134 on the output side of the current mirror 130' towards the Nch differential pair (a drain current of transistor 112) is increased and becomes larger than in the output stabilized state. Hence, the difference between the drain current of the transistor 111 and the drain current of the transistor 112 of the Nch differential pair becomes larger.

Since the drain current of the transistor 111 of the Nch differential pair is decreased, the drain current of the Pch transistor 131 is decreased, thus giving rise to an operation of decreasing the drain/source voltage of the Pch transistor 131 (absolute value of voltage difference between the node N6 and the first power supply terminal E1). However, the drain/source voltage of the Pch transistor 133 (absolute value of the voltage difference between the voltage BP1 and the node N6) is increased, thus producing the operation of charging at the drain of the Pch transistors 133 (node N2). As a result, the potential at the drain of the Pch transistors 133 (node N2) is raised.

On the other hand, the drain current of the Pch pair transistor 132 that has a gate connected to the node N2 as is the gate of the Pch transistors 131, is also decreased. At this time, the drain current of the Pch transistor 132 is decreased, and the drain current of the transistor 112, drawn to the Nch differential pair side, is increased. Hence, there is produced a discharging operation at the node N5. The potential at the connection node (node N5) of the Pch transistors 132 and 134 is thus lowered. A gate-to-source voltage (absolute value) of the Pch transistor 134 is decreased to decrease a drain current of the Pch transistors 134 to be supplied to the node N1. Hence, there is produced a discharging operation at the node N1 to lower the potential at the node N1.

With the decrease of the potential at the node N1, a current flowing through the Pch transistor 152 of the floating current source (152, 153) decrease. On the other hand, an output current of the Nch current mirror 140' (an each drain current of Nch transistors 142 and 144) is the mirror current of the current I3 of the floating current source 151, and is kept at approximately the same value as that in the output stabilized state. The drain current of the Pch transistor 152 is decreased and the drain current of the Nch transistor 144 remains unchanged. Hence, there is produced a discharging operation at the drain (node N3) of the Nch transistor 144, thus lowering the potential at the drain (node N3) of the Nch transistor 144. It is noted that, since the potential at the drain (node N3) of the Nch transistor 144 is lowered, the gate-to-source voltage of the Nch transistor 153 of the floating current source (152, 153) is increased, as a result of which the current value of the Nch transistor 153 is increased to further decrease the potential at the node N1.

As a result, the potential at the node N1 is decreased to increase a gate-to-source voltage (absolute value) of the Pch transistor 101 of the output amplifier stage 110. A charging current by the Pch transistor 101 of the output amplifier stage 110 from the third power supply terminal E3 to the output terminal 2 is increased. On the other hand, since the potential at the node N3 is decreased, a gate-to-source voltage of the Nch transistor 102 of the output amplifier stage 110 is decreased, so that the discharge current by the Nch transistor 102 of the output amplifier stage 110 from the output terminal 2 to the fourth power supply terminal E4 is decreased. This increases the output voltage VO at the output terminal 2. When the output voltage VO approaches to the input voltage VI, the difference in current values of the Nch differential pair transistors 111, 112 is decreased. The potentials at respective nodes of the Pch current mirror 130 or the floating current source (152, 153) or the currents in respective transistors keep on to be restored to equilibrium states. When the output voltage VO has become equal to the input voltage VI, the output stabilized state is set.

When the input voltage VI of the input terminal 1 is markedly changed with respect to the output voltage VO at the output terminal 2 towards the voltage at the second power supply terminal E2 (low voltage), the Nch differential pair transistors 111, 112 are turned on and off, respectively. The current that flows from the connection node (node N6) of the Pch transistors 131, 133 on the input side of the current mirror 130' towards the Nch differential pair, and that is equal to the drain current of transistor 111, is increased and becomes larger than in the output stabilized state. On the other hand, the current that flows from the connection node (node N5) of the Pch transistors 132, 134 on the output side of the current mirror 130' towards the Nch differential pair, and that is equal to the drain current of transistor 112, is decreased as compared with that in the output stabilized state. Hence, the difference in the current values of the drain currents of the transistors 111, 112 of the Nch differential pair becomes larger.

Since the drain current of the transistor 111 of the Nch differential pair is increased, the drain current of the Pch transistor 131 is increased, thus giving rise to an operation of increasing the drain/source voltage of the Pch transistor 131 (absolute value). However, the drain/source voltage of the Pch transistor 133 (absolute value) is decreased, thus producing the operation of charging at the drain of the Pch transistors 133 (node N2). As a result, the potential at the drain (node N2) of the Pch transistors 133 (node N2) is decreased in keeping with increase in the drain current of the Pch transistor 131.

On the other hand, the drain current of the pair transistor 132, whose gate is connected to the node N2 as is the gate of the Pch transistors 131, is also increased. At this time, the drain current of the Pch pair transistor 132 is increased, and the current that is removed from the node N5 to the Nch differential pair side, and that is equal to the drain current of transistor 112, is decreased, so that there is produced a charging operation at the node N5. Hence, the potential at the connection node of the Pch transistors 132, 134 (node N5) is increased to increase the drain current of the Pch transistor 134 to be supplied to the node N1. There is thus produced a charging operation for the node N1 to raise the potential at the node N1.

With the increase of the potential at the node N1, a gate-to-source voltage (absolute value) of the Pch transistor 152 of the floating current source (152, 153) is increased to increase the current flowing through the Pch transistor 152. On the other hand, the output current of the Nch current mirror 140' (a drain current of the Nch transistors 142 and 144) is the mirror current of the current I3 of the floating current source 151, and is kept at approximately the same value as that in the output stabilized state. The drain current of the Pch transistor 152 is increased, while the drain current of the Nch transistor 144 remains unchanged. Hence, there is produced a charging operation at the node N3, thus increasing the potential at the drain of the Nch transistor 144 (node N3) and raising the potential at the node N3.

As a result, the potential at the node N1 is increased to decrease the gate-to-source voltage of the Pch transistor 101 of the output amplifier stage 110 (an absolute value of the voltage difference between the voltage at node N1 and that at the third power supply terminal E3). The charging current by the Nch transistor 102 of the output amplifier stage 110 from the third power supply terminal E3 to the output terminal 2 is decreased. On the other hand, with the increase of a potential at the node N3, a gate-to-source voltage of the Nch transistor 102 of the output amplifier stage 110 is increased, so that a discharge current by the Nch transistor 102 of the output amplifier stage 110 from the output terminal 2 to the fourth power supply terminal E4 is increased. This lowers the output voltage VO at the output terminal 2. When the output voltage VO approaches to the input voltage VI, the difference in current values of the Nch differential pair transistors (111, 112) is decreased. The potentials at respective nodes of the Pch current mirror 130' or the floating current source (152, 153) as well as the currents in respective transistors keep on to be restored to equilibrium states. When the output voltage VO has become equal to the input voltage VI, the output stabilized state is reached.

The following describes the operation of the current control circuit 120. The operation of the current control circuit 120 is an additive operation to the normal differential amplifier operation not under control by the current control circuit 120. The configuration and detailed operation of the current control circuit 120 are the same as those explained in connection with FIG. 1. That is, when the input voltage VI changes markedly towards the voltage at the first power supply terminal E1 (high voltage) with respect to the output voltage VO, the current control circuit 120 supplies the current I5 of the current source 123 to the input end (node N4) of the Nch current mirror 140'.

In the output circuit of FIG. 2, during the normal differential amplifier operation, not under control by the current control circuit 120, when the input voltage VI changes markedly with respect to the output voltage VO towards the voltage at the power supply terminal E1 (high voltage side), as described above, the potentials at the nodes N1 and N3 are pulled down due to changes in the output current of the Nch differential pair (increase/decrease of drain currents of the Nch transistors 111 and 112). This will bring about the charging operation at the output terminal 2 by the transistors 101, 102 of the output amplifier stage 110. If the current I5 of the current source 123 is supplied to the node N4, to add to this charging operation at the output terminal 2, the input current of the current mirror 140', which is equal to the drain currents of the Nch transistors 141 and 143, is increased. Hence, the output current of the Pch current mirror 140' (drain current of the Nch transistors 142 and 144) is also increased to augment the discharging at the node N3. This further lowers the potential at the node N3. With the decrease of the potential at the node N3, the gate-to-source voltage of the Nch transistor 153 of the floating current source (152, 153) is increased to increase the drain current flowing through the Nch transistor 153 to further augment the action of discharging at the node N1. Hence, the potential of the node N1 is also decreased.

As a result, the decrease of potential at the nodes N1 and N3 is promoted to speedily increase the gate-to-source voltage (absolute value) of the Pch transistor 101 of the output amplifier stage 110 as well as to speedily decrease the gate-to-source voltage of the Nch transistor 102 of the output amplifier stage 110. Hence, the output voltage VO at the output terminal 2 is raised speedily. That is, the current I5 supplied from the current control circuit 120 is summed to the input current of the Nch current mirror 140' to accelerate the charging operation at the output terminal 2 to accelerate the increase of the output voltage VO.

On the other hand, when the input voltage VI changes markedly towards the voltage at the second power supply terminal E2 (low voltage) with respect to the output voltage VO, the current control circuit 120 sinks the current I6 of the current source 124 from the input end (node N2) of the Pch current mirror 130'.

In the normal differential amplifier operation of the output circuit of FIG. 2, which is not under control by the current control circuit 120, when the input voltage VI is appreciably changed in a direction towards the voltage at the power supply terminal E2 (low voltage side) with respect to the output voltage VO, the potentials at nodes N1 and N3 are pulled up due to changes in the output current of the Nch differential pair, that is, due to increase/decrease of the drain currents of the Nch transistors 111 and 112. This will bring about discharging at the output terminal 2 by the transistors 101 and 102 of the output amplifier stage 110. If the current I6 of the current source 124 of the current control circuit 120 is supplied as a sink current at the node N2 by the current control circuit 120, to add to the discharging at the output terminal 2, the input current of the Pch current mirror 130' (drain currents of the Pch transistors 131 and 133) is increased. Hence, the output current of the Pch current mirror 130' (drain currents of the Pch transistors 132 and 134) is increased to further augment the charging at the node N1. This raises the potential at the node N1. On the other hand, with the increase of the potential at the node N1, a gate-to-source voltage (absolute value) of the Nch transistor 152 of the floating current source (152, 153) is increased to increase a drain current flowing through the Nch transistor 152, thus further augmenting the charging at the node N3. Hence, the potential at the node N3 is also increased.

As a result, the increase of the potentials at the nodes N1 and N3 is promoted. The gate-to-source voltage (absolute value) of the Pch transistor 101 of the output amplifier stage 110 is quickly decreased, and the gate-to-source voltage of the Nch transistor 102 of the output amplifier stage 110 is further increased, as a result of which the output voltage VO of the output terminal 2 decreases faster. That is, the sink current I6 of the current control circuit 120 is summed to the input current of the Pch current mirror 130'. Hence, the current discharging at the output terminal 2 is accelerated to increase the rate of decreasing of the output voltage VO.

When for both the charging and discharging at the output terminal 2, the output voltage VO approaches to the input voltage VI, the voltage difference between the output voltage VO and the input voltage VI becomes smaller than a threshold value (absolute value) of the Nch transistor 103 or the Pch transistor 104. The Nch transistor 103 as well as the Pch transistor 104 is then turned off and the sourcing of the current I5 to the node N4 or sinking of the current I6 from the node N2 is halted. The operation of the charging/discharging at the output terminal 2 is halted. From this time on, the circuit operation transfers to the normal differential amplifier operation not under control by the current control circuit 120. The output stabilized state is set when the output voltage VO has become equal to the input voltage VI.

Thus, in the output circuit of FIG. 2, the current control circuit 120 of FIG. 2, comes into operation to accelerate the operation of charging/discharging at the output terminal 2, when a larger voltage difference exists between the input voltage VI and the output voltage VO. When the output voltage VO approaches to the input voltage VI, the operation of the current control circuit 120 automatically halts. When the change in the input voltage VI is small, with the absolute value of the voltage difference between the input voltage VI and the output voltage VO being not larger than the threshold value Vtn of the Nch transistor 103 or that of the Pch transistor 104 (absolute value=|Vtp|), stated differently, when $|VI-VO| \leq |Vtn|$ or $|VI-VO| \leq |Vtp|$, the current control circuit 120 is not in operation. The charging/discharging at the output terminal 2, when the current control circuit 120 is in operation is equivalent to that of the differential amplifier including both the Nch differential pair and the Pch differential pair, as in FIG. 1. Hence, the output voltage waveform during charging may readily be made symmetrical with respect to that during discharging.

In the output circuit of FIG. 2, a phase compensation capacitance may be provided to ensure output stability in a feedback connection configuration. In FIG. 2, the phase compensation capacitance may be provided say between the connection node (node N5) of the Pch transistors 132, 134 and the output terminal 2 and/or between the connection node (node N7) of the Nch transistors 142 and 144 and the output terminal 2. Or, the phase compensation capacitance may be provided between one of gates (N1 or N3) of the Nch transistors 101 and the Pch transistor 102 of the output amplifier stage 110 and the output terminal 2. Or, the phase compensation capacitance may be provided between both of the gates (N1 and N3) of the Nch transistors 101 and the Pch transistor 102 of the output amplifier stage 110 and the output terminal 2. By adjusting the respective currents I5 and I6 of the current sources 123 and 124 of the current control circuit 120 depending on the connection of the phase compensation capacitance, the phase compensation capacitance may quickly be charged/discharged to render the output voltage waveform during charging symmetrical with respect to that during discharging.

In the output circuit of FIG. 2, the differential pair of the differential input stage may be implemented to a single conductivity type, whereby the number of elements and hence the circuit area may be reduced. Also, as in FIG. 1, there is no necessity of providing an additive circuit to suppress the through current of the output amplifier stage 110.

Furthermore, a high speed operation may be accomplished by the operation of the current control circuit 120 even in case the idling current (currents I1, I3 and I4 and the current in the Pch transistors 101, 102 of the output amplifier stage 110) is reduced to suppress the static power consumption. The power supply voltages supplied to respective power supply terminals in the present Exemplary Embodiment are similar to those of FIG. 1 and reference is to be made to the explanation in FIG. 1.

<Exemplary Embodiment3>

Figure 3:
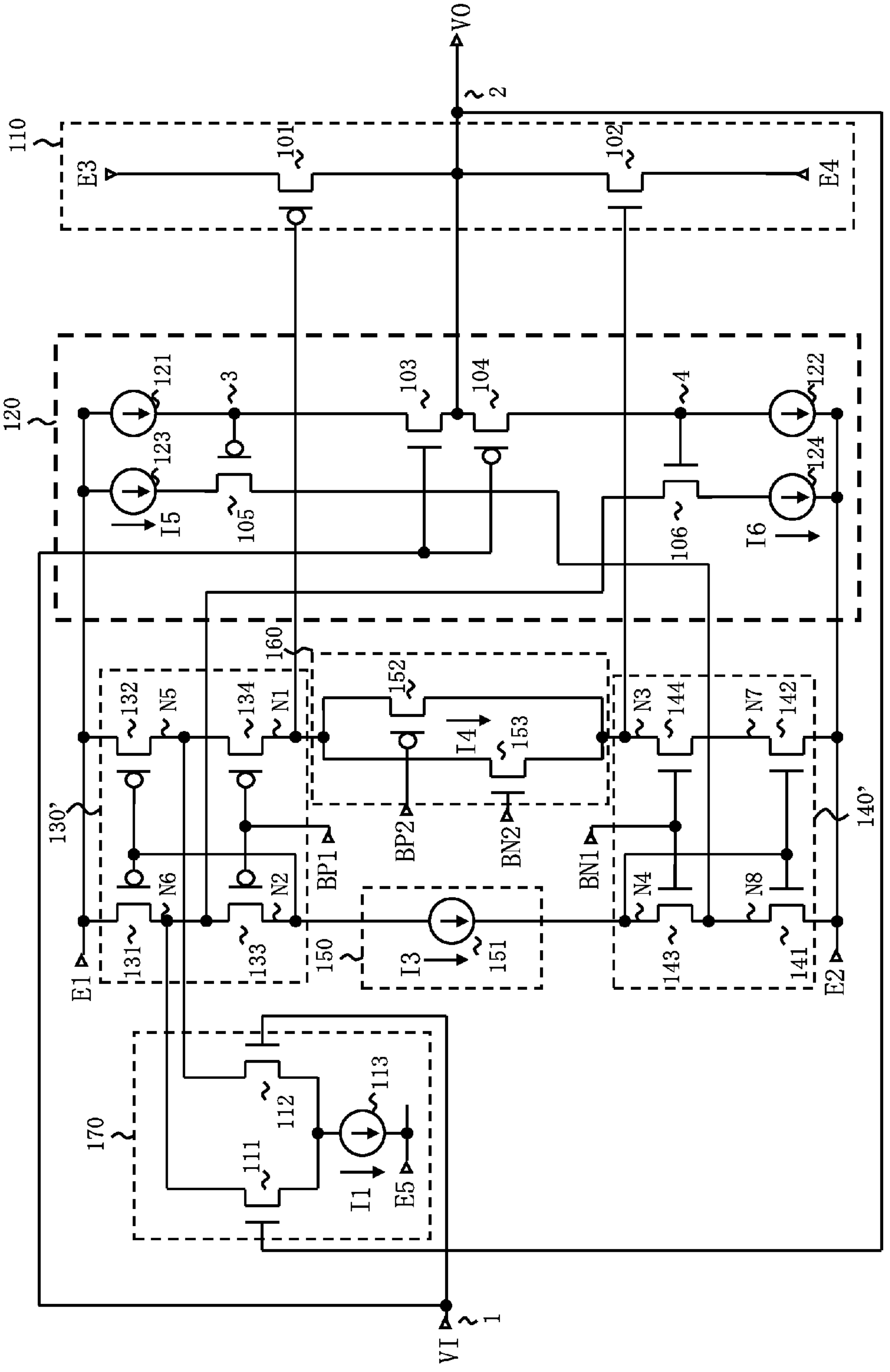
FIG. 3 is a diagram showing the configuration of a third exemplary embodiment of the present invention.

The following described Exemplary Embodiment 3 of the present invention. FIG. 3 shows the configuration of an output circuit of Exemplary Embodiment 3 of the present invention. In the output circuit of FIG. 3, the destination of connection of the current control circuit 120 is changed from the output circuit of FIG. 2. Referring to FIG. 3, the current source 123 of the current control circuit 120 is connected via Pch transistor 105 to a connection node (node N8) of transistors 141 and 143 of an Nch current mirror 140'. The current source 124 is connected via Nch transistor 106 to a connection node (node N6) of transistors 131 and 133 of an Nch current mirror 130'. Otherwise, the configuration of Exemplary Embodiment 3 is the same as that of FIG. 2.

Referring to FIG. 3, in the normal differential amplifier operation, which is not under control by the current control circuit 120, when the input voltage VI has markedly changed towards the side the power supply terminal E1 (high voltage) with respect to the output voltage VO, the potentials at nodes N1, N3 are pulled down, as in FIG. 2. This will bring about a charging operation at the output terminal 2 by the transistors 101 and 102 of the output amplifier stage 110. When, as the output terminal 2 is so charged, the current I5 of the current source 123 is supplied to the node N8, the input side current of the Nch current mirror 140' (drain current of Nch transistor 141) is increased. At this time, there is produced an operation of increasing the drain/source voltage of the Nch transistor 141. However, since the gate-to-source voltage of the Nch transistor 143 is decreased, the drain (node N4) of the Nch transistor 143 is charged, as a result of which the potential at the drain (node N4) of the Nch transistor 143 rises in response to increase in the drain current of the Nch transistor 141. Hence, the drain current of the Nch transistor 142, whose gate is connected in common to the gate of the Nch transistor 141, is also increased to increase the output current of the Nch current mirror 140' (drain current of Nch transistors 142, 144). This output current increasing operation of the Nch current mirror 140' is the same as that in case the current I5 of the current source 123 of the current control circuit 120 is supplied to the node N4 in FIG. 2. Hence, the potentials at the nodes N3 and N1 are pulled down under a strong discharging operation, as a result of which the operation of charging the output terminal 2 is accelerated as in FIG. 2.

Also, in FIG. 3, in the normal differential amplifier operation which is not under control by the current control circuit 120, the potentials at nodes N1 and N3 are pulled up, when the input voltage VI changes markedly towards the second power supply terminal E2 (low voltage side) with respect to the output voltage VO. The output terminal 2 is then discharged by the transistors 101 and 102 of the output amplifier stage 110. When, as the output terminal 2 is so discharged, the current I6 of the current source 124 is supplied as a sink current at the node N6 by the current control circuit 120, the current on the input side of the Pch current mirror 130' (a drain current of transistor 131) is increased. At this time, there is produced an operation of increasing the drain/source voltage (absolute value) of the Pch transistor 131. However, since a gate-to-source voltage (absolute value) of the Pch transistor 133 (node N2) is decreased, there is produced an operation of discharging the drain (node N2) of the Pch transistor 133. As a result, the potential at the drain (node N2) of the Pch transistor 133 is decreased in keeping with increase in the drain current of the Pch transistor 131. Consequently, the drain current of the Pch transistor 132 that has a gate connected to the gate of the Pch transistor 131, is also increased to increase an output current of the Pch current mirror 130' (drain currents of the Pch transistors 132 and 134). This operation of increasing the output current of the Pch current mirror 130' is the same as the operation of sinking of the current I6 of the current source 124 of the current control circuit 120 from the node N2, in FIG. 2, and the potential at the nodes N1 and N3 are pulled up under a strong charging operation. Thus, the discharging at the output terminal 2 is accelerated, as in FIG. 2.

It is seen from above that the output circuit of FIG. 3 is equivalent in operation/effect to that of FIG. 2, and is of a characteristic similar to that of FIG. 2. It is noted that the output circuits of FIG. 3 differs from that of FIG. 2 as to the locations of coupling of the currents from the current sources 123 and 124 of the current control circuit 120 to the input side currents of the current mirrors 130' and 140'. However, in both circuits, the charging/discharging at the output terminal 2 is accelerated by the operation of increasing the input side currents of the current mirrors 130' and 140'.

<Exemplary Embodiment4>

Figure 4:
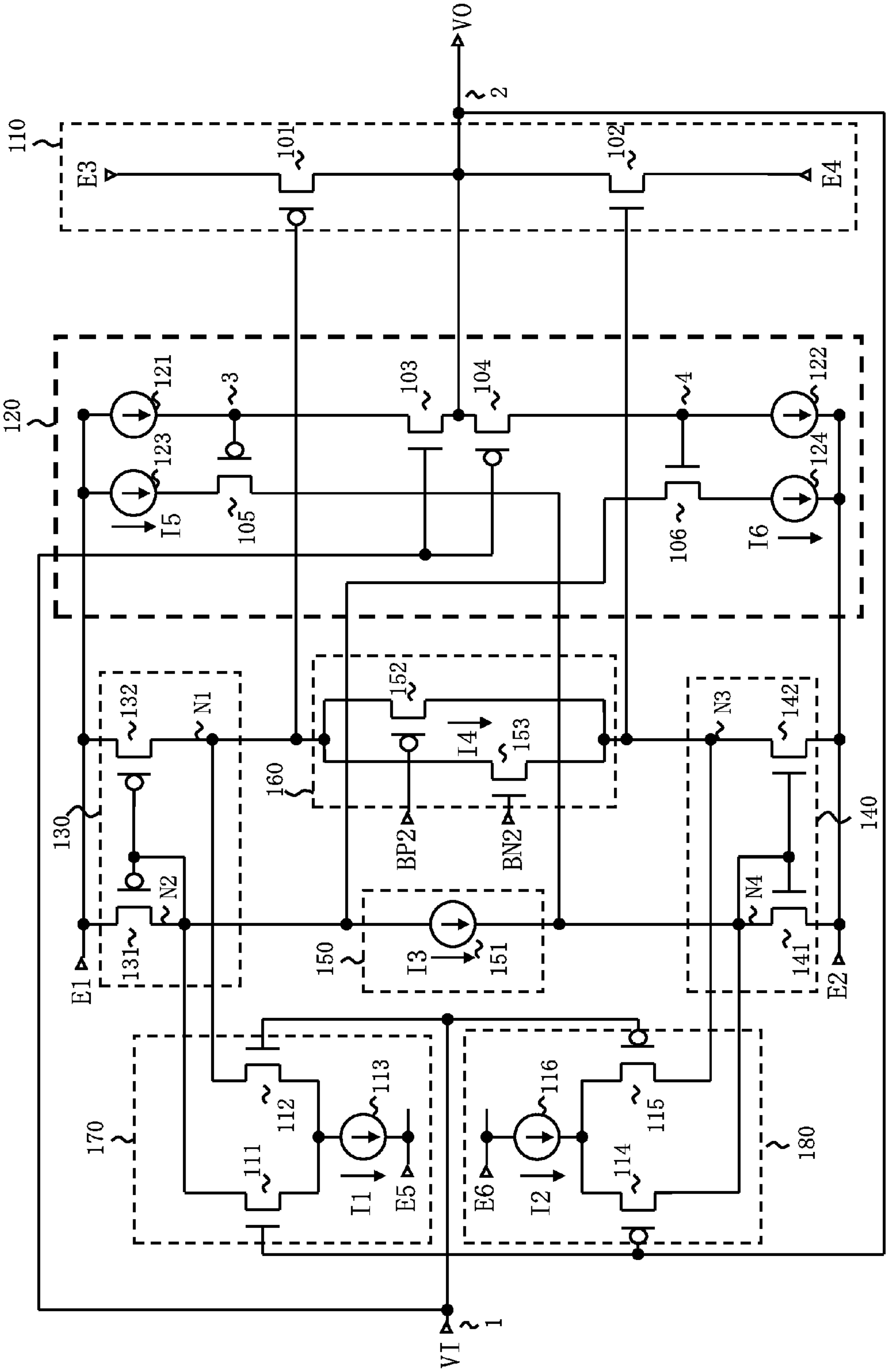
FIG. 4 is a diagram showing the configuration of a fourth exemplary embodiment of the present invention.

The following describes Exemplary Embodiment 4 of the present invention. FIG. 4 shows an arrangement of an output circuit of the present Exemplary Embodiment 4. In the output circuit of FIG. 4, a Pch differential pair is added as a second differential stage 180 to the output circuit of FIG. 1 to enhance the input dynamic range. In FIG. 4, the differential stage 180 includes Pch transistors 115 and 114 (Pch differential pair transistors), having sources connected together, and a current source 116 connected between a sixth power supply terminal E6 and common sources of the Pch differential pair transistors 115 and 114. The gates of the Pch differential pair transistors 115 and 114 are connected in common to gates of Nch differential pair transistors 112 and 111, while pair outputs (pair drains) of the Pch differential pair transistors 115 and 114 are connected to pair nodes N3 and N4.

The output circuit of FIG. 4 is such an output circuit corresponding to a configuration that includes both an Nch differential pair and a Pch differential pair and that has added thereto a current control circuit 120. In contrast to the output circuit of FIG. 1, the circuit area saving effect, brought about by reduction in the number of elements, is low. However, since the current control circuit 120 is provided, the operation of charging/discharging the output terminal 2 is accelerated. The idling current may be suppressed as the load driving speed of FIG. 1 is maintained, thus enabling reducing the static power consumption.

It is noted that the current control circuit 120 of the output circuit of FIG. 4 differs from the control circuit 90 of the related technique of FIG. 25 as to the destinations of connection for sourcing/sinking an additive current. The control circuit of the related technique includes transistors 93-1 and 93-2, current sources 91 and 92, transistors 65, 66, 65-9 and 66-10 and auxiliary current sources 53 and 54. The current control circuit 120 of FIG. 4 has, as the destinations of connection of additive currents (currents I5 and I6), the connection nodes N2 and N4 on the input sides of the current mirrors 130 and 140 contributing to increasing of the currents. The current control circuit 120 of FIG. 4 is exempt from the influence from the on-resistance of the differential transistors, in contradistinction from the case of FIG. 25, and hence is optimum in response characteristics of charging/discharging acceleration with respect to the additive currents (currents I5 and I6).

<Exemplary Embodiment5>

Figure 5:
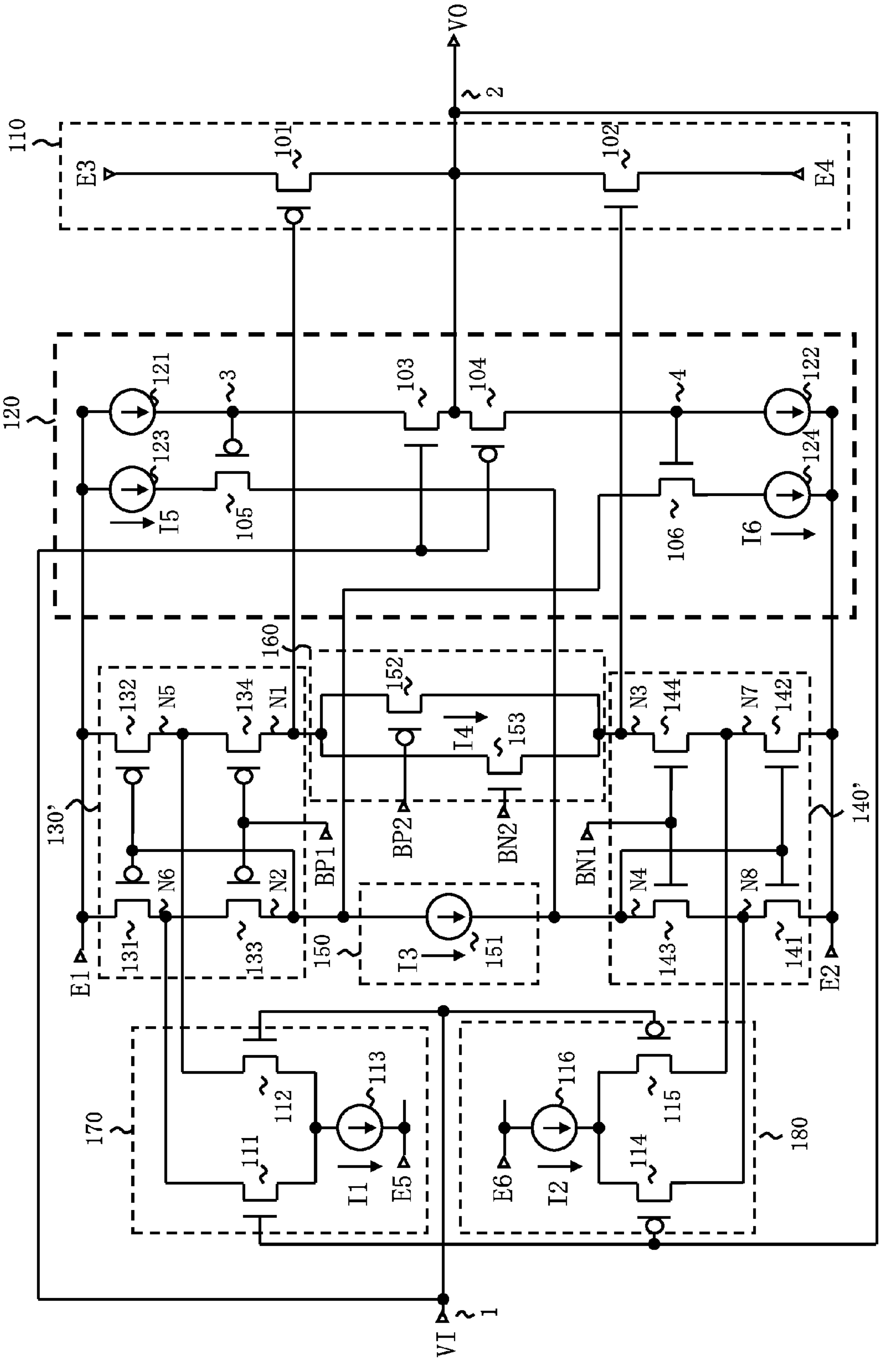
FIG. 5 is a diagram showing the configuration of a fifth exemplary embodiment of the present invention.

The following describes Exemplary Embodiment 5 of the present invention. FIG. 5 shows an arrangement of an output circuit of the present Exemplary Embodiment 5. The output circuit of FIG. 5 corresponds to the output circuit of FIG. 2 added by a second differential stage 180. The second differential stage 180 is made up of Pch differential pair transistors 115 and 114 and a current source 116 that drives the Pch differential pair transistors 115 and 114. The gates of the Pch differential pair transistors 115 and 114 are connected in common to the gates of Nch differential pair transistors 112 and 111. The Pch differential pair transistors 115 and 114 have pair outputs (pair drains) connected to pair nodes N7 and N8.

The output circuit of FIG. 5 is an arrangement provided with both the Nch differential pair and the Pch differential pair and also added by the current control circuit 120. As regards the configuration other than the current control circuit 120, reference may be made to Patent Document 1 (JP Patent Kokai JP-A-2007-208316).

In contrast to the output circuit of FIG. 2, the output circuit of FIG. 5 has no marked circuit area saving effect brought about by reduction in the number of elements. However, in the output circuit of FIG. 5, the charging/discharging at the output terminal 2 may be accelerated by provision of the current control circuit 120, in the same way as in FIG. 2. Moreover, as in FIG. 2, the idling current may be suppressed to enable static power consumption as the load driving speed is maintained. In the current control circuit 120, the destination of coupling of the additive currents (currents I5 and I6) is connection nodes (nodes N2, N4) contributing to increasing the input side current of the current mirrors 130' and 140'. The output circuit of the present Exemplary Embodiment is optimum in a response characteristic of charging/discharging acceleration to the additive currents (currents I5 and I6).

As modifications of Exemplary Embodiment 3 of the present invention, the second differential stage 180 may be added to the output circuit of FIG. 3. In such case, the output circuit may have characteristics equivalent to those of FIG. 5.

<Exemplary Embodiment6>

Figure 6:
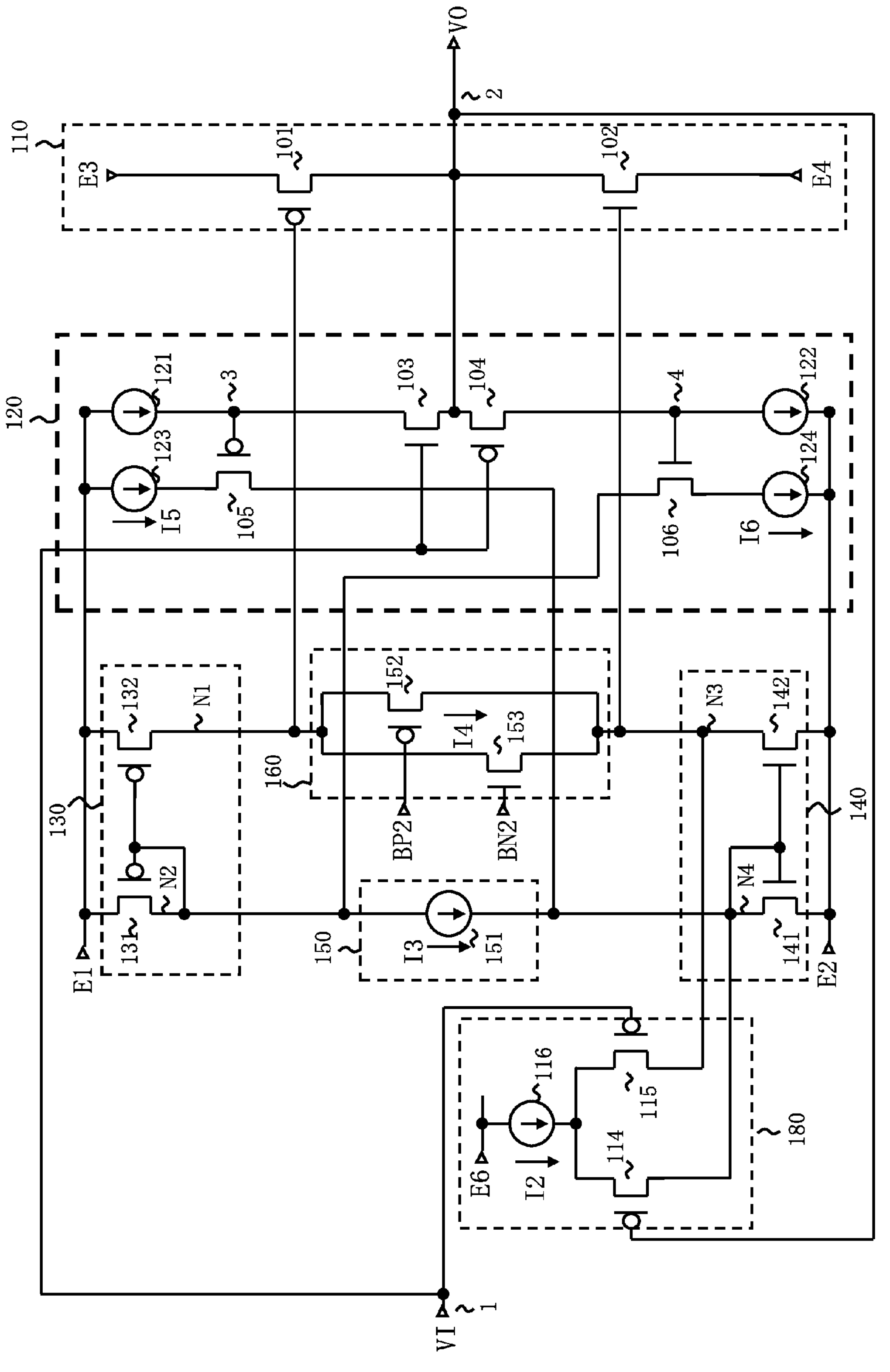
FIG. 6 is a diagram showing the configuration of a sixth exemplary embodiment of the present invention.

The following describes Exemplary Embodiment 6 of the present invention. FIG. 6 shows an arrangement of an output circuit according to Exemplary Embodiment 6 of the present invention. The output circuit of FIG. 6 is such an arrangement in which, in the output circuit of FIG. 1, the first differential stage 170 is deleted and, in its stead, a second differential stage 180, shown in FIG. 4, is provided. The second differential stage 180 includes Pch differential pair transistors 115 and 114 having sources connected common, having gates connected to an input terminal 1 fed with the input voltage VI and to an output terminal 2 outputting the output voltage VO, and a current source 116. The current source 116 is connected between the sixth power supply terminal E6 and the common sources of the Pch differential pair transistors 115 and 114. The Pch differential pair transistors 115 and 114 have pair outputs (pair drains) connected to the pair nodes N3, N4.

In the output circuit of FIG. 6, just the operation of the differential stage has changed from the Nch differential pair to that of the Pch differential pair. The configuration as well as the operation of the current control circuit 120 is similar to that of FIG. 1. Hence, the output circuit of FIG. 6 has the performance similar to that of FIG. 1.

The supply voltages at power supply terminals in the output circuit of FIG. 6 will now be described. For example, if the arrangement of FIG. 6 is used as an output circuit driving an output range of a negative terminal of an LCD driver of FIG. 23A, the power supply voltages of the first, third and sixth power supply terminals E1, E3 and E6 may all be the high potential power supply voltage VDD, while the power supply voltages of the second and fourth power supply terminals E2, E4 may both be low potential power supply voltage VSS. If the arrangement of FIG. 6 is used as an output circuit that drives an output range of the negative terminal, and that is supplied with a power supply voltage VMH corresponding to the upper limit of the output range of the negative terminal in the vicinity of the common voltage (COM), the power supply terminal of the first and third power supply terminals E1, E3 may both be VMH, the power supply terminal of the second and fourth power supply terminals E2, E4 may both be VSS and the power supply voltage of the sixth power supply terminal E6 may be VDD. In particular, the power supply voltage difference between third and fourth power supply terminals E3, E4 of the output amplifier stage 110, flown through by larger current, may be reduced to decrease the power consumption, dependent on (current×voltage) as well as to demonstrate a heat evolution suppressing effect.

It is noted that an upper limit of the range of the operation of the p-type differential input stage 180 is equal to the voltage at the sixth power supply voltage at the terminal E6 less the absolute value of the threshold voltage of the Pch differential pair transistors 115, 114. The sixth power supply terminal E6 is connected to the current source 116 of the p-type differential input stage 180.

Even if the absolute value of the threshold voltage of the Pch differential pair transistors 115 and 114 is of a more or less large value, but the voltage at the sixth power supply terminal E6 is VDD, there is no impediment to the driving of the output range of the negative terminal of from VMH to VSS. In case the threshold voltage value of the Pch differential pair transistors 115 and 114 is approximately zero, the voltage at the sixth power supply terminal E6 may, of course, be to set at VMH.

The power supply voltages at the first and sixth power supply terminals E1 and E6 may both be VDD, those at the second and fourth power supply terminals E2 and E4 may both be VSS and just that of the third power supply terminal E3 may be VMH.

As modification of Exemplary Embodiments 2 and 3, shown in FIGS. 2 and 3, the first differential stage 170 may be replaced by the second differential stage 180, as in Exemplary Embodiment 6, by way of changing the conductivity type of the differential pair.

<Exemplary Embodiment7>

Figure 7:
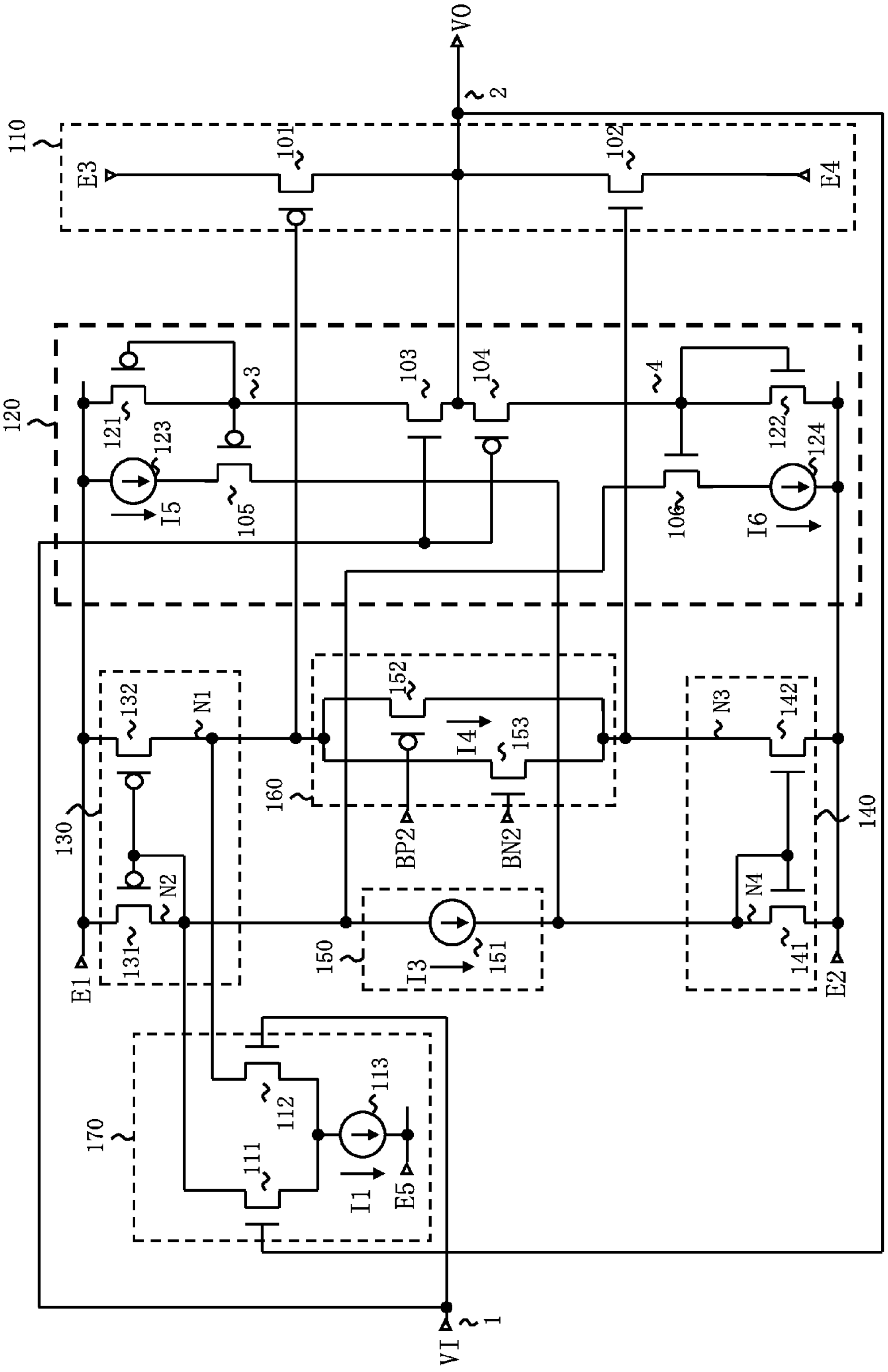
FIG. 7 is a diagram showing the configuration of a seventh exemplary embodiment of the present invention.

The following describes Exemplary Embodiment 7 of the present invention. FIG. 7 shows an arrangement of an output circuit according to Exemplary Embodiment 7 of the present invention. The output circuit of FIG. 7 is such an arrangement in which, in the output circuit of FIG. 1, the current control circuit 120 is partially modified.

In the current control circuit 120 of FIG. 7, the current source 121 of FIG. 1 is replaced by a diode-connected Pch transistor 121 and the current source 122 is replaced by a diode-connected Nch transistor 122.

In the current control circuit 120, the diode-connected Pch transistor (load element) 121 performs the roll to cause the voltage at the gate of the Pch transistor 105 (connection node 3) to be changed towards the voltage at the first power supply terminal E1 (high voltage) when the Nch transistor 103 is turned off. This halts summation of the current I5 to the input side current of the current mirror 140. On the other hand, the diode-connected Nch transistor (load element) 122 performs the roll to cause the voltage at the gate of the Nch transistor 106 (connection node 4) to be changed towards the second power supply terminal E2 (low voltage) when the Pch transistor 104 is turned off. This halts summation of the current I6 to the input side current of the current mirror 130.

In the current control circuit 120 of FIG. 1, the load elements 121 and 122 are formed by current sources. However, the similar operation may be obtained when the load elements are formed by diode-connected transistors. It is noted that the diode-connected transistors 121 and 122 are constructed so that the threshold values (absolute values) thereof will be smaller than those of the transistors 105 and 106. The load elements 121 and 122 may also be constructed by resistance elements, in a manner not shown.

The configuration in the current control circuit 120 in which the load elements 121 and 122 are changed from the current sources to the diode-connected transistors may apply to the current control circuit 120 of the output circuit of each of the Exemplary Embodiments shown in FIGS. 1 to 6.

<Exemplary Embodiment8>

Figure 8:
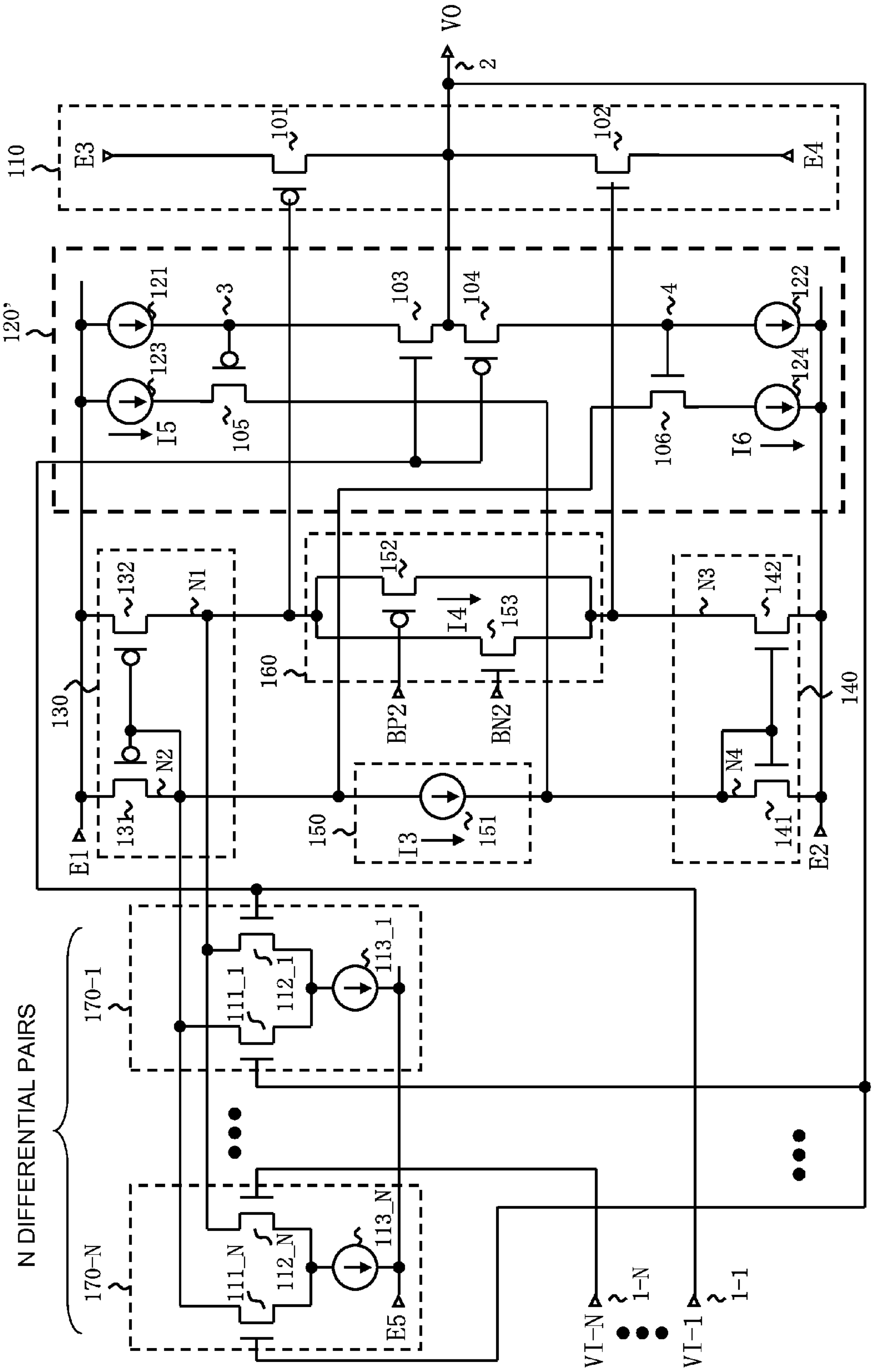
FIG. 8 is a diagram showing the configuration of an eighth exemplary embodiment of the present invention.

The following describes Exemplary Embodiment 8 of the present invention. FIG. 8 shows an arrangement of an output circuit according to Exemplary Embodiment 8 of the present invention. The output circuit of FIG. 8 corresponds to the output circuit of FIG. 1 in which, however, there are provided a plurality of (an N-Number of) differential stages of the same conductivity type (170-1, 170-2, . . . , 170-N). Referring to FIG. 8, the differential input stage includes 1st Nch differential pair transistors (112_1, 111_1), 2nd Nch differential pair transistors (112_2, 111_2), . . . and Nth Nch differential pair transistors (112_N, 111_N). The 1st Nch differential pair transistors (112_1, 111_1) are driven by a 1st current source 113_1 and differentially receives an input voltage VI-1 and an output voltage VO, the 2nd Nch differential pair transistors (112_2, 111_2) are driven by a 2nd current source 113_2 and differentially receives an input voltage VI-2 and the output voltage VO, and the Nth Nch differential pair transistors (112_N, 111_N) are driven by an Nth current source 113_N and differentially receives an input voltage VI-N and the output voltage VO. First outputs of the pair differential transistors are connected together and connected to a node N1, while second outputs thereof are connected together and connected to a node N2.

In case the transistors that compose the pair transistors of the differential pair are equal in size to one another and the current values of the current sources driving them are equal to one another, an average voltage of an N-number of input voltages:

$$VO=\{(VI-1)+(VI-2)+ \ldots +(VI-N)\}/N$$

is output as an output voltage VO at the output terminal 2, where VI-1, VI-2, . . . VI-N stand for an N-number of inputs.

The gates of transistors 103 and 104 of the current control circuit 120, connected together, are connected to an input terminal 1-1, out of an N-number of input terminals (1-1 to 1-N), which receives an input voltage VI-1.

In the output circuit of FIG. 8, the current control circuit 120 is in operation in case a great voltage difference exists between the input voltage VI-1 and the output voltage VO to accelerate the charging/discharging at the output terminal 2. Preferably, the voltage difference among the N input voltages VI-1, VI-2, . . . , VI-N is sufficiently smaller than the threshold voltage of transistors that make up the N differential pairs.

In the output circuit of each of the Exemplary Embodiments of FIGS. 2 to 7, as in Exemplary Embodiment 8 shown in FIG. 8, the single differential stage of the same conductivity type may be replaced by a plurality of differential stages of the same conductivity type.

<Exemplary Embodiment9>

Figure 9:
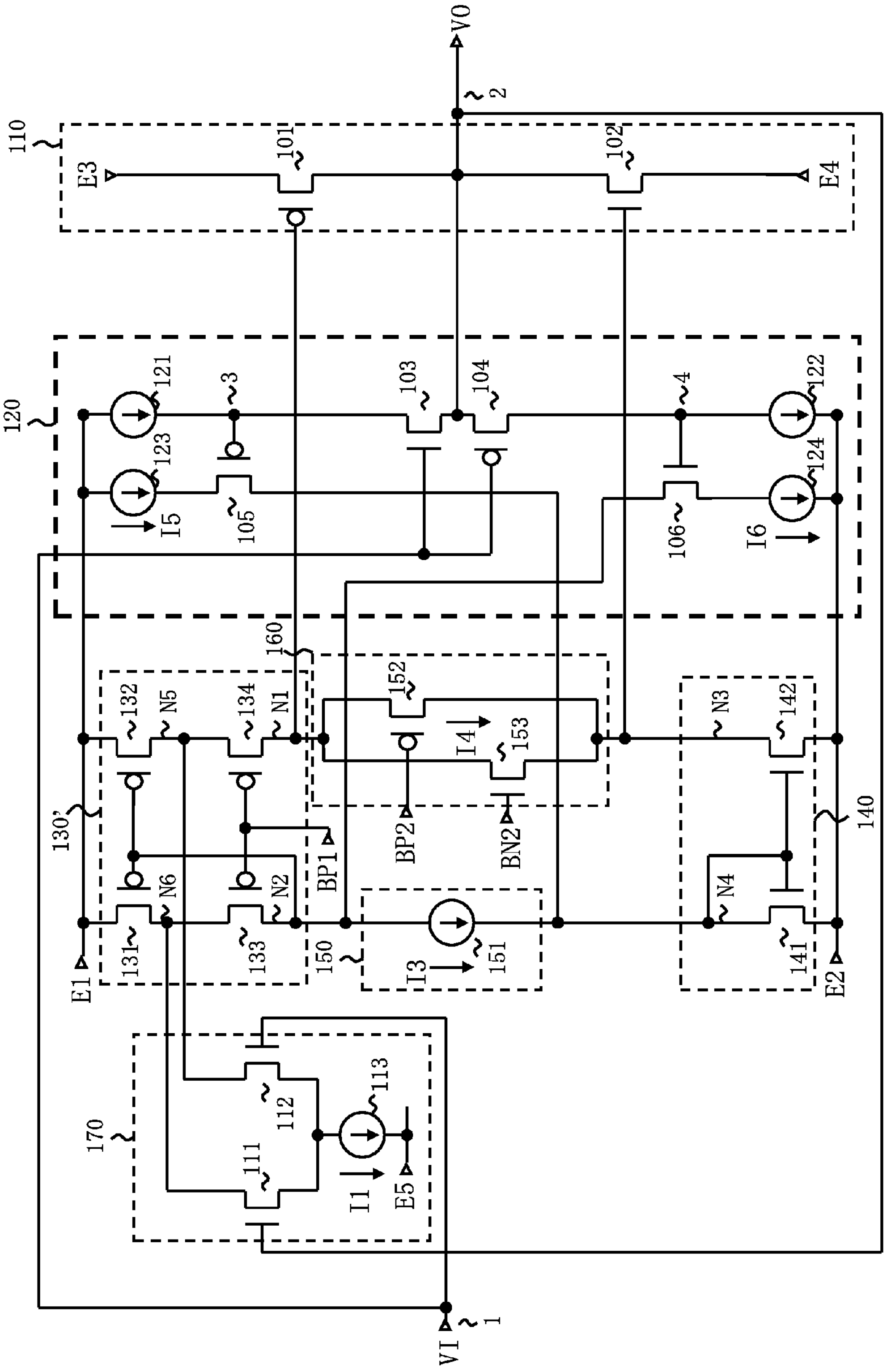
FIG. 9 is a diagram showing the configuration of a ninth exemplary embodiment of the present invention.

The following describes Exemplary Embodiment 9 of the present invention. FIG. 9 shows an arrangement of an output circuit of Exemplary Embodiment 9 of the present invention. The output circuit of FIG. 9 corresponds to the output circuit of FIG. 2 in which the Nch current mirror 140' is replaced by the Nch current mirror 140 shown in FIG. 1. The Nch current mirrors 140 and 140' are similar to each other in operation and may be substituted for each other. It is noted that, in the output circuit of FIG. 3, the Nch current mirror 140 of FIG. 1 may be substituted for the Nch current mirror 140'. However, in such case, the current I5 of the current source 123 of the current control circuit 120 is supplied to the node N4. It is also noted that, in the output circuit provided only with the second differential stage 180 instead of with the first differential stage 170 and in which the current mirror is formed by cascoded low voltage current mirrors 130', 140', the Pch current mirror 130' (FIGS. 2 and 3) may be replaced by a Pch current mirror 130 (FIG. 1).

<Exemplary Embodiment10>

Figure 10:
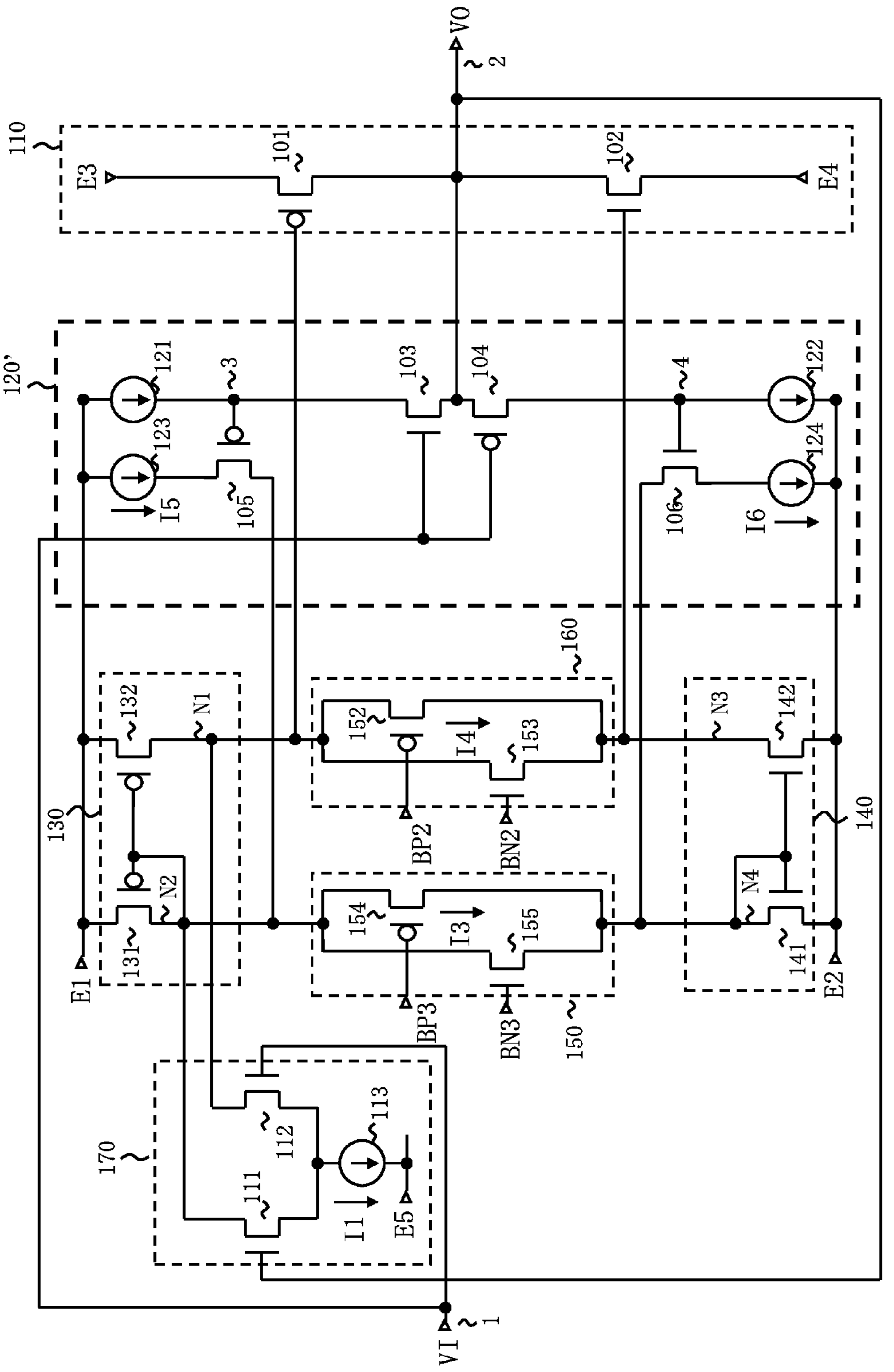
FIG. 10 is a diagram showing the configuration of a tenth exemplary embodiment of the present invention.

The following describes Exemplary Embodiment 10 of the present invention. FIG. 10 shows an arrangement of an output circuit of Exemplary Embodiment 10 of the present invention. Similarly to the output circuit of FIG. 1, the output circuit of FIG. 10 includes a differential input stage that differentially receives an input voltage VI and an output voltage VO, an output amplifier stage 110 and a current control circuit. The output amplifier stage 110 receives first and second outputs (nodes N1 and N3) of the differential input stage to perform a push/pull operation to supply an output voltage VO at the output terminal 2 in accordance with the input voltage VI. The current control circuit detects a potential difference between the input voltage VI and the output voltage VO to exercise current control for the current mirror 130 or 140 in response to the so detected potential difference. The output circuit of FIG. 10 corresponds to the output circuit of FIG. 1, in which the destination of connection of the current control circuit 120 is changed and the first floating current source circuit 150 is also changed. The first differential stage 170, first current mirror (Pch current mirror) 130, second current mirror (Nch current mirror) 140, second floating current source circuit 160 and the output amplifier stage 110 are similar in configuration to those of FIG. 1.

The current control circuit of FIG. 10 couples and adds a current I5 (a source current) of the current source 123 via the first floating current source circuit 150 to an input side current of the second current mirror 140 (a drain current of Nch transistor 141) to increase the current value to accelerate the charging at the output terminal 2. The current control circuit of FIG. 10 couples and adds a current I6 of the current source 124 (a sink current) via the first floating current source circuit 150 to an input side current of the first current mirror 130 (a drain current of Pch transistor 131) to increase the current value to accelerate the discharging at the output terminal 2. The current control circuit that increases the input side current of the current mirror 130 or 140 via the first floating current source circuit 150 is to be a current control circuit 120' as shown in FIG. 10.

The first floating current source circuit 150 of FIG. 10, as a first floating current source circuit 150 suited for the current control circuit 120', is formed by a floating current source composed of a Pch transistor 154 and an Nch transistor 155 connected in parallel to each other between the nodes N2 and N4. The gates of the Pch transistors 154 and 155 are fed with bias voltages 13P3 and BN3. The first floating current source circuit 150, corresponding to the current control circuit 120', is formed by a floating current source circuit in which a current between the nodes N2 and N4 is varied by potential variation at the node N2 or N4.

The current control circuit 120' includes component elements in common with the current control circuit 120 of FIG. 1. The current control circuit 120' differs from the current control circuit 120 of FIG. 1 in the destination of connection. Hence, the same element numbers (reference numerals) as those of the current control circuit 120 of FIG. 1 are used to depict the corresponding element numbers of the current control circuit 120'. More specifically, the current control circuit 120' differs from the current control circuit 120 in that, in the current control circuit 120', the Pch transistor 105 is connected between the first power supply terminal E1 and the node N2 of the differential input stage in series with the current source 123, and in that the Nch transistor 106 is connected between the second power supply terminal E2 and the node N4 of the differential input stage in series with the current source 124. As in the current control circuit 120, the connection order of the Pch transistor 105 and the current source 123 and that of the Nch transistor 106 and the current source 124 may be reversed. It is noted that component substitution possible with the current control circuit 120 of FIG. 1 may also be made in the current control circuit 120'.

Referring to FIG. 10, the current control circuit 120' conies into operation, when the input voltage VI at the input terminal 1 is markedly changed with respect to the output voltage VO at the output terminal 2. When VI−VO>Vtn>0, where Vtn is a threshold voltage of the Nch transistor 103, the current control circuit 120' supplies the current I5 from the current source 123 to the input end (node N2) of the Pch current mirror 130 of the differential input stage. The current I5 is coupled with a current to be supplied to the first floating current source circuit 150 so as to be summed to the input current of the Nch current mirror 140, via the first floating current source circuit 150, as a result of which the operation of charging at the output terminal 2 is accelerated.

When the input voltage VI at the input terminal 1 is markedly changed towards the low potential side with respect to the output voltage VO at the output terminal 2, such that VI−VO<Vtp<0, where Vtp is a threshold voltage of the Pch transistor 104, the current control circuit 120' draws out the current I6 of the current source 124 from the input end (node N4) of the Nch current mirror 140 of the differential input stage. That is, the current control circuit 120' supplies a sink current to the node N4. The current I6 is coupled with the current on the output side of the first floating current source circuit 150 so as to be summed to the input current of the Pch current mirror 130 to accelerate the discharging operation at the output terminal 2.

The following describes the operation of the output circuit of the present Exemplary Embodiment, shown in FIG. 10. The currents in the current sources 113, 123 and 124 in the output stabilized state are labeled I1, I5 and I6, respectively, and the sum current of the floating current sources 152 and 153 is labeled 14 (=I3). The input voltage VI is a step voltage.

In the output circuit of FIG. 10, the normal operation of the differential amplifier not under control by the current control circuit 120' is as follows: When the input voltage VI changes markedly towards the voltage at the first power supply terminal E1 (high voltage side) with respect to the output voltage VO, the potentials at the nodes N1 and N3 are decreased, thus producing the charging operation at the output terminal 2 by the output amplifier stage 110. When the input voltage VI changes markedly towards the voltage at the second power supply terminal E2 (low voltage side) with respect to the output voltage VO, the potentials at the nodes N1 and N3 are raised, thus producing the charging operation for the output terminal 2 by the output amplifier stage 110. The operation at this time is the same as that of the normal differential amplifier which is not under control by the current control circuit 120. As for details, reference is to be made to the explanation of FIG. 1.

The operation of the current control circuit 120' will now be described. The operation of the current control circuit 120' is additive to the normal differential amplifier operation not under control by the current control circuit 120'. When the input voltage VI at the input terminal 1 is markedly changed with respect to the output voltage VO at the output terminal 2 towards the voltage at the first power supply terminal E1 (high voltage), such that the gate-to-source voltage of the Nch transistor 103 has become larger than the transistor's threshold voltage Vtn, the Nch transistor 103 is turned on. That is, when a voltage difference between the output voltage VO and the first power supply terminal voltage VE1 becomes larger than a voltage difference between the input voltage VI and the first power supply terminal voltage VE1 by a value more than a threshold value Vtn of the Nch transistor 103 (VI−VO>Vtn>0), the Nch transistor 103 is turned on to pull down the voltage at the connection node 3 of the drain of the Nch transistor 103 and the current source 121 to turn on the Nch transistor 105.

In this case, the current I5 of the current source 123 is fed via the Pch transistor 105 in its on-state to the input end (node N2) of the Pch current mirror 130. At this time, the Pch transistor 104 is turned off. The voltage at the connection node 4 between the drain of the Pch transistor 104 and the current source 122 is equal to the voltage at the second power supply terminal E2. The Nch transistor 106 is now turned off.

In the output circuit of FIG. 10, when the input voltage VI changes markedly with respect to the output voltage VO towards the voltage at the first power supply terminal E1 (high voltage) in the course of the normal differential amplifier operation. At this time, the potentials at the nodes N1 and N3 are decreased due to changes in the output current of the Nch differential pair (decrease/increase of the drain currents of the Nch transistors 111 and 112) to bring about the operation of charging the output terminal 2 by the output amplifier stage 110. When the current I5 of the current source 123 is fed to the node N2 in the current control circuit 120', to add to the differential amplifier operation, the potential at the node N2 rises to increase a gate-to-source voltage (absolute value) of the Pch transistor 154 of the floating current source (154, 155). Hence, the current I5 is fed to the node N4 via the Pch transistor 154 to increase the input current of the Nch current mirror 140 (a drain current of the Nch transistor 141). At this time, the potential at the common gate (node N4) of the Nch transistors 141 and 142 rises to increase the output current of the Nch current mirror 140 (a drain current of the Nch transistor 142). This enhances the discharging operation at the node N3 to further decrease the potential at the node N3. Since the potential at the node N3 is lowered, a gate-to-source voltage of the Nch transistor 153 of the floating current source (152, 153) is enlarged to increase the drain current flowing through the Nch transistor 153. This augments the discharging at the node N1 to further decrease the potential at the node N1.

When the current I5 of the current source 123 is fed to the node N2 to increase the potential at the node N2, gate-to-source voltages (absolute values) of the Pch transistors 131 and 132, that have gates connected in common to the node N2, are decreased, thus decreasing an output current of the Pch current mirror 130 (drain current of the Pch transistor 132). Hence, the decrease in the potential at the node N1 is also pushed by the decrease in the output current of the Pch current mirror 130.

As a result, the decrease in the potential at the nodes N1 and N3 is promoted to enlarge a gate-to-source voltage (absolute value) of the Pch transistor 101 of the output amplifier stage 110 and decrease a gate-to-source voltage of the Nch transistor 102 of the output amplifier stage 110 is quickly decreased to accelerate the rise in the output voltage VO at the output terminal 2. That is, the current I5 of the current source 123 is coupled to the current flowing from the input end (node N2) of the Pch current mirror 130 to the floating current source (154, 155) (current on the input side of the Pch current mirror 130) by the current control circuit 120' so as to be added to the input current of the Nch current mirror 140 via the floating current source (154, 155). This accelerates the action of charging at the output terminal 2 to accelerate the rise in the output voltage VO.

When the output voltage VO approaches to the input voltage VI, such that a voltage difference between the output signal VO and the input voltage VI becomes smaller than the threshold voltage of the Nch transistor 103, the Nch transistor 103 is turned off. That is, when a voltage difference between the output voltage VO and the first power supply terminal voltage VE1 becomes smaller than a voltage difference between the input voltage VI and the first power supply terminal voltage VE1 by a value not larger than a threshold value Vtn of the Nch transistor 103 (VI−VO≤Vtn), the Nch transistor 103 is turned off to raise the potential at the connection node 3, as a result of which Pch transistor 105 is turned off. This halts supply of the current I5 to the node N2 as well as the acceleration of charging operation at the output terminal 2.

From this time on, the output circuit changes to the normal differential amplifier operation, which is not under control by the current control circuit 120' to effect charging at the output terminal 2. An output stabilized state is reached when the output voltage VO has become equal to the input voltage VI.

When the input voltage VI changes markedly with respect to the output voltage VO towards the second power supply terminal E2 (low voltage) such that an absolute value of a gate-to-source voltage of the Pch transistor 104 exceeds a threshold value (absolute value) Vtp of Pch transistor 104, the Pch transistor 104 is turned on. That is, when a voltage difference between the output voltage VO and the second power supply terminal voltage VE2 becomes larger than a voltage difference between the input voltage VI and the second power supply terminal voltage VE2 by a value more than a threshold value (absolute value) Vtp of the Pch transistor 104 (VI−VO<Vtp<0), that is, (|VI−VO|>|Vtp|, the Pch transistor 104 is turned on to pull up the voltage at the connection node 4, as a result of which the Nch transistor 106 is turned on.

Thus, the current I6 of the current source 124 is supplied as a sink current from the input end (node N4) of the current mirror 140 towards the current control circuit 120'. At this time, the Nch transistor 103 is turned off, the voltage at the connection node 3 is set to that of the first power supply terminal E1, and the Pch transistor 105 is turned off.

In the output circuit of FIG. 10, when the input voltage VI changes markedly with respect to the output voltage VO towards the voltage at the second power supply terminal E2 (low voltage) in the course of the normal differential amplifier operation of the output circuit, which is not under control by the current control circuit 120', the potentials at the nodes N1 and N3 increase due to changes in the output current of the Nch differential pair (increase/decrease of the drain currents of the Nch transistors 111 and 112) to bring about the discharging operation at the output terminal 2 by the output amplifier stage 110. In addition to this differential amplifier operation, when the current I6 of the current source 124 of the current control circuit 120' is supplied as a sink current at the node N4, the potential at the node N4 is decreased to increase a gate-to-source voltage (absolute value) of the Nch transistor 155 of the floating current source (154, 155). Hence, the current I6 is supplied as a sink current at the node N2 via the Nch transistor 155 to increase the input current of the Pch current mirror 130 (a drain current of the Pch transistor 131). At this time, the potential at the common gates (node N2) of the Pch transistors 131 and 132 is decreased to increase an output current of the Pch current mirror 130 (a drain current of the Nch transistor 132). This enhances the charging effect at the node N1 to further increase the potential at the node N1. With the increase of the potential at the node N1, a gate-to-source voltage of the Pch transistor 152 of the floating current source (152, 153) is increased to increase a drain current flowing through the Pch transistor 152. This augments the charging at the node N3 to further raise the potential at the node N3.

When the current I6 of the current source 124 is supplied as a sink current at the node N4 to lower the potential at the node N4, the gate-to-source voltages (absolute values) of the Nch transistors 141 and 142 that have gates connected in common to the node N4, are decreased, thus decreasing an output current of the Nch current mirror 140 (a drain current of the Nch transistor 142). Hence, the rise in the potential at the node N3 is also pushed by the decrease in the output current of the Nch current mirror 140.

As a result, the rise in the potential at the nodes N1 and N3 is promoted to speedily decrease a gate-to-source voltage (absolute value) of the Pch transistor 101 of the output amplifier stage 110. A gate-to-source voltage of the Nch transistor 102 of the output amplifier stage 110 is further increased to accelerate the decrease in the output voltage VO at the output terminal 2. That is, the current I6 of the current source 124 is coupled as a sink current to the current flowing to the input end (node N4) of the Nch current mirror 140 from the floating current source (154, 155) (a current on the input side of the Nch current mirror 140) by the current control circuit 120' so as to add to the input current of the Pch current mirror 130 via the floating current source (154, 155). This accelerates the action of discharging at the output terminal 2 to accelerate the decrease in the output voltage VO.

When the output signal VO approaches to the input voltage VI, such that a voltage difference (absolute value) between the output signal VO and the input voltage VI becomes smaller than the threshold voltage (absolute value) of the Pch transistor 104, the Pch transistor 104 is turned off. That is, when a voltage difference between the output voltage VO and the second power supply terminal voltage VE2 becomes smaller than a voltage difference between the input voltage VI and the second power supply terminal voltage VE2 by a value not larger than a threshold value (absolute value) Vtp of the Pch transistor 104 ($|VI-VO| \leq |Vtp|$), the Pch transistor 104 is turned off to decrease the potential at the connection node 4, as a result of which the Nch transistor 106 is turned off. This halts the sink current I6 from the node N4 as well as the action of discharging acceleration at the output terminal 2. From this time on, the output circuit operates as the normal differential amplifier, not under control by the current control circuit 120' to allow discharging at the output terminal 2. An output stabilized state is reached when the output voltage VO has become equal to the input voltage VI.

Thus, the current control circuit 120' comes into operation, when a larger voltage difference between the input voltage VI and the output voltage VO to accelerate the operation of charging/discharging at the output terminal 2. When the output voltage VO approaches to the input voltage VI, the operation of the current control circuit 120' automatically halts. It is noted that, when the change in the input voltage VI is small, with the voltage difference between the input voltage VI and the output voltage VO being not larger than the threshold value (absolute value) of the transistor 103 or 104, the current control circuit 120' is not in operation. The charging/discharging operation at the output terminal 2, when the current control circuit 120' is in operation, is equivalent to that of the differential amplifier including both the Nch differential pair and the Pch differential pair. Hence, the output voltage waveform during charging at the output terminal 2 may readily be made symmetrical with respect to that during discharging at the output terminal 2.

In the output circuit of FIG. 10, a phase compensation capacitance may be provided to ensure output stability in a feedback connection configuration. In FIG. 10, the phase compensation capacitance may be provided say between one of gates (N1 and N3) of the Pch transistors 101 and 102 of the output amplifier stage 110 and the output terminal 2. Alternatively, the phase compensation capacitance may be provided between each of the gates (N1 and N3) of the Pch transistors 101 and 102 of the output amplifier stage 110 and the output terminal 2. By adjusting the currents I5 and I6 of the current sources 123 and 124 of the current control circuit 120' depending on the connection of the phase compensation capacitance, the phase compensation capacitance may quickly be charged/discharged to render the output voltage waveform during charging symmetrical with respect to that during discharging.

Moreover, in the output circuit of FIG. 10, the differential pair of the differential input stage may be constructed to a single conductivity type to reduce the number of elements as well as the circuit area. Even if the idling current (currents I1, I3 and I4 and the current in the Pch transistors 101 and 102 of the output amplifier stage 110) is reduced to suppress the static power consumption, it is similarly possible to accomplish low power consumption and high speed driving. It is because the high speed operation may be enabled based on control by the current control circuit 120'.

The power supply voltages, supplied to the power supply terminals of the output circuit of FIG. 10, may be set or changed in the same way as in FIG. 1. For example, the circuit of FIG. 10 may be used as an output circuit that drives an output range of the OLED driver of FIG. 23B or as an output circuit that drives an output range of the LCD driver of FIG. 23A. As for details of setting examples for the power supply voltages, reference may be made to the explanation with reference to FIG. 1. Set-up examples for the first and second power supply terminals of the current control circuit 120' are similar to those for the current control circuit 120 of FIG. 1.

<Exemplary Embodiment11>

Figure 11:
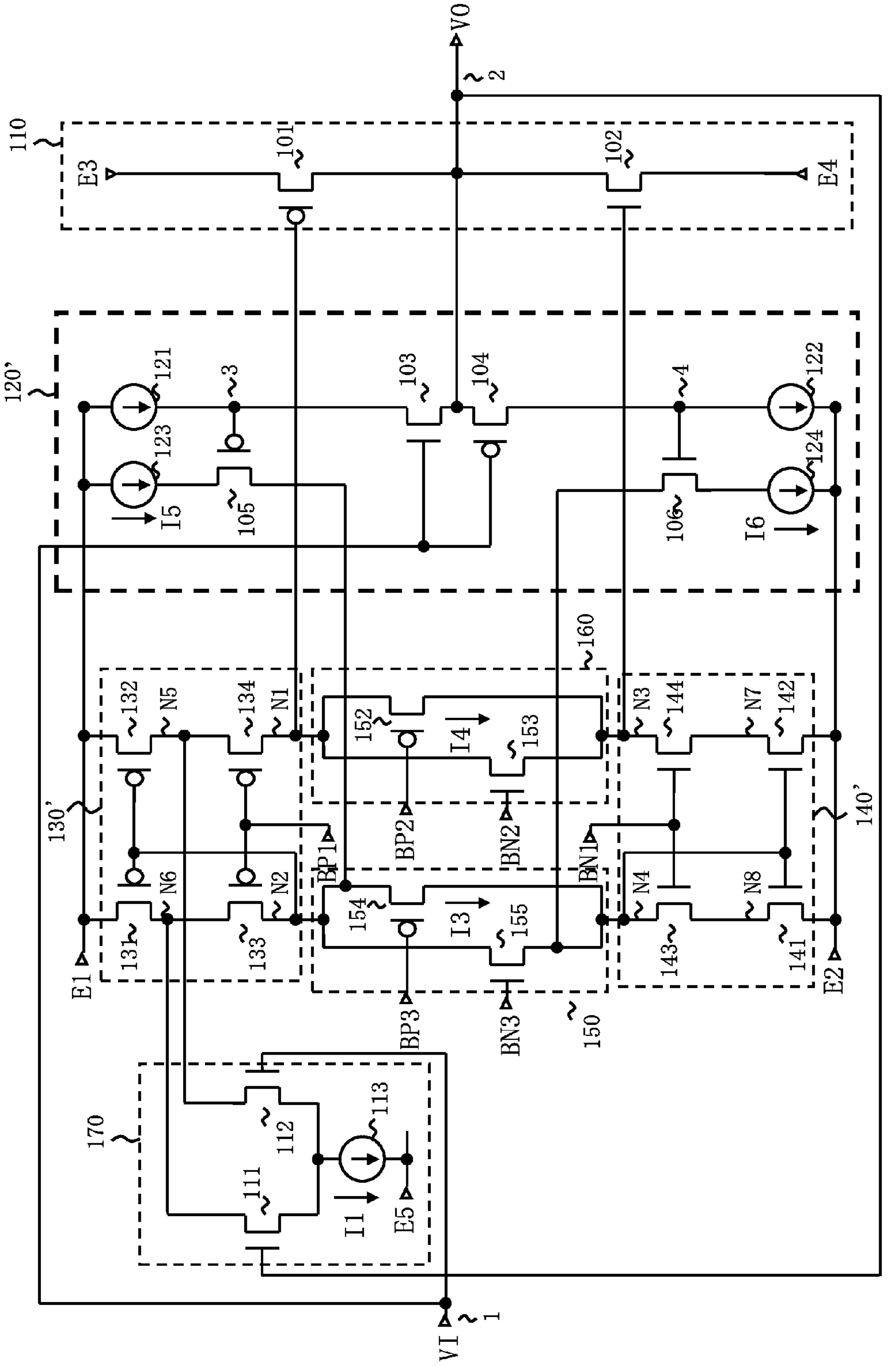
FIG. 11 is a diagram showing the configuration of an eleventh exemplary embodiment of the present invention.

The following describes Exemplary Embodiment 11 of the present invention. FIG. 11 shows an arrangement of an output circuit of the present Exemplary Embodiment. The output circuit of FIG. 11 corresponds to the circuit of FIG. 10 in which the current mirrors 130, 140 of FIG. 10 are replaced by cascoded low voltage current mirrors 130' and 140' similar to those shown in FIG. 2. A current control circuit includes, as in FIG. 10, a current control circuit 120' that increases the input current of the current mirror 130' or 140' via the floating current source circuit 150. The same components of the current mirrors 130' and 140' as those of FIG. 2 and the same components of the current control circuit 120' as those of FIG. 10 are depicted by the same reference numerals.

The operation of the output circuit of FIG. 11 will now be described. In the output circuit of FIG. 11, the normal operation of the differential amplifier, not under control by the current control circuit 120' is as follows:

When the input voltage VI changes markedly towards the voltage at the first power supply terminal E1 with respect to the output voltage VO, the potentials at the nodes N1 and N3 are lowered, thus producing the charging operation at the output terminal 2 by the output amplifier stage 110. When the input voltage VI changes markedly towards the voltage at the second power supply terminal E2 with respect to the output voltage VO, the potentials at the nodes N1 and N3 are raised, thus producing the discharging operation at the output terminal 2 by the output amplifier stage 110. The operation at this time is the same as that of the normal differential amplifier not under control by the current control circuit 120 of FIG. 2. As for details, reference is to be made to the explanation of FIG. 2.

The operation of the current control circuit 120' will now be described. The operation of the current control circuit 120' is regarded as an additive operation to the normal differential amplifier operation, which is not under control by the current control circuit 120'. The configuration and the detailed operation of the current control circuit 120' are the same as those as explained with reference to FIG. 10. That is, when the input voltage VI has markedly changed with respect to the output voltage VO towards the voltage of the first power supply terminal E1 (high voltage), the current control circuit 120' supplies the current I5 of the current source 123 to the input end (node N2) of the Pch current mirror 130.

In the output circuit of FIG. 11, when the input voltage VI is markedly changed, in the normal differential amplifier operation which is not under control by the current control circuit 120', towards the voltage at the first power supply terminal (E1) (high voltage) with respect to the output voltage VO, the potentials at the nodes N1 and N3 are lowered due to changes in the output current of the Nch differential pair (decrease/increase of the drain currents of the Nch transistors 111 and 112) to bring about charging operation at the output terminal 2 by the output amplifier stage 110. In addition to this kind of differential amplifier operation, when the current I5 of the current source 123 of the current control circuit 120' is supplied to the node N2, the potential at the node N2 is increased to increase a gate-to-source voltage (absolute value) of the Pch transistor 154 of the floating current source (154, 155). Hence, the current I5 is supplied to the node N4 via the Pch transistor 154 to increase the input current of the Nch current mirror 140' (drain currents of the Nch transistor 141 and 143). At this time, the potential at the common gates (node N4) of the Nch transistors 141 and 142 is increased to increase the output current of the Nch current mirror 140' (drain currents of the Nch transistors 142 and 144). This enhances the discharging operation at the node N3 to further decrease the potential at the node N3. With the lowering of the potential at the node N3, a gate-to-source voltage of the Nch transistor 153 of the floating current source (152, 153) is enlarged to increase a drain current of the Nch transistor 153. This augments the discharging at the node N1 to further decrease the potential at the node N1.

When the current I5 of the current source 123 is supplied to the node N2 to increase the potential at the node N2, gate-to-source voltages (absolute values) of the Nch transistors 131 and 132 that have gates connected in common to the node N2, are decreased, thus decreasing the drain currents of the Pch transistor 131 and 132. Hence, the fall in the potential at the node N1 is also pushed by the decrease in the output current of the Pch current mirror 130' (drain currents of the Pch transistor 131 and 132).

As a result, the lowering in the potential at the nodes N1 and N3 is promoted to further enlarge a gate-to-source voltage (absolute value) of the Pch transistor 101 of the output amplifier stage 110. A gate-to-source voltage of the Nch transistor 102 of the output amplifier stage 110 is quickly decreased to accelerate the rise in the output voltage VO at the output terminal 2. That is, the current I5 of the current source 123 is coupled to a current flowing from the input end (node N2) of the Pch current mirror 130' to the floating current source (154, 155) (a current on the input side of the Pch current mirror 130') by the current control circuit 120' so as to add to the input current of the Nch current mirror 140' via the floating current source (154, 155). This accelerates the charging at the output terminal 2 to speed up the rise in the output voltage VO.

When the input voltage VI changes markedly with respect to the output voltage VO towards the second power supply terminal E2 (low voltage), the current I6 of the current source 124 is supplied as a sink current by the current control circuit 120' at the input end (node N4) of the Nch current mirror 140'.

In the output circuit of FIG. 11, when the input voltage VI changes markedly with respect to the output voltage VO towards the voltage at the second power supply terminal E2 (low voltage) in the course of the normal differential amplifier operation, which is not under control by the current control circuit 120', the potentials at the nodes N1 and N3 increase due to changes in the output current of the Nch differential pair (increase/decrease of drain currents of the Nch transistors 111 and 112) to bring about the operation of discharging the output terminal 2 by the output amplifier stage 110. In addition to the differential amplifier operation, when the current I6 of the current source 124 is supplied as a sink current by the current control circuit 120' at the node N4, the potential at the node N4 is decreased to enlarge a gate-to-source voltage of the Nch transistor 155 of the floating current source (154, 155). Hence, the current I6 is supplied as a sink current at the node N2 via the Nch transistor 155 to increase the input current of the Pch current mirror 130' (drain currents of the Pch transistors 131 and 133). At this time, the potential at the common gates (node N2) of the Pch transistors 131 and 132 is decreased to increase an output current of the Pch current mirror 130' (drain currents of the Nch transistors 132 and 134). This enhances the charging operation at the node N1 to further increase the potential at the node N1. Since the potential at the node N1 is raised, the gate-to-source voltage (absolute value) of the Pch transistor 152 of the floating current source (152, 153) is increased to increase a drain current flowing through the Pch transistor 152. This augments the charging operation at the node N3 to further decrease the potential at the node N3.

When the current I6 of the current source 124 is supplied as a sink current at the node N4 to decrease the potential at the node N4, a gate-to-source voltages of the Nch transistors 141 and 142, that have gates connected in common to the node N4, are decreased, thus decreasing the output current of the Nch current mirror 140' (drain current of the Nch transistors 142 and 144). Hence, the rise in the potential at the node N3 is also pushed by the decrease in the output current of the Nch current mirror 140'.

As a result, the rise in the potential at the nodes N1 and N3 is promoted to quickly decrease a gate-to-source voltage (absolute value) of the Pch transistor 101 of the output amplifier stage 110. A gate-to-source voltage of the Nch transistor 102 of the output amplifier stage 110 is further increased to accelerate the decrease in the output voltage VO at the output terminal 2. That is, the current I6 of the current source 124 is coupled as a sink current to the current flowing to the input end (node N4) of the Nch current mirror 140' from the floating current source (154, 155) (that is, the current on the input side of the Nch current mirror 140') by the current control circuit 120' to add to an input current of the Pch current mirror 130' via the floating current source (154, 155). This accelerates the action of discharging at the output terminal 2 to accelerate the decrease in the output voltage VO.

In charging as well as discharging at the output terminal 2, when the output voltage VO approaches to the input voltage VI, such that a voltage difference between the output voltage VO and the input voltage VI becomes smaller than the threshold value (absolute value) of the Nch transistor 103 as well as the Pch transistor 104, the transistors 103 and 104 are both turned off. This halts the supply of the current I5 to the node N2 or sinking of the current I6 from the node N4 as well as the charging/discharging acceleration effect at the output terminal 2. From this time on, the output circuit operates as the normal differential amplifier, not under control by the current control circuit 120'. An output stabilized state is reached, when the output voltage VO has become equal to the input voltage VI.

Thus, the current control circuit 120' of FIG. 11 comes into operation when a larger voltage difference between the input voltage VI and the output voltage VO to accelerate the operation of charging/discharging at the output terminal 2. When the output voltage VO approaches to the input voltage VI, the operation of the current control circuit 120' automatically halts.

It is noted that, when the change in the input voltage VI is small, with the voltage difference between the input voltage VI and the output voltage VO being not greater than the threshold value (absolute value) of the transistor 103 or 104, the current control circuit 120' is not in operation. The charging/discharging operation at the output terminal 2, when the current control circuit 120' is in operation, is equivalent to that of the differential amplifier including both the Nch differential pair and the Pch differential pair. Hence, the output voltage waveform during charging may readily be made symmetrical with respect to that during discharging.

In the output circuit of FIG. 11, a phase compensation capacitance may be provided to ensure output stability in the feedback connection configuration. In FIG. 11, the phase compensation capacitance may be provided say between the connection node N5 of the Pch transistors 132 and 134 and the output terminal 2 and/or between the connection node N7 of the Pch transistors 132 and 134 and the output terminal 2. Alternatively, the phase compensation capacitance may be provided say between one of gates (N1 and N3) of the Pch transistors 101 and 102 of the output amplifier stage 110 and the output terminal 2. Or, the phase compensation capacitance may be provided between each of the gates (N1 and N3) of the Pch transistors 101 and 102 of the output amplifier stage 110 and the output terminal 2. By adjusting the currents I5 and I6 of the current sources 123 and 124 of the current control circuit 120' depending on the connection of the phase compensation capacitance, the phase compensation capacitance may speedily be charged/discharged to render the output voltage waveform during charging symmetrical with respect to that during discharging.

Moreover, in the output circuit of FIG. 11, the differential pair of the differential input stage may be constructed to a single conductivity type differential pair to reduce the number of components as well as a circuit area. Moreover, even if an idling current (currents I1, I3 and I4 and currents in the Pch transistors 101 and 102 of the output amplifier stage 110) is reduced to suppress the static power consumption, it is similarly possible to accomplish low power consumption and high speed driving. It is because a high speed operation may be made possible based on control by the current control circuit 120'. The power supply voltages supplied to respective power supply terminals may be set or changed in the same way as in FIG. 1, such that reference may be made to the corresponding explanation made with respect to FIG. 1.

<Exemplary Embodiment12>

Figure 12:
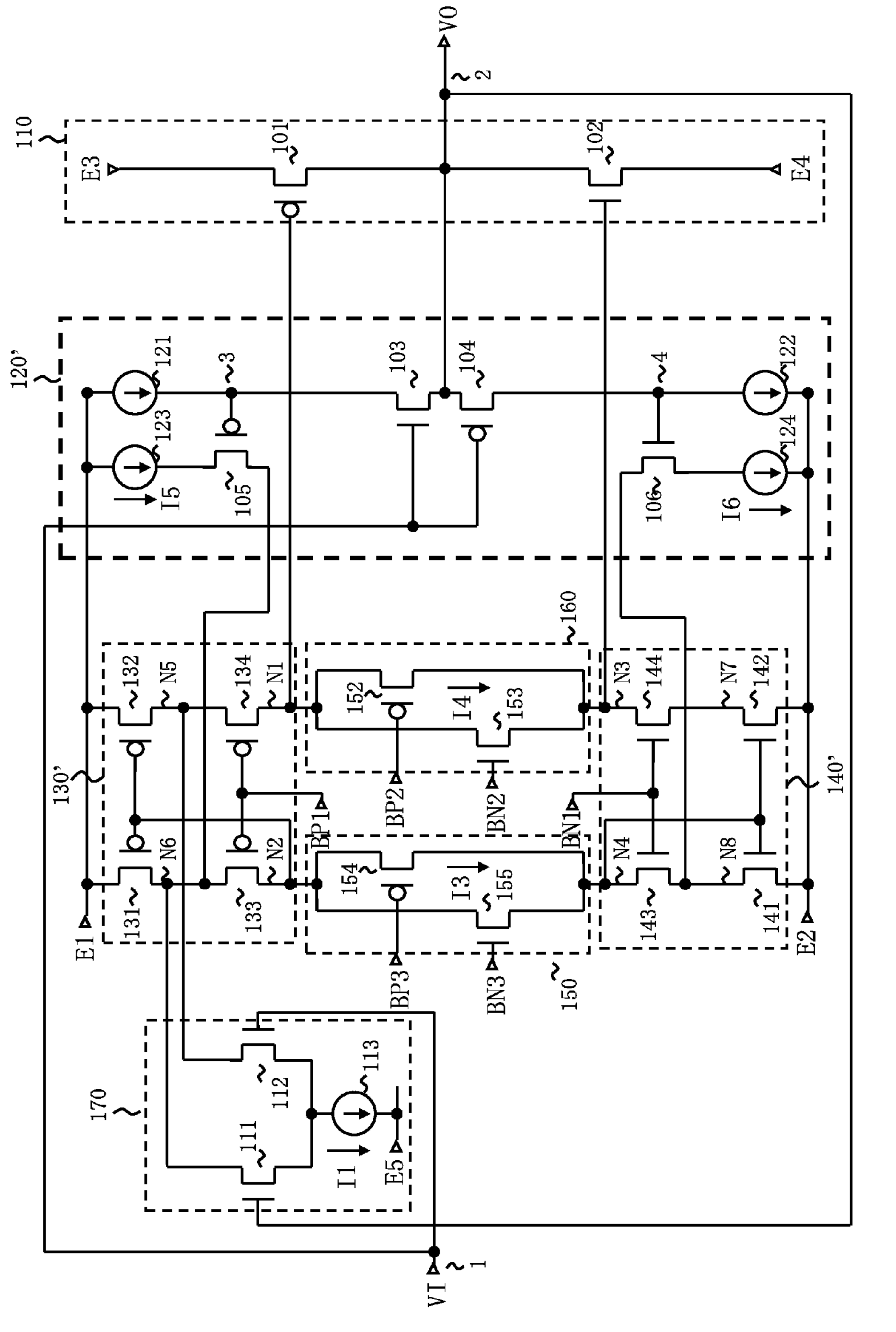
FIG. 12 is a diagram showing the configuration of a twelfth exemplary embodiment of the present invention.

The following describes Exemplary Embodiment 12 of the present invention. FIG. 12 shows an arrangement of an output circuit of the present Exemplary Embodiment. In FIG. 12, the same reference numerals as those used in FIG. 10 are used to denote corresponding component elements. The output circuit of FIG. 12 corresponds to the output circuit of FIG. 11, in which the destination of connection of the current control circuit 120' is changed. Or, the output circuit of FIG. 12 corresponds to the output circuit of FIG. 3, in which the current control circuit 120 is replaced by the current control circuit 120'. In FIG. 12, a current source 123 of the current control circuit 120' is connected via a Pch transistor 105 to a connection node (node N6) of the transistors 131 and 133 of the Pch current mirror 130' and a current source 124 is connected via an Nch transistor 106 to a connection node (node N8) of transistors 141 and 143 of the Nch current mirror 140'. Otherwise, the arrangement of the present Exemplary Embodiment is similar to that of FIG. 11.

In FIG. 12, when the input voltage VI changes markedly with respect to the output voltage VO towards the voltage at the first power supply terminal E1 (high voltage) in the course of the normal differential amplifier operation, which is not under control by the current control circuit 120', as in FIG. 11, the potentials at the nodes N1 and N3 are lowered to bring about charging at the output terminal by the output amplifier stage 110. In addition to the normal differential amplifier operation, when the current I5 of the current source 123 is supplied to the node N6, by the current control circuit 120', the potential at the node N6 rises to increase a gate-to-source voltage of the Pch transistor 133. Hence, the current I5 is supplied to the node N2 via the Nch transistor 133 to raise the potential at the node N2. Since the potential at the node N2 rises, a gate-to-source voltage (absolute value) of the Pch transistor 154 of the floating current source (154, 155) is increased. This causes the current I5 to be supplied via the Pch transistor 154 to the node N4 to increase an input current (drain currents of the Nch transistors 141 and 143) of the Nch current mirror 140'. That is, the current I5 is supplied to the node N6 in a manner similar to the current I5 being supplied to the node N2 of FIG. 11, thus accelerating the charging operation at the output terminal 2.

In FIG. 12, when the input voltage VI changes markedly with respect to the output voltage VO towards the voltage at the second power supply terminal E2 (low voltage) in the course of the output circuit's normal differential amplifier operation which is not under control by the current control circuit 120', the potentials at the nodes N1 and N3 are increased to bring about discharging at the output terminal 2 by the output amplifier stage 110. In addition to this operation of the differential amplifier, when the current I6 of the current source 124 is supplied as a sink current at the node N8, the potential at the node N8 is lowered to increase a gate-to-source voltage of the Nch transistor 143. Hence, the current I5 is supplied as a sink current at the node N4 via the Nch transistor 143 to lower the potential at the node N4. Since the potential at the node N4 is lowered, the gate-to-source voltage of the Nch transistor 155 of the floating current source (154, 155) is increased. This causes the current I6 to be supplied as a sink current via the Nch transistor 155 at the node N2 to increase the input current of the Pch current mirror 130' (drain currents of the Pch transistors 131 and 133). That is, the current I6 is supplied as a sink current at the node N8 in a manner similar to the current I6 being supplied as a sink current at the node N4 of FIG. 11, thus accelerating the discharging operation at the output terminal 2.

It is seen from above that the output circuit of FIG. 12 performs an operation equivalent to that of FIG. 11 and has characteristics equivalent to those of FIG. 11. The output circuits of FIGS. 11 and 12 differ from each other as to sites of coupling of the currents I5, I6 from the current sources 123 and 124 of the current control circuit 120' to input side currents of the current mirrors 130' and 140'. However, both circuits accelerate the operations of charging/discharging the output terminal 2 by the action of increasing the input side current of the current mirror on the opposite side of the current coupling position with respect to the floating current source (154, 155).

<Exemplary Embodiment13>

Figure 13:
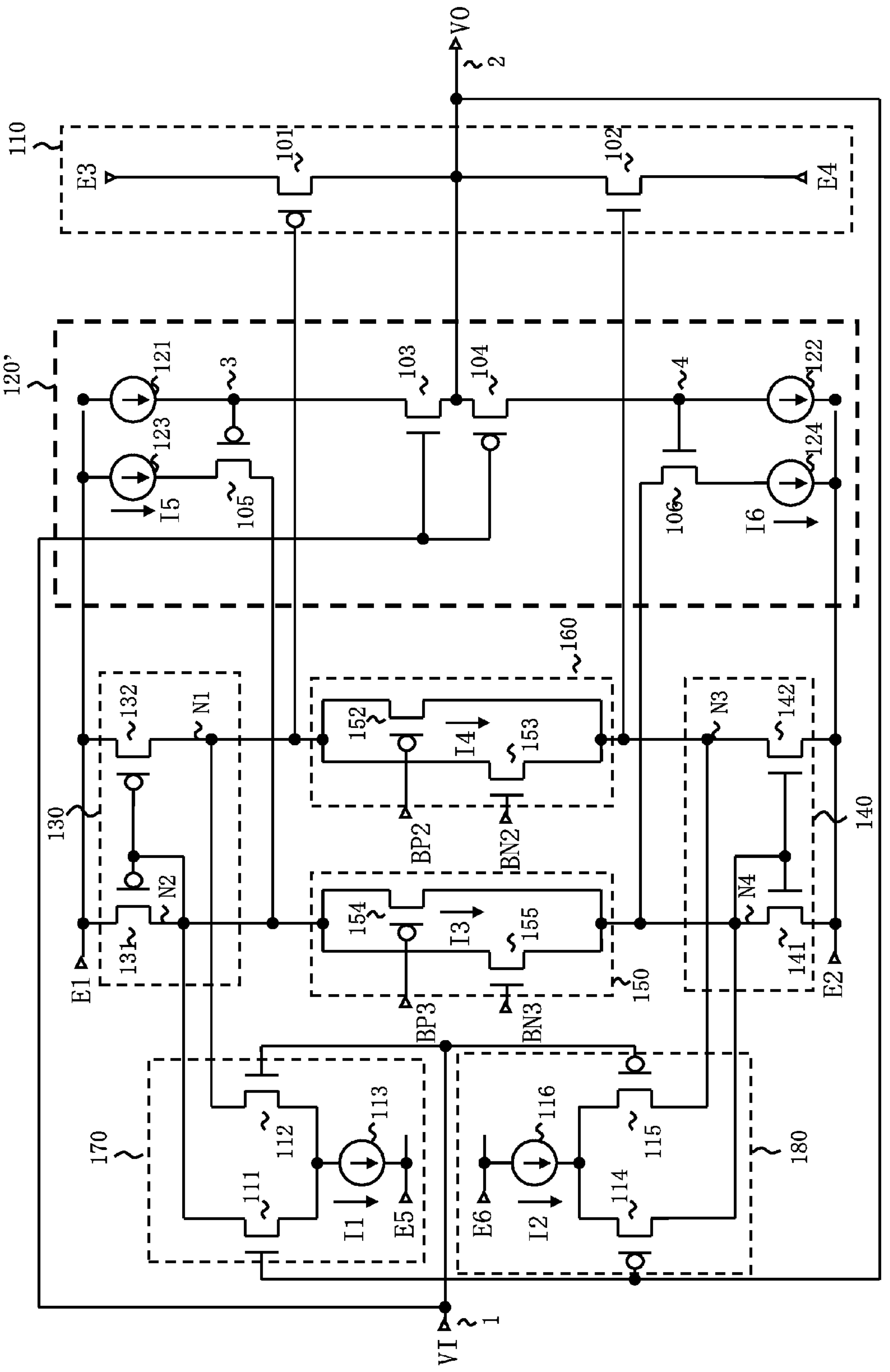
FIG. 13 is a diagram showing the configuration of a thirteenth exemplary embodiment of the present invention.

The following describes Exemplary Embodiment 13 of the present invention. FIG. 13 shows an arrangement of an output circuit of the present Exemplary Embodiment. In FIG. 13, the same reference numerals as those used in FIG. 10 are used to denote corresponding component elements. The output circuit of FIG. 13 corresponds to the output circuit of FIG. 10 in which the input dynamic range is enlarged by addition of a Pch differential stage as a second differential stage 180. It is noted that the output circuit of FIG. 13 also corresponds to the output circuit of FIG. 4 in which the current control circuit 120 of the output circuit of FIG. 4 is replaced by a current control circuit 120'. The second differential stage 180 is similar in configuration and connection to the differential stage 180 of FIG. 4, such that reference may be made to the explanation with reference to FIG. 4.

The output circuit of FIG. 13 is provided with both the Nch differential pair and the Pch differential pair and that is further added by the current control circuit 120'. In contrast to the output circuit of FIG. 10, the output circuit of the present Exemplary Embodiment has no circuit area saving effect brought about by reduction in the number of component elements. However, since the current control circuit 120' is provided, it becomes possible to accelerate the operation of charging/discharging at the output terminal 2. Moreover, as in FIG. 10, the idling current may be suppressed, as the load driving speed is maintained, thereby enabling reduction in static power consumption.

It is noted that the current control circuit 120' of the output circuit of FIG. 13 differs from the control circuit 90 of the related technique of FIG. 25 (transistors 93-1 and 93-2, current sources 91 and 92, transistors 65 and 66 of the differential input stage 50 and auxiliary current sources 53 and 54) as to the destination of connection of the sourcing/sinking of the additive current. The current control circuit 120' of FIG. 13 has input side terminals (nodes N2 and N4) of the current mirrors 130 and 140 as the destination of connection of the additive currents (currents I5 and I6).

<Exemplary Embodiment14>

Figure 14:
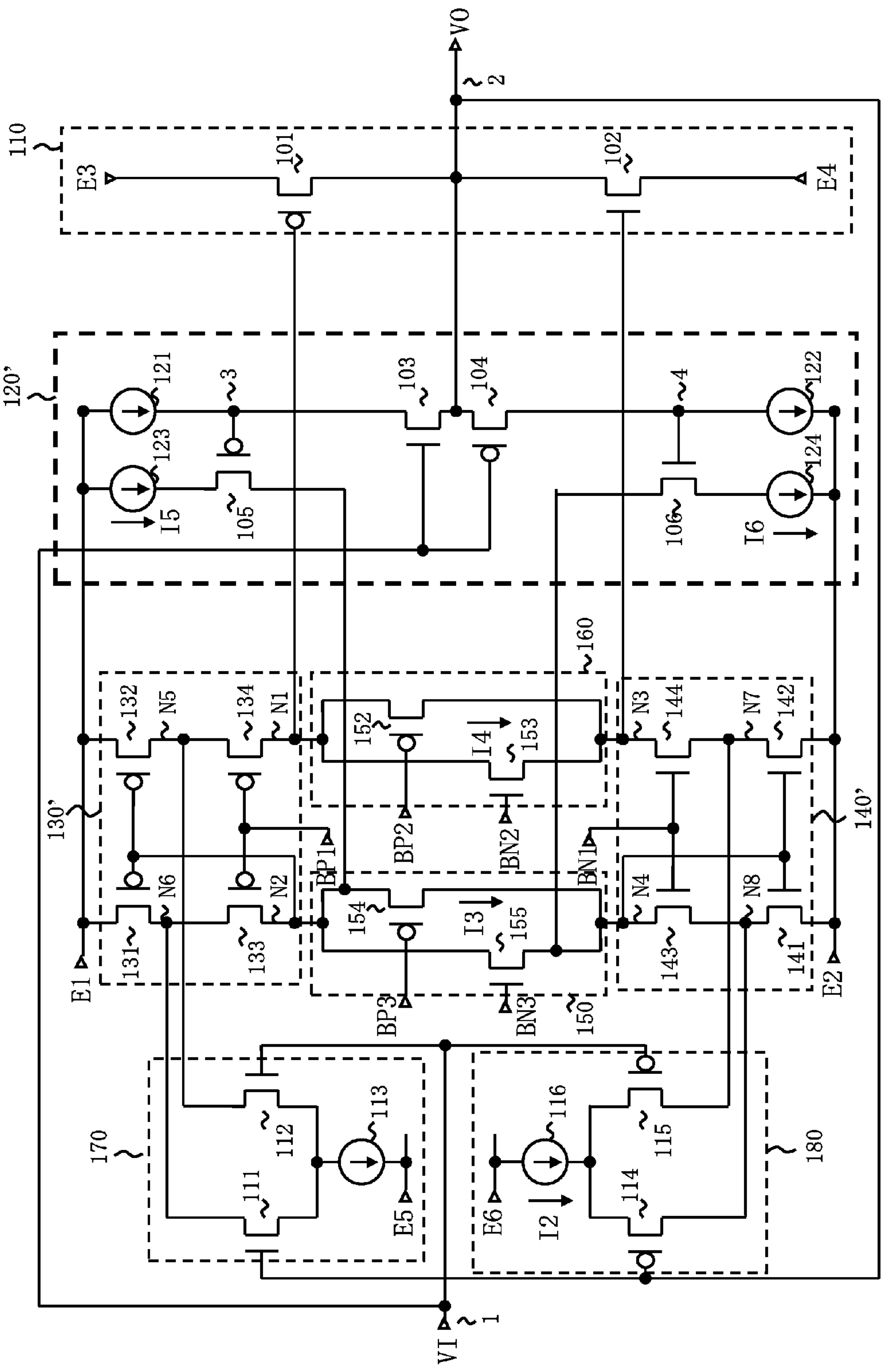
FIG. 14 is a diagram showing the configuration of a fourteenth exemplary embodiment of the present invention.

The following describes Exemplary Embodiment 14 of the present invention. FIG. 14 shows an arrangement of an output circuit of the present Exemplary Embodiment. In FIG. 14, the same reference numerals as those used in FIG. 11 are used to denote corresponding components shown in FIG. 11. The output circuit of FIG. 14 corresponds to the output circuit of FIG. 11 in which the input dynamic range is enlarged by addition of a Pch differential stage as a second differential stage 180. It is noted that the output circuit of FIG. 14 also corresponds to the output circuit of FIG. 11 in which the current control circuit 120 of the output circuit of FIG. 5 is replaced by a current control circuit 120'. The second differential stage 180 is similar in configuration and connection to the differential stage 180 of FIG. 5 such that reference may be made to the explanation with reference to FIG. 5.

The output circuit of FIG. 14 is of such a configuration, in which an output circuit is provided with both the Nch differential pair and the Pch differential pair and which is further added by the current control circuit 120'. As for the configuration other than the current control circuit 120', reference may be made to FIG. 1 of Patent Document 2 (JP Patent Kokai JP-A-06-326529). The output circuit corresponds to the differential amplifier of FIG. 1 of Patent Document 2 and is of a voltage follower configuration having an output terminal connected back in a feedback fashion to an inverting input terminal. In contrast to the output circuit of FIG. 11, the output circuit of FIG. 13 has no circuit area saving effect brought about by reduction in the number of components. However, since the current control circuit 120' is provided, it becomes possible to accelerate the operation of charging/discharging at the output terminal 2. Moreover, as in FIG. 11, the idling current may be suppressed as the load driving speed is maintained, thereby enabling the static power consumption to be decreased. The current control circuit 120' has, as the destination of connection of the additive currents (currents I5 and I6), the input side terminals of the current mirrors 130' and 140' (nodes N2 and N4).

A second differential stage 180 may also be added to the output circuit of FIG. 12 as a modification of Exemplary Embodiment 12 of the present invention. The modification has a performance equivalent to that of the output circuit of FIG. 14.

<Exemplary Embodiment15>

Figure 15:
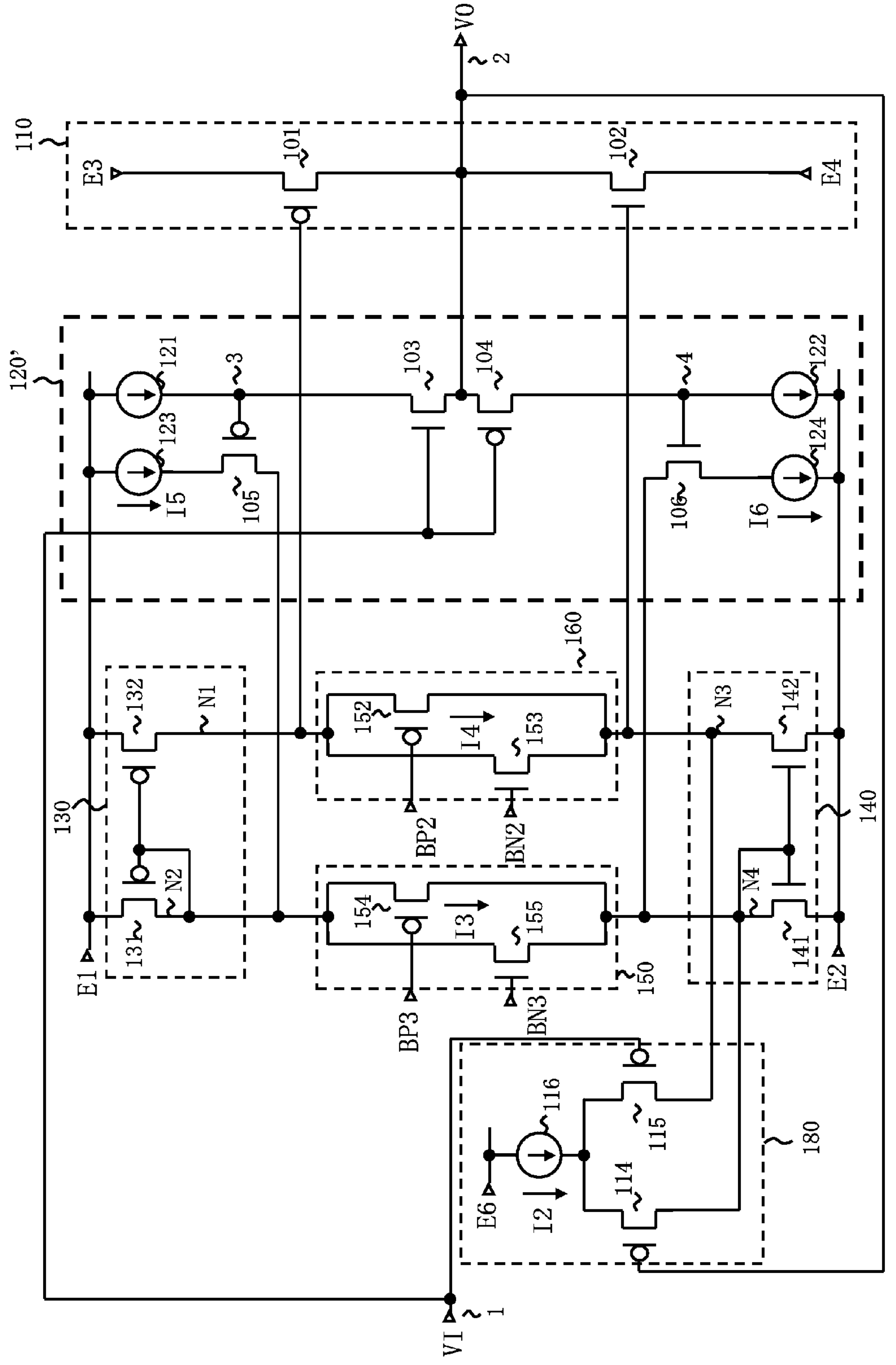
FIG. 15 is a diagram showing the configuration of a fifteenth exemplary embodiment of the present invention.

The following describes Exemplary Embodiment 15 of the present invention. FIG. 15 shows an arrangement of an output circuit of the present Exemplary Embodiment. In FIG. 15, the same reference numerals as those used in FIG. 10 are used to denote corresponding component elements. The output circuit of FIG. 15 corresponds to the output circuit of FIG. 10 in which the first differential stage 170 is replaced by the second differential stage 180. Or, the output circuit of FIG. 15 corresponds to the output circuit of FIG. 6 in which the current control circuit 120 in the output circuit of FIG. 6 is replaced by the current control circuit 120'. The second differential stage 180 is similar in configuration to the differential stage 180 of FIG. 6 such that reference may be made to the explanation with reference to FIG. 6.

In the output circuit of FIG. 15, simply the operation of the differential stage is changed from the operation as the Nch differential pair to the operation as the Pch differential pair, with the operation of the current control circuit 120' being the same as that in FIG. 10. Hence, the present Exemplary Embodiment has performance similar to that of the output circuit of FIG. 10.

The supply voltages at respective power supply terminals in the output circuit of FIG. 15 may be set or changed in the same way as in FIG. 6. For example, the arrangement of FIG. 15 may be used as an output circuit that drives an output range of a negative terminal of an LCD driver of FIG. 23A. For details of setting examples of the power supply voltages, reference may be made to the explanation with reference to FIG. 6.

As a modification of the Exemplary Embodiments 11 and 12 shown in FIGS. 11 and 12, the first differential stage 170 may be replaced by the second differential stage 180 and the conductivity type of the differential pair may be changed.

<Exemplary Embodiment16>

Figure 16:
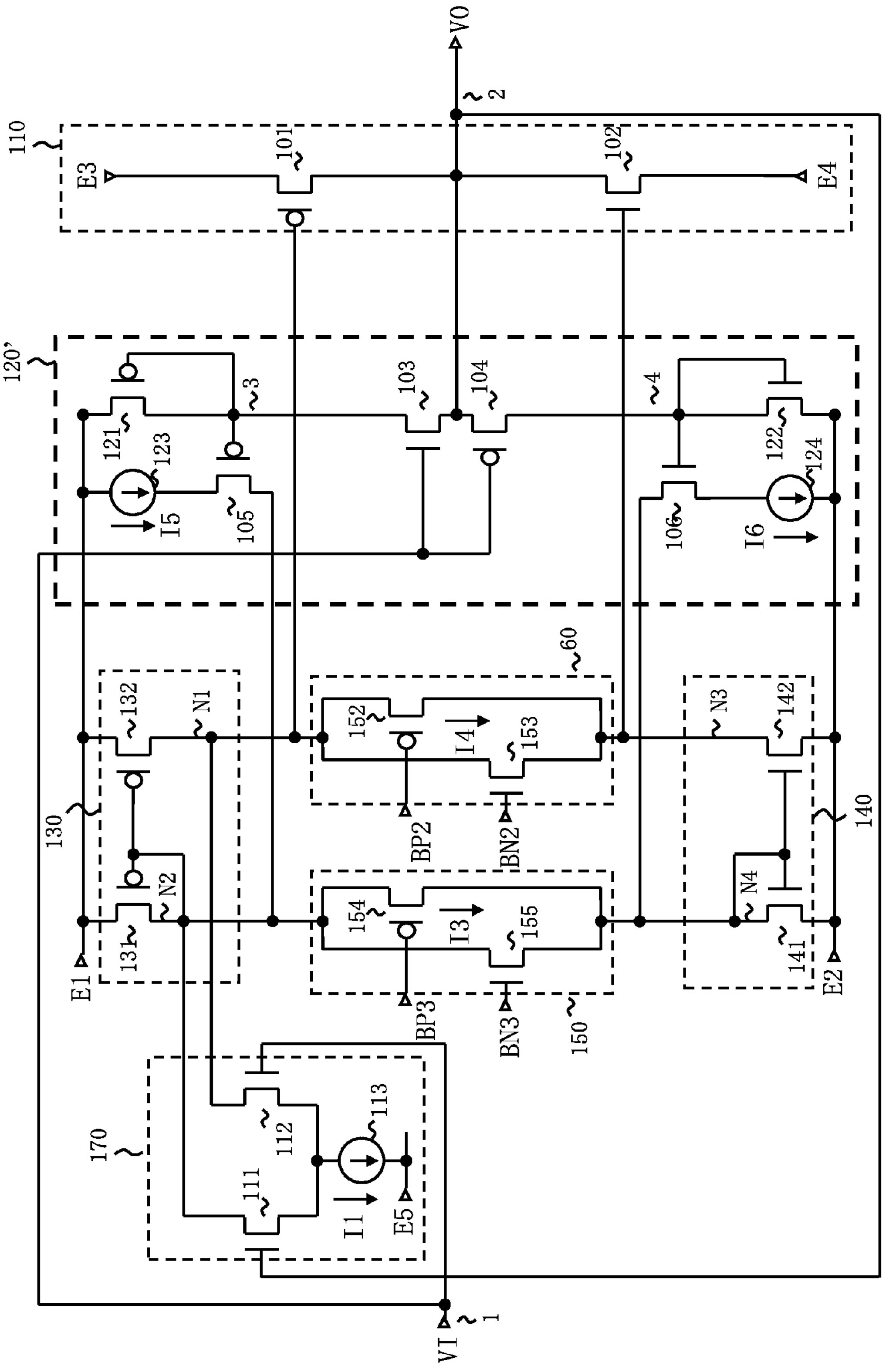
FIG. 16 is a diagram showing the configuration of a sixteenth exemplary embodiment of the present invention.

The following describes Exemplary Embodiment 16 of the present invention. FIG. 16 shows an arrangement of an output circuit of the present Exemplary Embodiment. In FIG. 16, the same reference numerals as those used in FIG. 10 are used to denote corresponding components shown in FIG. 10. The output circuit of FIG. 16 corresponds to the output circuit of FIG. 11 in which the current control circuit 120' has partially been modified. In the current control circuit 120' of FIG. 16, the current source 121 of FIG. 10 is replaced by a diode-connected Pch transistor 121 and the current source 122 is replaced by a diode-connected Nch transistor 122. The output circuit of FIG. 16 also corresponds to the output circuit of FIG. 7 in which the current control circuit 120 is replaced by the current control circuit 120'.

In the current control circuit 120' of FIG. 16, the load element 121 causes a voltage at the gate (connection node 3) of transistor 105 to be changed toward the voltage at the first power supply terminal E1 (high voltage) to halt summation of the current I5 to the input side current of the current mirror 140, when the transistor 103 is turned off. On the other hand, the load element 122 causes the voltage at the gate of transistor 106 (connection node 4) to be changed toward the voltage at the second power supply terminal E2 (low voltage) to halt summation of the current I6 to the input side current of the current mirror 130, when the transistor 104 is turned off.

In the current control circuit 120' of FIG. 10, the load elements 121 and 122 are formed as current sources. However, the load elements may also be formed by diode-connected transistors, as shown in FIG. 16, to implement the similar functions. In such case, the threshold voltages (absolute values) of the diode-connected transistors 121 and 122 are set so as to be smaller than those of the transistors 105 and 106. The load elements 121 and 122 may also be constructed by resistors in a manner not shown.

Such configuration of the current control circuit 120' in which the current sources as load elements 121 and 122 are changed to diode-connected transistors may apply to the current control circuit 120' of the output circuit of FIGS. 10 to 15 as well.

<Exemplary Embodiment17>

Figure 17:
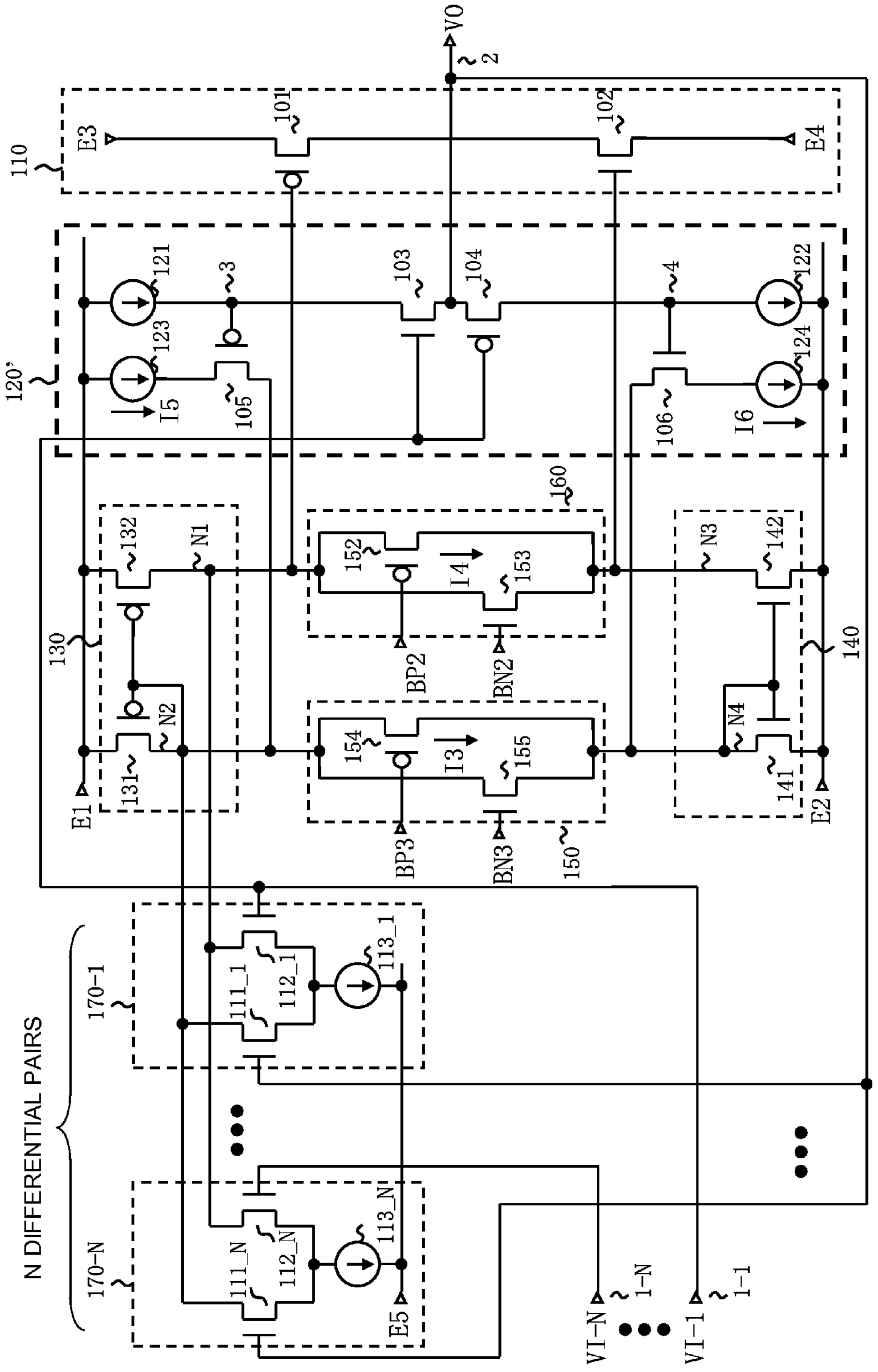
FIG. 17 is a diagram showing the configuration of a seventeenth exemplary embodiment of the present invention.

The following describes Exemplary Embodiment 17 of the present invention. FIG. 17 shows an arrangement of an output circuit of the present Exemplary Embodiment. In FIG. 17, the same reference numerals as those used in FIG. 10 are used to denote corresponding component elements shown in FIG. 10. The output circuit of FIG. 17 corresponds to the output circuit of FIG. 10 in which there are provided a plurality of (an N-number of) differential stages of the same conductivity type (170-1, 170-2, . . . , and 170-N). The output circuit of FIG. 17 also corresponds to the output circuit of FIG. 8 in which the current control circuit 120 is replaced by the current control circuit 120'. The multiple (N-number of) differential stages (170-1, 170-2, . . . , and 170-N) are the same in configuration as those of FIG. 8 such that reference may be made to the explanation with reference to FIG. 8. In the output circuit of FIG. 17, an average voltage of an N-number of input voltages:

$$VO=\{(VI-1)+(VI-2)+\ldots+(VI-N)\}/N$$

may be output as an output voltage VO at the output terminal 2, where VI-1, VI-2, . . . , and VI-N stand for an N-number of input voltages.

In the output circuit of FIG. 17, the current control circuit 120' comes into operation in case a larger voltage difference exists between the input voltage VI-1 and the output voltage VO to accelerate the operation of charging/discharging the output terminal 2. It is noted that the voltage difference between each two of the N-number of input voltages (VI-1), (VI-2), . . . , and (VI-N) is sufficiently smaller than the threshold voltage of each of transistors of the N-number of differential pairs.

Like the output circuit of FIG. 17, each of the output circuits of FIGS. 11 to 16 may be changed to an arrangement including a plurality of differential stages of the same conductivity type.

<Exemplary Embodiment18>

Figure 18:
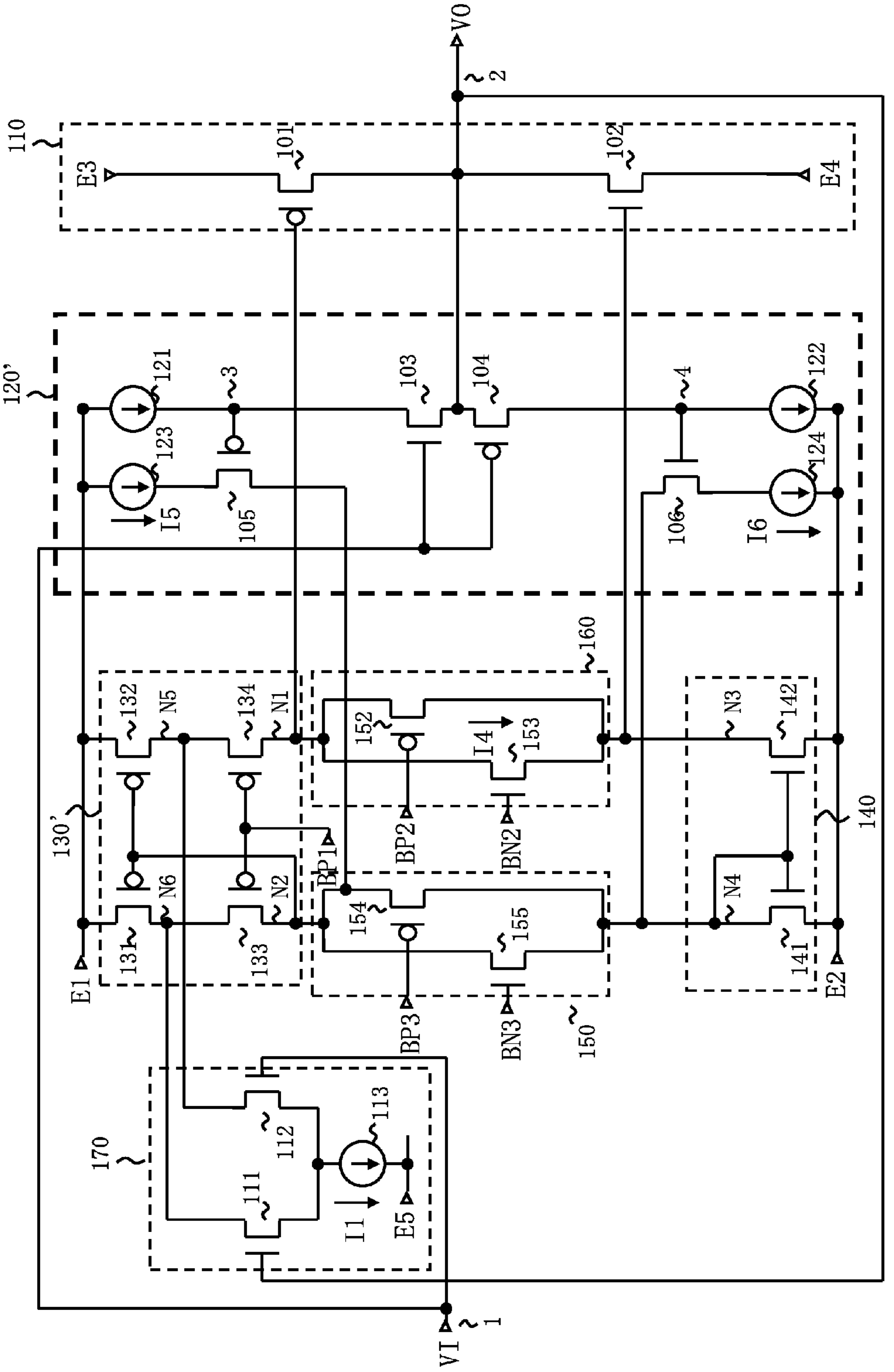
FIG. 18 is a diagram showing the configuration of an eighteenth exemplary embodiment of the present invention.

The following describes Exemplary Embodiment 18 of the present invention. FIG. 18 shows an arrangement of an output circuit of the present Exemplary Embodiment. The output circuit of FIG. 18 corresponds to the output circuit of FIG. 11 in which the Nch current mirror 140' is replaced by an Nch current mirror 140 shown in FIG. 10. The Nch current mirror 140 and the Nch current mirror 140' are similar in operation and may be substituted for each other. It is noted that, in the output circuit of FIG. 12, the Nch current mirror 140' may be replaced by the Nch current mirror 140 of FIG. 10. However, in this case, the current I6 of the current source 124 of the current control circuit 120' is supplied to the node N4. In the output circuit that is provided only with the second differential stage 180 in place of the first differential stage 170 and in which the current mirror is formed by cascoded low voltage current mirrors 130' and 140', the Pch current mirror 130' (FIGS. 11 and 12) may be replaced by the Pch current mirror 130 (FIG. 10).

<Exemplary Embodiment19>

Figure 19:
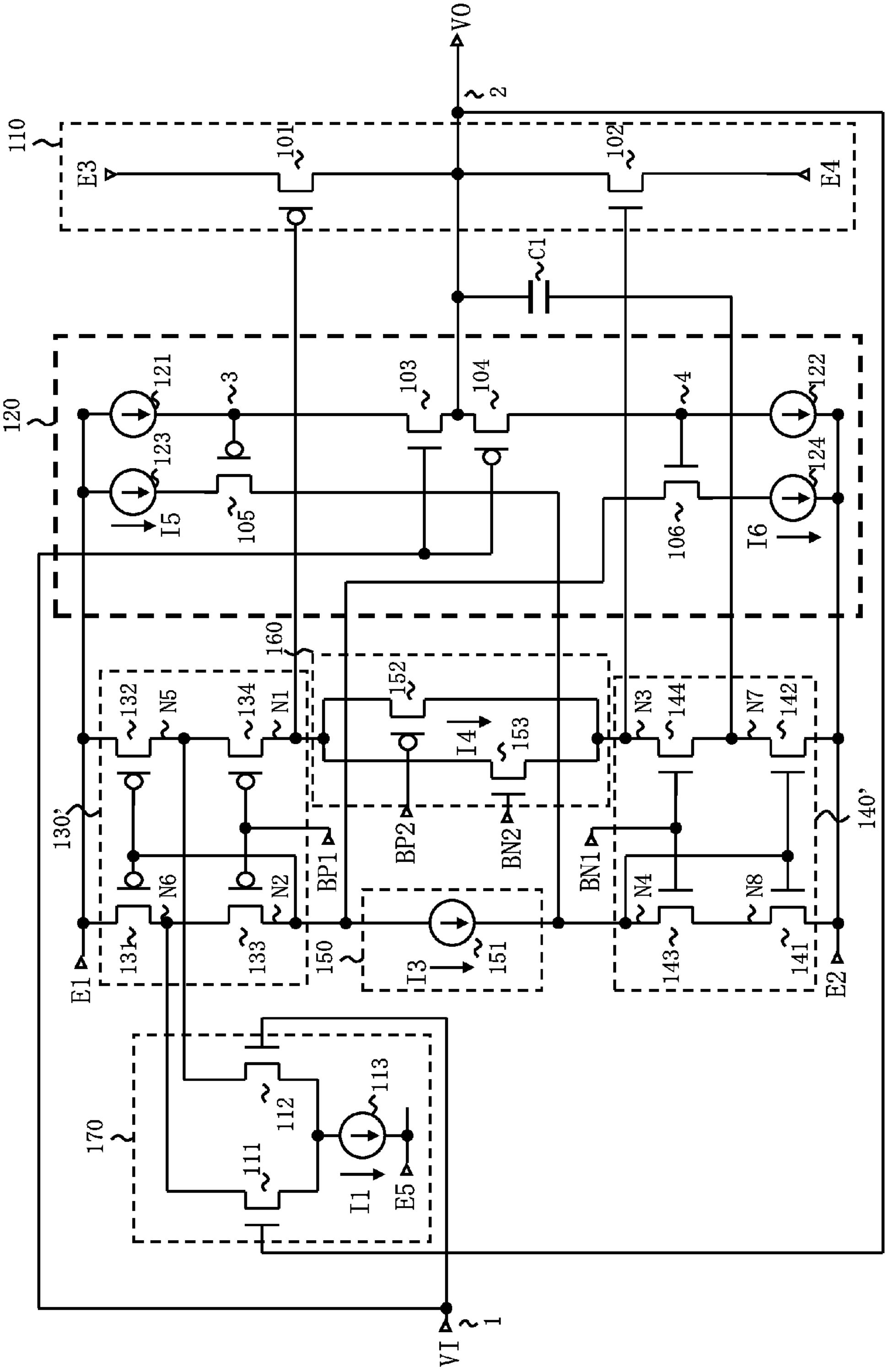
FIG. 19 is a circuit diagram showing a first simulation circuit according to the present invention.
Figure 20:
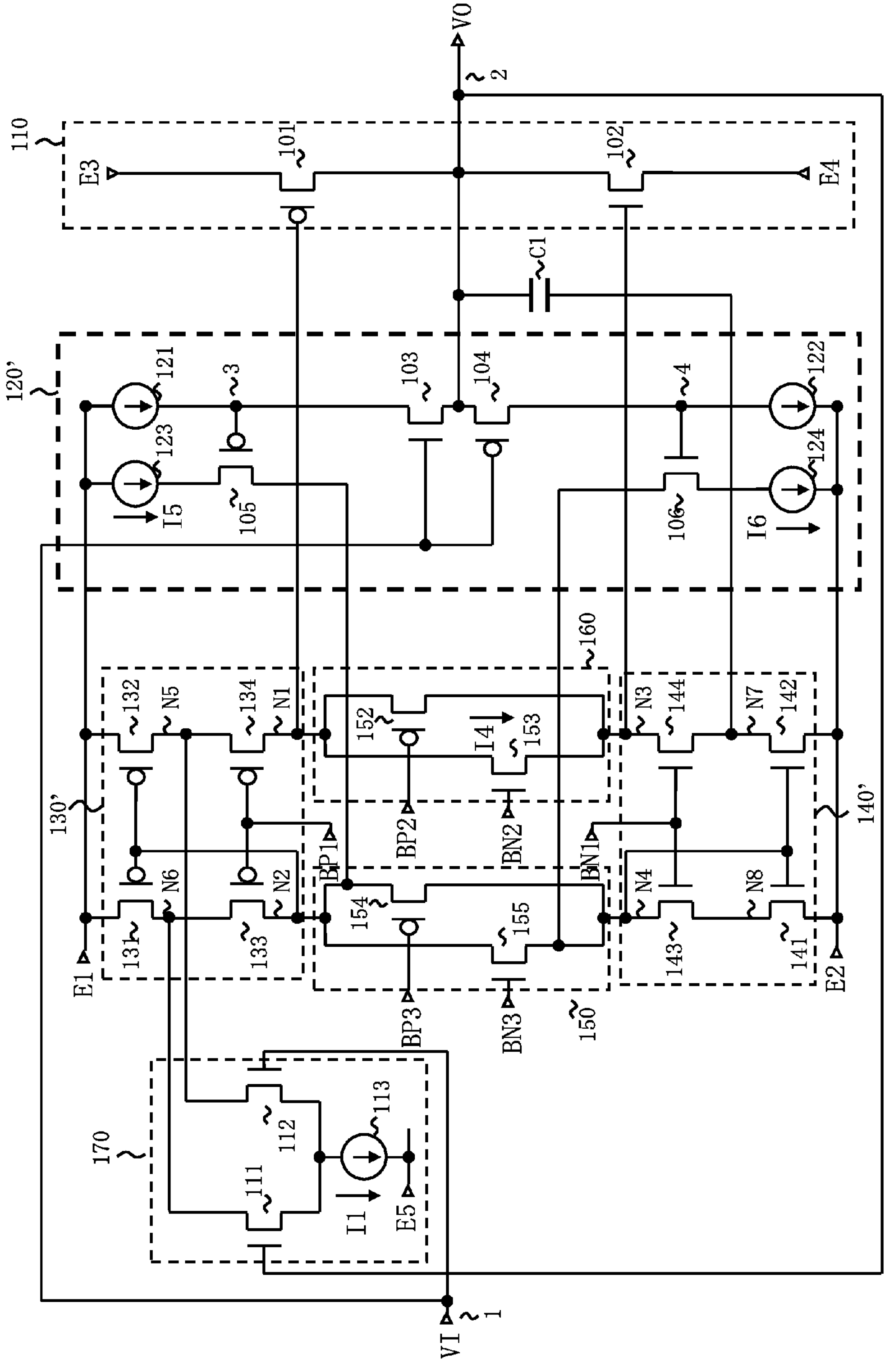
FIG. 20 is a circuit diagram showing a second simulation circuit according to the present invention.

The following describes Exemplary Embodiment 19 of the present invention. In the present Exemplary Embodiment, circuit simulation was carried out on the output circuit according to the present invention. FIGS. 19 and 20 show an arrangement of an output circuit used in the circuit simulation by way of Exemplary Embodiment 19 of the present invention. The arrangements shown in FIGS. 19 and 20 respectively correspond to the output circuits shown in FIGS. 2 and 11, in which a phase compensation capacitance C1 is connected between an output terminal 2 and a connection node (node 7) of Nch transistors 142 and 144 of the Nch current mirror 140'. A load circuit equivalent to a data line is connected to the output terminal 2, in a manner not shown in FIGS. 19 and 20. It is noted that the circuit simulation was carried out in a state the load circuit is connected in place.

Figure 21:
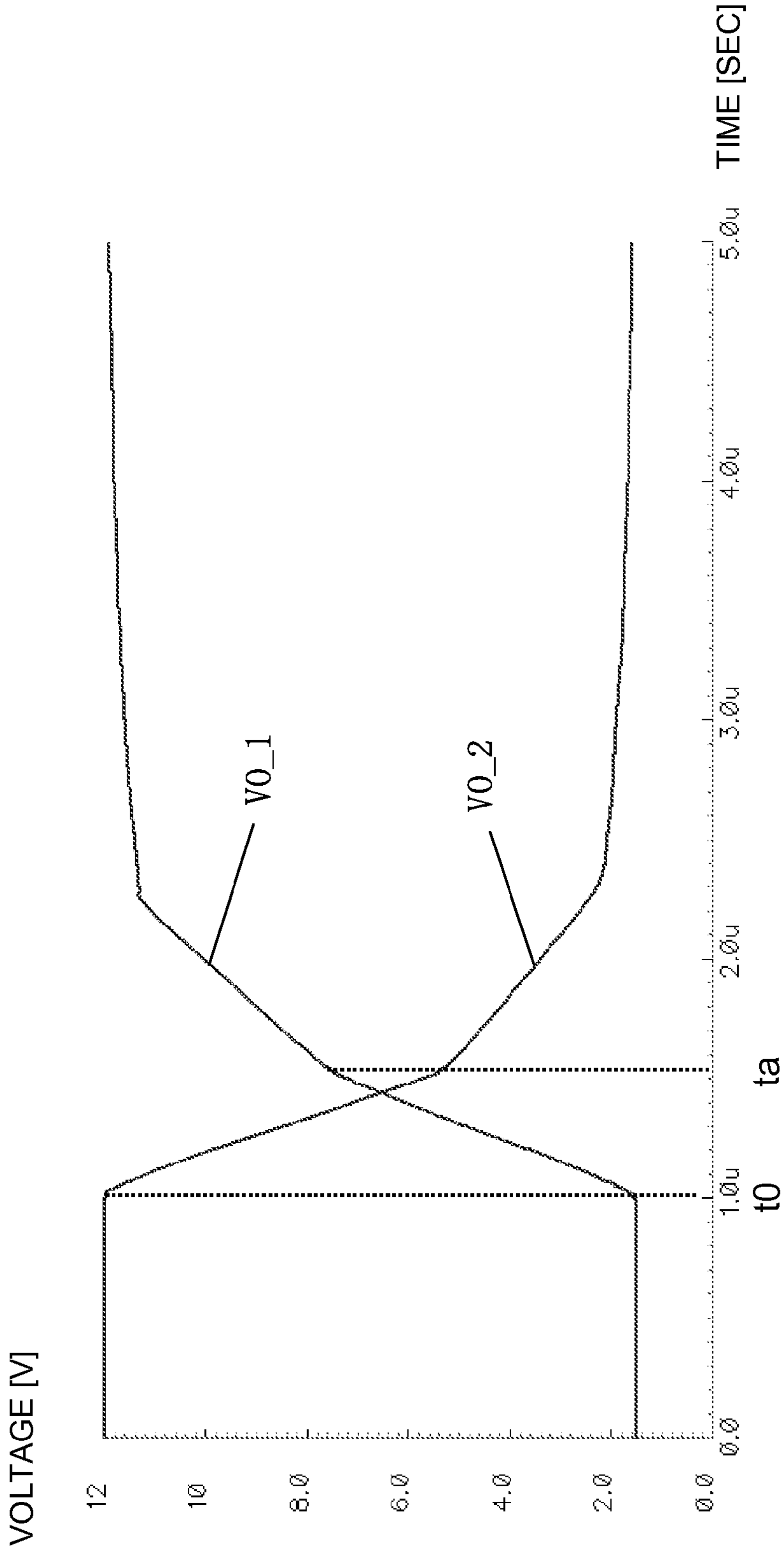
FIG. 21 is a graph showing waveforms obtained with simulation circuits of FIGS. 19 and 20.

FIG. 21 shows the result of simulation of the output waveform diagram (result of transient analysis) of the output waveform diagram of the output terminal 2 in the output circuit of FIG. 19. The power supply voltage at each of the first and third power supply terminals E1, E3 is set at 13.5V, while that of each of the second, fourth and fifth power supply terminals E2, E4 and E5 is set at 0V. Although the input voltage VI is not shown, it is a 1.5V-12V step signal. It jumps at time t0 from 1.5V to 12V or from 12V to 1.5V.

In FIG. 21, an output waveform VO_1 corresponds to a change (rising) from 1.5V to 12V of an input voltage VI, whilst an output waveform VO_2 corresponds to a change (falling) from 12V to 1.5V of the input voltage VI.

Since the current control circuit 120 is set into operation, during a time interval of from timing t0 to timing ta, voltage changes of both the output waveforms VO_1 and VO_2 are accelerated, which account for an increased tilt of the output waveform. From timing ta on, the operation of the current control circuit 120 halts, and hence the output circuit operates as the normal differential amplifier operation. It is noted that the voltage range within which the current control circuit 120 is in operation against the amplitudes of the output waveforms VO_1 and VO_2 (range of voltage variations within time interval t0-ta) mainly depends upon the magnitude of the threshold voltage inclusive of the substrate bias effect of the transistors 103, 104 of the current control circuit 120. If the threshold voltage inclusive of each substrate bias effect of the transistors 103 and 104 is decreased, the voltage range of operation of the current control circuit 120 is enlarged to increase the time interval of acceleration of voltage changes.

The output waveforms VO_1 and VO_2 of FIG. 21 certify the acceleration effect of the charging/discharging at the output terminal 2 by the current control circuit 120 of FIG. 19. Turning to the result of simulation (result of transient analysis) of the diagram of the output waveform at the output terminal 2 in the output circuit of FIG. 20, waveforms substantially equivalent to VO_1 and VO_2 (output waveform of FIG. 21) are obtained by adjusting the currents I5 and I6 of the current control circuit 120'. Hence, the acceleration effect of the charging/discharging at the output terminal 2 by the current control circuit 120' of FIG. 20 could also be certified.

It could also be certified that, even with a configuration in which a differential stage is formed to the single conductivity type and connection of the phase compensation capacitance C1 is non-symmetrical, waveform symmetry may be obtained at the time of charging/discharging at the output terminal 2.

<Exemplary Embodiment20>

Figure 22:
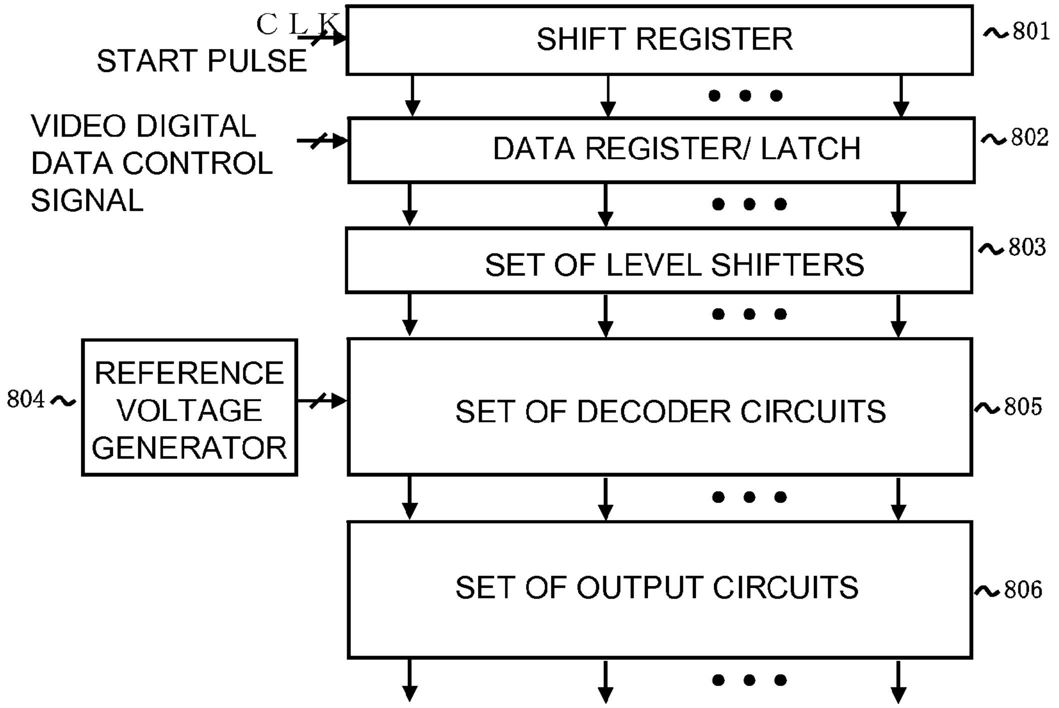
FIG. 22 is a diagrammatic view showing the configuration of a data driver including an output circuit of the present invention.
Figure 24A:
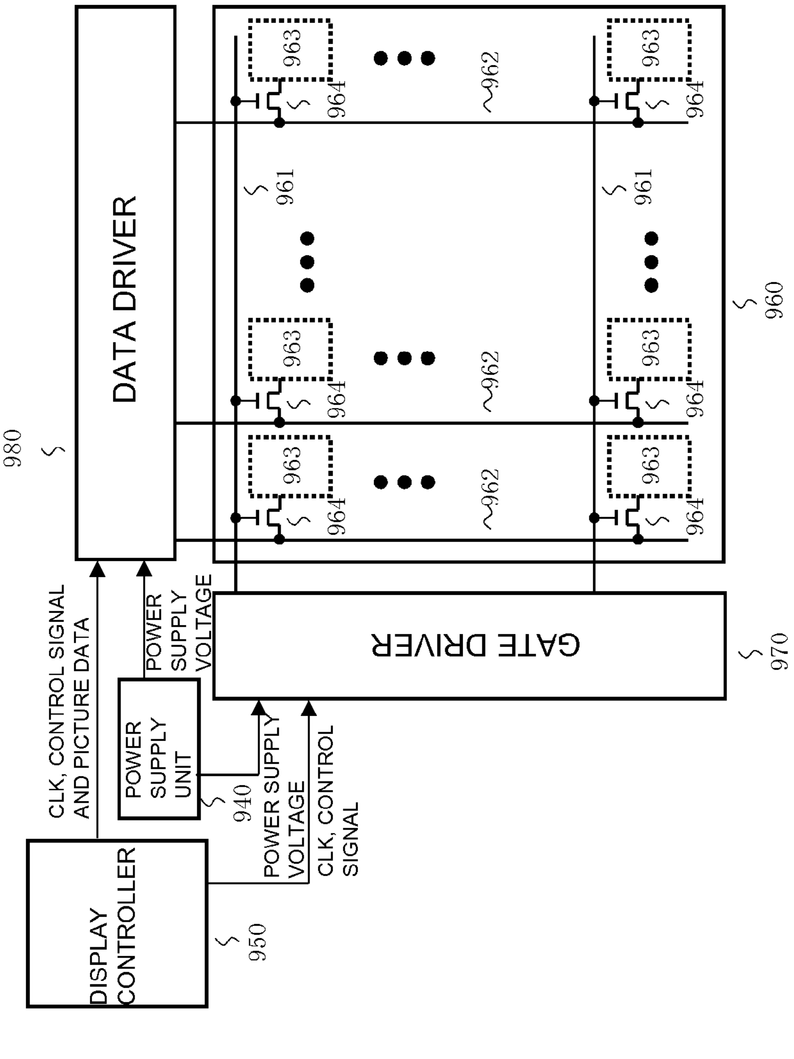
FIG. 24A RELATED ART
FIG. 24A is a circuit diagram showing a display device.
Figure 24B:
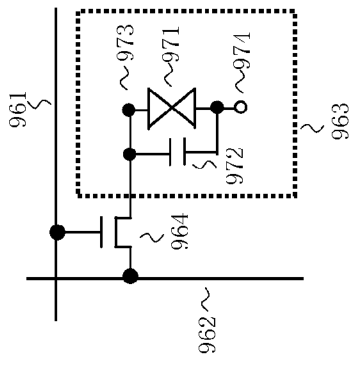
FIG. 24B RELATED ART
FIGS. 24B and 24C are circuit diagrams showing a pixel for LCD and OLED, respectively.
Figure 24C:
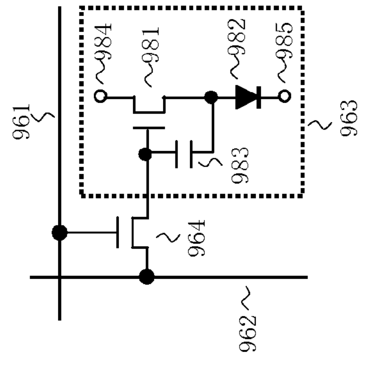
FIG. 24C RELATED ART

FIG. 22 shows, in a block diagram, the configuration of essential portions of a data driver of a display of Exemplary Embodiment 20 of the present invention. The data driver shown in FIG. 22 corresponds to a data driver 980 of FIG. 24A. Referring to FIG. 22, the data driver includes a shift register 801, a data register/latch 802, a set of level shift circuits (level shifter set) 803, a reference voltage generator 804, a set of decoders 805 and a set of output circuits 806.

Each circuit of the set of output circuits 806 may be an output circuit of any of the above Exemplary Embodiments described with reference to FIGS. 1 to 21. The set of output circuits 806 includes a plurality of output circuits corresponding to the number of outputs.

The shift register 801 decides on the data latch timing based on a start pulse and a clock signal CLK. The data register/latch 802 expands input digital video data into digital data signals, each corresponding to an output unit, based on the timing as decided on by the shift register 801, and latches digital data signals corresponding to a preset number of output units. Latches digital data signals are supplied to the level shifter set 803 in response to a control signal. The level shifter set 803 performs level-conversion of digital data signals output from the data register/latch 802, on a per output basis, from a low amplitude signal into a high amplitude signal. The level shifter set 803 then outputs the level-converted signals. The set of decoders 805 selects, from the set of the reference voltages, generated by the reference voltage generator 804, a reference signal in accordance with the level-converted digital data signals. The set of output circuits 806 receives one or more reference voltage(s) selected by an associated decoder of the set of decoders 805, and amplifies a gray-scale voltage signal associated with the reference voltage to output the so amplified voltage signal. A set of output terminals of the set of output circuits 806 is connected to a data line of a display device. The shift register 801 and the data register/latch 802 are logic circuits of lower voltages (say 0V to 3.3V) fed with corresponding power supply voltages. The level shifter set 803, set of decoders 805 and the set of output circuits 806 are associated with high voltages necessary to drive display elements, say 0V (VSS) to 18V (VDD), and are supplied with corresponding power supply voltages.

The output circuits of the Exemplary Embodiments described with reference to FIGS. 1 to 21 accelerate charging/discharging at data lines connected to an output terminal of the output circuit, and may help implement waveform symmetry at the time of charging/discharging. In addition, the output circuits may contribute to reduction of circuit area and power consumption. Hence, each of the output circuits are optimum for use as an output circuit of the set of output circuits 806 of the data driver of the display device.

With the present Exemplary Embodiment, it is possible to implement a data driver and a display device that may be driven at a high speed with low power consumption.

The disclosure of the above mentioned Patent Documents is incorporated by reference herein. The particular exemplary embodiments or examples may be modified or adjusted within the gamut of the entire disclosure of the present invention, inclusive of Claims and Exemplary Embodiments of Execution, based on the fundamental technical concept of the invention. For example, the current sources used in the present invention may be transistors having sources fed with preset power supply voltages and having gates fed with preset bias voltages. Further, variegated combinations or selection of elements disclosed herein may be made within the framework of the Claims and the Exemplary Embodiments of Execution. That is, the present invention may encompass various modifications or corrections that may occur to those skilled in the art in accordance with and within the gamut of the entire disclosure of the present invention, inclusive of Exemplary Embodiment of Execution and the technical concept of the present invention.

All or part of the above described exemplary embodiments may be summarized as in supplementary notes as below, though not limited thereto. It is noted that Supplementary notes 1 to 20 corresponds to claims 1 to 20 of JP Patent Application No. 2010-130848 (Modes 31 to 50), and Supplementary notes 21 to 40 corresponds to claims 1 to 20 of JP Patent Application No. 2010-130849 (Modes 51 to 70).

(Supplementary Note 1)

An output circuit comprising: a differential input stage, an output amplifier stage, a current control circuit, an input terminal, an output terminal and first to fourth power supply terminals; wherein the differential input stage includes a first differential pair including a pair of transistors, the pair of transistors differentially receiving an input voltage at the input terminal and an output voltage at the output terminal;

a first current source that drives the first differential pair;

a first current mirror that is connected between the first power supply terminal and first and second nodes and that includes a pair of transistors of a first conductivity type receiving a pair of output currents of the first differential pair;

a second current mirror including a pair of transistors of a second conductivity type, the second current mirror being connected between the second power supply terminal and third and fourth nodes;

a first floating current source circuit connected between the second node, to which an input of the first current mirror is connected, and the fourth node, to which an input of the second current mirror is connected;

a second floating current source circuit connected between the first node, to which an output of the first current mirror is connected, and the third node, to which an output of the second current mirror is connected;

the output amplifier stage including a first transistor of the first conductivity type connected between the third power supply terminal and the output terminal, a control terminal of the first transistor being connected to the first node; and a second transistor of the second conductivity type connected between the fourth power supply terminal and the output terminal, a control terminal of the second transistor being connected to the third node;

the current control circuit including at least one out of a first circuit and a second circuit, the first circuit including a second current source connected to the first power supply terminal, the first circuit performing control of switching between activating the second current source to couple the current from the second current source to one out of a current input to the first floating current source circuit and a current output from the first floating current source circuit, and deactivating the second current source, depending on whether or not a voltage difference between the output voltage of the output terminal and a voltage at the first power supply terminal is greater on comparison by more than a predetermined first preset value than a voltage difference between the input voltage at the input terminal and the voltage at the first power supply terminal, and wherein the second circuit includes a third current source connected to the second current mirror, the second circuit performing control of switching between activating the third current source to couple the current from the third current source to the other of a current input to the first floating current source circuit and a current output from first floating current source circuit, and deactivating the third current source, depending on whether or not a voltage difference between the output voltage of the output terminal and a voltage at the second power supply terminal is greater on comparison by more than a predetermined second preset value than a voltage difference between the input voltage at the input terminal and a voltage at the second power supply terminal.

(Supplementary Note 2)

The output circuit according to Supplementary note 1, wherein in the current control circuit, the first circuit includes the second current source connected between the first power supply terminal and the second current mirror, and the first circuit exercises control of switching between activating the second current source to couple the current from the second current source to an input current of the second current mirror, and deactivating the second current source, depending on whether or not the voltage difference between an output voltage at the output terminal and a voltage at the first power supply terminal is greater on comparison by more than a first preset value than a voltage difference between an input voltage at the input terminal and the voltage at the first power supply terminal, and wherein the second circuit includes the third current source connected between the second power supply terminal and the first current mirror, and the second circuit exercises control of switching between activating the third current source to couple the current from the third current source to an input current of the first current mirror, and deactivating the third current source, depending on whether or not a voltage difference between the output voltage at the output terminal and the voltage at the second power supply terminal is greater on comparison by more than a second preset value than a voltage difference between the input voltage at the input terminal and the voltage at the second power supply terminal.

(Supplementary Note 3)

The output circuit according to Supplementary note 2, wherein in the current control circuit, the first circuit includes a first switch and the second current source connected in series between the first power supply terminal and a preset node on the input side of the second current source, the first switch being respectively set on or off, depending on whether or not a voltage difference between the output voltage and the voltage at the first power supply terminal is greater on comparison by more than the first preset value than a voltage difference between the input voltage and the voltage at the first power supply terminal;

the second circuit includes a second switch and the third current source connected in series between the second power supply terminal and a preset node on the input side of the first current mirror, the second switch being respectively set on or off, depending on whether or not a voltage difference between the output voltage and the voltage at the second power supply terminal is greater on comparison by more than the second preset value than the voltage difference between the input voltage and the voltage at the second power supply terminal.

(Supplementary Note 4)

The output circuit according to Supplementary note 2, wherein the first circuit includes:

a first load element and the second current source having one ends connected in common to the first power supply terminal;

a third transistor of a second conductivity type having a first terminal connected to the output terminal, having a second terminal connected to the other end of the first load element, and having a control terminal connected to the input terminal; and a fourth transistor of a first conductivity type having a first terminal connected to the other end of the second current source, having a second terminal connected to a preset node on an input side of the second current mirror, and having a control terminal connected to a connection node between the other end of the first load element and a second terminal of the third transistor, wherein the second circuit includes:

a second load element and the third current source having one ends connected in common to the second power supply terminal;

a fifth transistor of a first conductivity type having a first terminal connected to the output terminal, having a second terminal connected to the other end of the second load element, and having a control terminal connected to the input terminal; and a sixth transistor of a second conductivity type having a first terminal connected to the other end of the third current source, having a second terminal connected to a preset node on the input side of the first current mirror, and having a control terminal connected to a connection node between the other end of the second load element and the second terminal of the fifth transistor.

(Supplementary Note 5)

The output circuit according to any one of Supplementary notes 1 to 4, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node and having control terminals connected together, the second terminal of one of the second stage pair of transistors of the first conductivity type, that is connected to the second node, being connected to the control terminals of the first stage pair of transistors of the first conductivity type, a pair of outputs of the first differential pair being respectively connected to a pair of connection nodes between the first stage pair of transistors of the first conductivity type and the second stage pair of transistors of the first conductivity type.

(Supplementary Note 6)

The output circuit according to any one of Supplementary notes 1 to 5, wherein the second current mirror includes, as the pair transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, that is connected to the fourth node, being connected to the control terminals of the first stage pair of transistors of the second conductivity type.

(Supplementary Note 7)

The output circuit according to any one of Supplementary notes 1 to 4, wherein the differential input stage further includes a second differential pair of the opposite conductivity type to that of the first differential pair, the second differential pair having a pair of inputs connected in common to a pair of inputs of the first differential pair and having a pair of outputs connected to preset nodes on input and output sides of the second current mirror; and a fourth current source that drives the second differential pair.

(Supplementary Note 8)

The output circuit according to Supplementary note 7, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node, and having control terminals connected together, the second terminal of one of the second stage pair of transistors of the first conductivity type, that is connected to the second node, being connected to the control terminals of the first stage pair of transistors of the first conductivity type, a pair of outputs of the first differential pair being connected respectively to a pair of connection nodes between the first stage pair of transistors of the first conductivity type and the second stage pair of transistors of the first conductivity type, wherein the second current mirror includes, as transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, that is connected to the fourth node, being connected the control terminals of the first stage pair of transistors of the second conductivity type, the pair of outputs of the second differential pair being connected respectively to a pair of connection nodes between the first stage pair of transistors of the second conductivity type and second stage pair of transistors of the second conductivity type.

(Supplementary Note 9)

The output circuit according to any one of Supplementary notes 4 to 8, wherein the second terminal of the fourth transistor of the first conductivity type is connected to the fourth node, to which an input of the second current mirror is connected;

the second terminal of the sixth transistor of the second conductivity type being connected to the second node, to which an input of the first current mirror is connected.

(Supplementary Note 10)

The output circuit according to Supplementary note 6 or 8, wherein the second terminal of the fourth transistor of the first conductivity type is connected to a first terminal of one of the second stage pair of transistors of the second conductivity type connected to the fourth node.

(Supplementary Note 11)

The output circuit according to Supplementary note 5 or 8, wherein the second terminal of the sixth transistor of the second conductivity type is connected to a first terminal of one of the second stage pair of transistors of the first conductivity type connected to the second node.

(Supplementary Note 12)

The output circuit according to Supplementary note 1 or 2, wherein the first floating current source circuit includes a current source; and wherein the second floating current source circuit includes:

a third transistor of the first conductivity type that is connected between the first node and the third node and that has a control terminal supplied with a first bias voltage; and a fourth transistor of the second conductivity type that is connected between the first node and the third node and that has a control terminal supplied with a second bias voltage.

(Supplementary Note 13)

The output circuit according to Supplementary note 1, wherein in the current control circuit, the first circuit includes the second current source connected between the first power supply terminal and the first current mirror, and the first circuit exercises control of switching between activating the second current source to couple the current from the second current source to the current on an input side of the first current mirror, and deactivating the second current source, depending on whether or not a voltage difference between the output voltage of the output terminal and a voltage at the first power supply terminal is greater on comparison by more than a preset first value than a voltage difference between the input voltage at the input terminal and the voltage at the first power supply terminal, and wherein the second circuit includes the third current source connected between the second power supply terminal and the second current mirror, and the second circuit exercises control of switching between activating the third current source to couple the current from the third current source to the current on an input side of the second current mirror, and deactivating the third current source, depending on whether or not a voltage difference between the output voltage of the output terminal and a voltage at the second power supply terminal is greater on comparison by more than a preset second value than a voltage difference between the input voltage at the input terminal and the voltage at the second power supply terminal.

(Supplementary Note 14)

The output circuit according to Supplementary note 13, wherein in the current control circuit, the first circuit includes a first switch and the second current source connected in series between the first power supply terminal and a preset node on the input side of the first current mirror, the first switch being respectively set on or off, depending on whether or not a voltage difference between the output voltage and the voltage at the first power supply terminal is greater on comparison than a voltage difference between the input voltage and the voltage at the first power supply terminal by a value more than said preset first value, wherein the second circuit includes a second switch and the third current source connected in series between the second power supply terminal and a preset node on the input side of the second current mirror, the second switch being respectively set on or off depending on whether or not a voltage difference between the output voltage and the voltage at the second power supply terminal is greater on comparison than a voltage difference between the input voltage and the voltage at the second power supply terminal by a value more than the second preset value.

(Supplementary Note 15)

The output circuit according to Supplementary note 13, wherein in the current control circuit, the first circuit includes:

a first load element and the second current source having one ends connected in common to the first power supply terminal;

a third transistor of a second conductivity type having a first terminal connected to the output terminal, a second terminal connected to the other end of the first load element and a control terminal connected to the input terminal; and a fourth transistor of a first conductivity type having a first terminal connected to the other end of the second current source, a second terminal connected to a preset node on an input side of the first current mirror and a control terminal connected to a connection node between the other end of the first load element and the second terminal of the third transistor, wherein the second circuit includes:

a second load element and the third current source having one ends connected in common to the second power supply terminal;

a fifth transistor of a first conductivity type having a first terminal connected to the output terminal, having a second terminal connected to the other end of the second load element and having a control terminal connected to the input terminal; and a sixth transistor of a second conductivity type having a first terminal connected to the other end of the third current source, having a second terminal connected to a preset node on the input side of the second current mirror, and having a control terminal connected to a connection node between the other end of the second load element and the second terminal of the fifth transistor.

(Supplementary Note 16)

The output circuit according to any one of Supplementary notes 13 to 15, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected respectively to the first node and the second node, and having control terminals connected together, the second terminal of one of the second stage pair of transistors of the first conductivity type, that is connected to the second node, being connected to the control terminals of the first stage pair of transistors of the first conductivity type, a pair of outputs of the first differential pair being connected to a pair of connection nodes between the first stage pair of transistors of the first conductivity type and the second stage pair of transistors of the first conductivity type.

(Supplementary Note 17)

The output circuit according to any one of Supplementary notes 13 to 16, wherein the second current mirror includes, as the pair transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together;

the second terminal of one of the second stage pair of transistors of the second conductivity type, that is connected to the fourth node, being connected the control terminals of the first stage pair of transistors of the second conductivity type.

(Supplementary Note 18)

The output circuit according to any one of Supplementary notes 13 to 15, wherein the differential input stage further includes a second differential pair that includes a pair of transistors of a conductivity type opposite to a conductivity type of the first differential pair having pair inputs connected in common to a pair of inputs of the first differential pair and having a pair of outputs connected to preset nodes on input and output sides of the second current mirror; and a fourth current source that drives the second differential pair.

(Supplementary Note 19)

The output circuit according to Supplementary note 18, wherein the first current mirror includes, as the pair of transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node and having control terminals connected together;

the second terminal of one of the second stage pair of transistors of the first conductivity type, that is connected to the second node, being connected to the control terminals of the first stage pair of transistors of the first conductivity type, a pair of outputs of the first differential pair being connected respectively to a pair of connection nodes between the first stage pair of transistors and the second stage pair of transistors of the first conductivity type, wherein the second current mirror includes, as the pair of transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, that is connected to the fourth node, being connected the control terminals of the first stage pair of transistors of the second conductivity type, the pair of outputs of the second differential pair being connected to a pair of connection nodes between the first stage pair of transistors of the second conductivity type and the second stage pair of transistors of the second conductivity type.

(Supplementary Note 20)

The output circuit according to any one of Supplementary notes 15 to 19, wherein the second terminal of the fourth transistor of the first conductivity type is connected to the second node, to which an input of the first current mirror is connected, the second terminal of the sixth transistor of the second conductivity type being connected to the fourth node, to which an input of the second current mirror is connected.

(Supplementary Note 21)

The output circuit according to Supplementary note 16 or 19, wherein the second terminal of the fourth transistor of the first conductivity type is connected to the first terminal of one of the second stage pair of transistors of the first conductivity type connected to the second node.

(Supplementary Note 22)

The output circuit according to Supplementary note 17 or 19, wherein the second terminal of the sixth transistor of the second conductivity type is connected to the first terminal of one of the second stage pair of transistors of the second conductivity type connected to the fourth node.

(Supplementary Note 23)

The output circuit according to Supplementary note 4 or 14, wherein each of the first and second load elements includes a current source.

(Supplementary Note 24)

The output circuit according to Supplementary note 4 or 14, wherein each of the first and second load elements includes a diode.

(Supplementary Note 25)

The output circuit according to Supplementary note 4 or 14, wherein each of the first and second load elements includes a resistance element.

(Supplementary Note 26)

The output circuit according to Supplementary note 4 or 14, further comprising:

in addition to the input terminal, (N-1) additional input terminals, N being an integer not less than 2, the differential input stage including, in addition to the first differential pair and the first current source, (N-1) differential pairs of the same conductivity type as the first differential pair, the (N-1) differential pairs having pair outputs connected in common to the pair outputs of the first differential pair; and (N-1) current sources that respectively drive the (N-1) differential pairs, one input of pair inputs of the first differential pair being connected to the input terminal, one inputs of pair inputs of the (N-1) differential pairs being connected to the N-1 input terminals, the other inputs of the pair inputs of the (N-1) differential pairs being connected in common to the output terminal along with the other input of the pair inputs of the first differential pair.

(Supplementary Note 27)

The output circuit according to any one of Supplementary notes 1, 2, 7, 13, 15, 18 and 26, wherein the pair of transistors of the first differential pair are of the first conductivity type.

(Supplementary Note 28)

The output circuit according to any one of Supplementary notes 1, 2, 7, 13, 15, 18 and 26, wherein the pair of transistors of the first differential pair are of the second conductivity type.

(Supplementary Note 29)

The output circuit according to Supplementary note 13 or 15, wherein the first floating current source circuit includes:

a seventh transistor of a first conductivity type; and an eighth transistor of a second conductivity type, connected in parallel with each other between the second node and the fourth node, the seventh transistor of the first conductivity type having a control terminal supplied with a first bias voltage, the eighth transistor of the second conductivity type having a control terminal supplied with a second bias voltage, wherein the second floating current source circuit includes:

a ninth transistor of the first conductivity type; and a tenth transistor of the second conductivity type, connected in parallel with each other between the first node and the third node, the ninth transistor of the first conductivity type having a control terminal supplied with a third bias voltage, the tenth transistor of the second conductivity type having a control terminal supplied with a fourth bias voltage.

(Supplementary Note 30)

A data driver comprising:

a decoder that receives a plurality of reference voltages to decode input video data to output a voltage out of the plurality of reference voltages, corresponding to the input video data; and an output circuit according to any one of Supplementary notes 1 to 28, the output circuit receiving the voltage output from the decoder at the input terminal and having the output terminal connected to a data line, or a display device including the data driver.

(Supplementary Note 31)

An output circuit comprising:

a differential input stage;

an output amplifier stage;

a current control circuit;

an input terminal;

an output terminal; and first to fourth power supply terminals, wherein the differential input stage includes:

a first differential pair including a pair of transistors having a pair of inputs for differentially receiving an input voltage at the input terminal and an output voltage at the output terminal;

a first current source that drives the first differential pair;

a first current mirror including a pair of transistors of a first conductivity type connected between the first power supply terminal and first and second nodes and receiving a pair of output currents of the first differential pair;

a second current mirror including pair of transistors of a second conductivity type connected between the second power supply terminal and third and fourth nodes;

a first floating current source circuit connected between the second node, to which an input of the first current mirror is connected, and the fourth node, to which an input of the second current mirror is connected; and a second floating current source circuit connected between the first node, to which an output of the first current mirror is connected, and the third node, to which an output of the second current mirror is connected, wherein the output amplifier stage includes:

a first transistor of a first conductivity type that is connected between the third power supply terminal and the output terminal that has a control terminal connected to the first node; and a second transistor of a second conductivity type that is connected between the fourth power supply terminal and the output terminal that has a control terminal connected to the third node, wherein the current control circuit includes at least one out of a first circuit and a second circuit, the first circuit including a second current source connected between the first power supply terminal and the second current mirror, the first circuit performing control of switching between activating the second current source to couple the current from the second current source to a current on an input side of the second current mirror, and deactivating the second current source, depending on whether or not the input voltage at the input terminal is greater on comparison than the output voltage at the output terminal by a value more than a first preset value, the second circuit including a third current source connected between the second power supply terminal and the first current mirror, the second circuit performing control of switching between activating the third current source to couple the current from the third current source to a current on an input side of the first current mirror, and deactivating the third current source, depending on whether or not the input voltage at the input terminal is lower on comparison than the output voltage at the output terminal by a value more than a second preset value.

(Supplementary Note 32)

The output circuit according to Supplementary note 31, wherein in the current control circuit, the first circuit includes a first switch and the second current source connected in series between the first power supply terminal and a preset node on the input side of the second current mirror, the first switch being respectively set on or off, depending on whether or not the input voltage is higher by more than the first preset value than the output voltage, wherein the second circuit includes a second switch and the third current source connected in series between the second power supply terminal and a preset node on the input side of the first current mirror, the second switch being respectively set on or off, depending on whether or not the input voltage is lower by more than the second preset value than the output voltage.

(Supplementary Note 33)

The output circuit according to Supplementary note 31, wherein in the current control circuit, the first circuit includes:

a first load element and the second current source having one ends connected in common to the first power supply terminal;

a third transistor of a second conductivity type having a first terminal connected to the output terminal, having a second terminal connected to the other end of the first load element, and having a control terminal connected to the input terminal; and a fourth transistor of a first conductivity type having a first terminal connected to the other end of the second current source, having a second terminal connected to a preset node on an input side of the second current mirror, and having a control terminal connected to a connection node between the other end of the first load element and a second terminal of the third transistor, wherein the second circuit includes:

a second load element and the third current source having one ends connected in common to the second power supply terminal;

a fifth transistor of a first conductivity type having a first terminal connected to the output terminal, having a second terminal connected to the other end of the second load element, and having a control terminal connected to the input terminal; and a sixth transistor of a second conductivity type having a first terminal connected to the other end of the third current source, having a second terminal connected to a preset node on the input side of the first current mirror, and having a control terminal connected to a connection node between the other end of the second load element and a second terminal of the fifth transistor.

(Supplementary Note 34)

An output circuit comprising:

a differential input stage;

an output amplifier stage;

a current control circuit;

an input terminal;

an output terminal; and first to fourth power supply terminals, wherein the differential input stage includes:

a first differential pair including pair of transistors; the pair of transistors differentially receiving an input signal at the input terminal and an output signal at the output terminal;

a first current source that drives the first differential pair;

a first current mirror including a pair of transistors of the first conductivity type connected between the first power supply terminal and first and second nodes and receiving a pair of output currents of the first differential pair;

a second current mirror including a pair of transistors of a second conductivity type, the second current mirror being connected between the second power supply terminal and third and fourth nodes;

a first floating current source circuit connected between the second node, to which an input of the first current mirror is connected, and the fourth node, to which an input of the second current mirror is connected; and a second floating current source circuit connected between the first node, to which an output of the first current mirror is connected, and the third node, to which an output of the second current mirror is connected, wherein the output amplifier stage includes:

a first transistor of a first conductivity type connected between the third power supply terminal and the output terminal; a control terminal of the first transistor being connected to the first node; and a second transistor of a second conductivity type connected between the fourth power supply terminal and the output terminal; a control terminal of the second transistor being connected to the third node, and wherein the current control circuit includes:

a first load element and a second current source having one ends connected in common to the first power supply terminal;

a third transistor of a second conductivity type having a first terminal connected to the output terminal, a second terminal connected to the other end of the first load element and a control terminal connected to the input terminal;

a fourth transistor of a first conductivity type having a first terminal connected to the other end of the second current source, a second terminal connected to a preset node on an input side of the second current mirror and a control terminal connected to a connection node between the other end of the first load element and the second terminal of the third transistor;

the second load element and a third current source having one ends connected in common to the second power supply terminal;

a fifth transistor of the first conductivity type having a first terminal connected to the output terminal, a second terminal connected to the other end of the second load element and a control terminal connected to the input terminal; and a sixth transistor of the second conductivity type having a first terminal connected to the other end of the third current source, a second terminal connected to a preset node on an input side of the first current mirror and a control terminal connected to a connection node between the other end of the second load element and the second terminal of the fifth transistor.

(Supplementary Note 35)

The output circuit according to any one of Supplementary notes 31 to 34, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node, and having control terminals connected together, the second terminal of one of the second stage pair of transistors of the first conductivity type, that is connected to the second node, being connected to the control terminals of the first stage pair of transistors of the first conductivity type, a pair of outputs of the first differential pair being connected to a pair of connection nodes between the first stage pair of transistors of the first conductivity type and the second stage pair of transistors of the first conductivity type.

(Supplementary Note 36)

The output circuit according to any one of Supplementary notes 31 to 35, wherein the second current mirror includes, as the pair of transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, that is connected to the fourth node, being connected to the control terminals of the first stage pair of transistors of the second conductivity type.

(Supplementary Note 37)

The output circuit according to any one of Supplementary notes 31 to 34, wherein the differential input stage further includes a second differential pair having pair inputs connected in common to pair inputs of the first differential pair and having pair outputs connected to preset nodes on input and output sides of the second current mirror; said second differential pair being of the conductivity type opposite to that of the first differential pair; and a fourth current source that drives the second differential pair.

(Supplementary Note 38)

The output circuit according to Supplementary note 37, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node and having control terminals connected together, the second terminal of one of the second stage pair of transistors of the first conductivity type, that is connected to the second node, being connected to the control terminals of the first stage pair of transistors of the first conductivity type;

a pair of outputs of the first differential pair being connected to a pair of connection nodes between the first stage pair of transistors of the first conductivity type and the second stage pair of transistors of the first conductivity type, wherein the second current mirror includes, as the pair transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, that is connected to the fourth node, being connected to the control terminals of the first stage pair of transistors of the second conductivity type;

the pair of outputs of the second differential pair being connected to a pair of connection nodes between the first stage pair of transistors of the second conductivity type and the second stage pair of transistors of the second conductivity type.

(Supplementary Note 39)

The output circuit according to any one of Supplementary notes 33 to 38, wherein the second terminal of the fourth transistor of the first conductivity type is connected to the fourth node, to which an input of the second current mirror is connected;

the second terminal of the sixth transistor of the second conductivity type being connected to the second node, to which an input of the first current mirror is connected.

(Supplementary Note 40)

The output circuit according to Supplementary note 36 or 38, wherein the second terminal of the fourth transistor of the first conductivity type is connected to the first terminal of one of the second stage pair of transistors of the second conductivity type connected to the fourth node.

(Supplementary Note 41)

The output circuit according to Supplementary note 35 or 38, wherein the second terminal of the sixth transistor of the second conductivity type is connected to the first terminal of one of the second stage pair of transistors of the first conductivity type connected to the second node.

(Supplementary Note 42)

The output circuit according to Supplementary note 33 or 34, wherein each of the first and second load elements includes a current source.

(Supplementary Note 43)

The output circuit according to Supplementary note 33 or 34, wherein each of the first and second load elements includes a diode.

(Supplementary Note 44)

The output circuit according to Supplementary note 33 or 34, wherein each of the first and second load elements includes a resistance element.

(Supplementary Note 45)

The output circuit according to Supplementary note 31 or 34, further comprising:

(N−1) additional input terminals, N being an integer not less than 2, in addition to the input terminal;

the differential input stage including, in addition to the first differential pair and the first current source, (N−1) differential pairs of the same conductivity type as the first differential pair; the (N−1) differential pairs having pair outputs connected in common to the pair outputs of the first differential pair; and (N−1) current sources that drive the (N−1) differential pairs;

one input of pair inputs of the first differential pair being connected to the input terminal;

one inputs of pair inputs of the (N−1) differential pairs being connected to the (N−1) input terminals;

the other inputs of the pair inputs of the (N−1) differential pairs being connected in common to the output terminal along with the other input of the pair inputs of the first differential pair.

(Supplementary Note 46)

The output circuit according to any one of Supplementary notes 31, 34, 37 and 45, wherein the pair of transistors of the first differential pair are of the first conductivity type.

(Supplementary Note 47)

The output circuit according to any one of Supplementary notes 31, 34, 37 and 45, wherein the pair of transistors of the first differential pair are of the second conductivity type.

(Supplementary Note 48)

The output circuit according to Supplementary note 31 or 34, wherein the first floating current source circuit includes a current source;

the second floating current source circuit including a transistor of a first conductivity type connected between the first node and the third node; the transistor receiving a first bias voltage at a control terminal thereof; and a transistor of a second conductivity type connected between the first node and the third node; the transistor receiving a second bias voltage at a control terminal thereof.

(Supplementary Note 49)

A data driver comprising:

a decoder that receives a reference voltage to decode input video data to output a voltage corresponding to the video data; and an output circuit according to any one of Supplementary notes 31 to 48; the output circuit including the input terminal to receive the voltage output from the decoder and the output terminal connected to a data line.

(Supplementary Note 50)

A display device comprising:

the data driver according to Supplementary note 49.

(Supplementary Note 51)

An output circuit comprising:

a differential input stage;

an output amplifier stage;

a current control circuit;

an input terminal;

an output terminal; and first to fourth power supply terminals, wherein the differential input stage includes:

a first differential pair including pair of transistors; the pair of transistors differentially receiving an input voltage at the input terminal and an output voltage at the output terminal;

a first current source that drives the first differential pair;

a first current mirror including pair of transistors of the first conductivity type connected between the first power supply terminal and first and second nodes and receiving a pair of output currents of the first differential pair;

a second current mirror including a pair of transistors of a second conductivity type, connected between the second power supply terminal and third and fourth nodes;

a first floating current source circuit connected between the second node, to which an input of the first current mirror is connected, and the fourth node, to which an input of the second current mirror is connected; and a second floating current source circuit connected between the first node, to which an output of the first current mirror is connected, and the third node, to which an output of the second current mirror is connected, wherein the output amplifier stage includes:

a first transistor of a first conductivity type that is connected between the third power supply terminal and the output terminal, and that has a control terminal of the first transistor connected to the first node; and a second transistor of a second conductivity type that is connected between the fourth power supply terminal and the output terminal, that has a control terminal of the second transistor connected to the third node; and wherein the current control circuit including at least one out of a first circuit and a second circuit, the first circuit including a second current source connected between the first power supply terminal and the first current mirror, the first circuit comparing the input voltage at the input terminal and the output voltage at the output terminal, the first circuit performing control of switching between activating the second current source to couple the current from the second current source to a current on an input side of the first current mirror and deactivating the second current source, depending on whether or not the input voltage is higher by more than a first preset value than the output voltage, the second circuit including a third current source that is connected between the second power supply terminal and the second current mirror, the second circuit comparing the input voltage at the input terminal and the output voltage at the output terminal, the second circuit performing control of switching between activating the third current source to couple the current from the third current source to a current of an input side of the second current mirror, and deactivating the third current source, depending on whether or not the input voltage is lower by more than a second preset value than the output voltage.

(Supplementary Note 52)

The output circuit according to Supplementary note 51, wherein in the current control circuit, the first circuit includes a first switch and the second current source connected in series between the first power supply terminal and a preset node on the input side of the first current mirror;

the first switch being respectively set on or off, depending on whether the input voltage is higher by more than the first preset value than the output voltage;

the second circuit including a second switch and the third current source connected in series between the second power supply terminal and a preset node on the input side of the second current mirror;

the second switch being respectively set on or off, depending on whether the input voltage is lower by more than the second preset value than the output voltage.

(Supplementary Note 53)

The output circuit according to Supplementary note 51, wherein in the current control circuit, the first circuit includes a first load element and the second current source having one ends connected in common to the first power supply terminal;

a third transistor of a second conductivity type having a first terminal connected to the output terminal, a second terminal connected to the other end of the first load element and a control terminal connected to the input terminal; and a fourth transistor of a first conductivity type having a first terminal connected to the other end of the second current source, a second terminal connected to a preset node on an input side of the first current mirror and a control terminal connected to a connection node between the other end of the first load element and a second terminal of the third transistor;

the second circuit including a second load element and the third current source having one ends connected in common to the second power supply terminal;

a fifth transistor of a first conductivity type having a first terminal connected to the output terminal, a second terminal connected to the other end of the second load element and a control terminal connected to the input terminal; and a sixth transistor of a second conductivity type having a first terminal connected to the other end of the third current source, a second terminal connected to a preset node on the input side of the second current mirror and a control terminal connected to a connection node between the other end of the second load element and a second terminal of the fifth transistor.

(Supplementary Note 54)

An output circuit comprising:

a differential input stage;

an output amplifier stage;

a current control circuit;

an input terminal;

an output terminal; and first to fourth power supply terminals, wherein the differential input stage includes:

a first differential pair including pair of transistors; the pair of transistors differentially receiving an input signal at the input terminal and an output signal at the output terminal;

a first current source that drives the first differential pair;

a first current mirror including pair of transistors of the first conductivity type that connected between the first power supply terminal and first and second nodes and receiving a pair of output currents of the first differential pair;

a second current mirror including a pair of transistors of a second conductivity type, connected between the second power supply terminal and third and fourth nodes;

a first floating current source circuit connected between the second node, to which an input of the first current mirror is connected, and the fourth node, to which an input of the second current mirror is connected; and a second floating current source circuit connected between the first node, to which an output of the first current mirror is connected, and the third node, to which an output of the second current mirror is connected, wherein the output amplifier stage includes:

a first transistor of a first conductivity type connected between the third power supply terminal and the output terminal; a control terminal of the first transistor being connected to the first node; and a second transistor of a second conductivity type connected between the fourth power supply terminal and the output terminal; a control terminal of the second transistor being connected to the third node, and wherein the current control circuit includes:

a first load element and a second current source having one ends connected in common to the first power supply terminal;

a third transistor of a second conductivity type having a first terminal connected to the output terminal, a second terminal connected to the other end of the first load element and a control terminal connected to the input terminal;

a fourth transistor of a first conductivity type having a first terminal connected to the other end of the second current source, a second terminal connected to a preset node on an input side of the first current mirror and a control terminal connected to a connection node between the other end of the first load element and the second terminal of the third transistor;

a second load element and a third current source having one ends connected in common to the second power supply terminal;

a fifth transistor of the first conductivity type having a first terminal connected to the output terminal, having a second terminal connected to the other end of the second load element and having a control terminal connected to the input terminal; and a sixth transistor of the second conductivity type having a first terminal connected to the other end of the third current source, having a second terminal connected to a preset node on an input side of the second current mirror, and having a control terminal connected to a connection node between the other end of the second load element and the second terminal of the fifth transistor.

(Supplementary Note 55)

The output circuit according to any one of Supplementary notes 51 to 54, wherein the first current mirror includes, as the pair transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node, and having control terminals connected together;

the second terminal of one of the second stage pair of transistors of the first conductivity type, that is connected to the second node, being connected to the control terminals of the first stage pair of transistors of the first conductivity type;

a pair of outputs of the first differential pair being connected to a pair of connection nodes between the first stage pair of transistors of the first conductivity type and second stage pair of transistors of the first conductivity type.

(Supplementary Note 56)

The output circuit according to any one of Supplementary notes 51 to 55, wherein the second current mirror includes, as the pair of transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node, and having control terminals connected together;

the second terminal of one of the second stage pair of transistors of the second conductivity type, that is connected to the fourth node, being connected the control terminals of the first stage pair of transistors of the second conductivity type.

(Supplementary Note 57)

The output circuit according to any one of Supplementary notes 51 to 54, wherein the differential input stage further includes a second differential pair having pair inputs connected in common to pair inputs of the differential pair and having pair outputs connected to preset nodes on input and output sides of the second current mirror; and a fourth current source that drives the second differential pair.

(Supplementary Note 58)

The output circuit according to Supplementary note 57, wherein the first current mirror includes, as the pair of transistors of the first conductivity type, a first stage pair of transistors of the first conductivity type having first terminals connected in common to the first power supply terminal and having control terminals connected together; and a second stage pair of transistors of the first conductivity type having first terminals connected to second terminals of the first stage pair of transistors of the first conductivity type, having second terminals connected to the first node and to the second node and having control terminals connected together;

the second terminal of one of the second stage pair of transistors of the first conductivity type, being connected to the second node, and being connected to the control terminals of the first stage pair of transistors of the first conductivity type, a pair of outputs of the first differential pair being connected to a pair of connection nodes between the first stage pair of transistors of the first conductivity type and the second stage pair of transistors of the first conductivity type, the second current mirror including, as the pair of transistors of the second conductivity type, a first stage pair of transistors of the second conductivity type having first terminals connected in common to the second power supply terminal and having control terminals connected together; and a second stage pair of transistors of the second conductivity type having first terminals connected to second terminals of the first stage pair of transistors of the second conductivity type, having second terminals connected to the third node and to the fourth node and having control terminals connected together, the second terminal of one of the second stage pair of transistors of the second conductivity type, being connected to the fourth node, and being connected to the control terminals of the first stage pair of transistors of the second conductivity type, the pair of outputs of the second differential pair being connected to a pair of connection nodes between the first stage pair of transistors of the second conductivity type and the second stage pair of transistors of the second conductivity type.

(Supplementary Note 59)

The output circuit according to any one of Supplementary notes 53 to 57, wherein the second terminal of the fourth transistor of the first conductivity type is connected to the second node, to which an input of the first current mirror is connected;

the second terminal of the sixth transistor of the second conductivity type being connected to the fourth node, to which an input of the second current mirror is connected.

(Supplementary Note 60)

The output circuit according to Supplementary note 55 or 58, wherein the second terminal of the fourth transistor of the first conductivity type is connected to the first terminal of one of the second stage pair of transistors of the first conductivity type connected to the second node.

(Supplementary Note 61)

The output circuit according to Supplementary note 56 or 58, wherein the second terminal of the sixth transistor of the second conductivity type is connected to the first terminal of one of the second stage pair of transistors of the second conductivity type connected to the fourth node.

(Supplementary Note 62)

The output circuit according to Supplementary note 53 or 54, wherein each of the first and second load elements includes a current source.

(Supplementary Note 63)

The output circuit according to Supplementary note 53 or 54, wherein each of the first and second load elements includes a diode.

(Supplementary Note 64)

The output circuit according to Supplementary note 53 or 54, wherein each of the first and second load elements includes a resistance element.

(Supplementary Note 65)

The output circuit according to Supplementary note 1 or 54, further comprising:

(N−1) additional input terminals, N being an integer not less than 2, in addition to the input terminal;

the differential input stage including, in addition to the first differential pair and the first current source, (N−1) differential pairs of the same conductivity type as the first differential pair, the (N−1) differential pairs having pair outputs connected in common to the pair outputs of the first differential pair; and (N−1) current sources that drive the (N−1) differential pairs;

one input of pair inputs of the first differential pair being connected to the input terminal, one inputs of pair inputs of the (N−1) differential pairs being connected to the N−1 input terminals, the remaining inputs of the pair inputs of the (N−1) differential pairs being connected in common to the output terminal along with the other input of the pair inputs of the first differential pair.

(Supplementary Note 66)

The output circuit according to any one of Supplementary notes 51, 54, 57 and 65, wherein the pair of transistors of the first differential pair are of the first conductivity type.

(Supplementary Note 67)

The output circuit according to any one of Supplementary notes 51, 54, 57 and 65, wherein the pair of transistors of the first differential pair are of the second conductivity type.

(Supplementary Note 68)

The output circuit according to Supplementary note 1 or 54, wherein the first floating current source circuit includes a transistor of a first conductivity type and a transistor of a second conductivity type connected in parallel to each other between the second node and the fourth node; the transistors receiving a first bias voltage and a second bias voltage at control terminals thereof;

the second floating current source circuit including a transistor of a first conductivity type and a transistor of a second conductivity type connected between the first node and the third node in parallel to each other; the transistors receiving a third bias voltage and a fourth bias voltage at control terminals thereof.

(Supplementary Note 69)

A data driver comprising:

a decoder that receives a reference voltage to decode input video data to output a voltage corresponding to the video data; and an output circuit according to any one of Supplementary notes 51 to 68; the output circuit including the input terminal to receive the voltage output from the decoder and the output terminal connected to a data line.

(Supplementary Note 70)

A display device comprising:

the data driver according to Supplementary note 69.

What is claimed is:

1. An output circuit comprising:

a differential input stage;

an output amplifier stage;

a current control circuit;

an input terminal;

an output terminal; and first to fourth power supply terminals, wherein said differential input stage includes a first differential pair that includes a pair of transistors which have a pair of inputs for differentially receiving an input voltage at said input terminal and an output voltage at said output terminal, respectively;

a first current source that drives said first differential pair;

a first current mirror that includes a pair of transistors of a first conductivity type connected between said first power supply terminal and first and second nodes and receiving a pair of output currents of said first differential pair;

a second current mirror that includes a pair of transistors of a second conductivity type connected between said second power supply terminal and third and fourth nodes;

a first floating current source circuit that is connected between said second node, to which an input of said first current mirror is connected, and said fourth node, to which an input of said second current mirror is connected; and a second floating current source circuit that is connected between said first node, to which an output of said first current mirror is connected, and said third node, to which an output of said second current mirror is connected, wherein said output amplifier stage includes:

a first transistor of a first conductivity type that is connected between said third power supply terminal and said output terminal, and that has a control terminal connected to said first node; and a second transistor of a second conductivity type that is connected between said fourth power supply terminal and said output terminal, and that has a control terminal connected to said third node, and wherein said current control circuit includes at least one of a first circuit and a second circuit, said first circuit that including a second current source connected to said first power supply terminal, said first circuit performing control of switching between activating said second current source to couple a current from said second current source to one of a current input to said first floating current source circuit and a current output from said first floating current source circuit, and deactivating said second current source, depending on whether or not a voltage difference between said output voltage at said output terminal and a voltage at said first power supply terminal is greater on comparison by more than a predetermined first preset value than a voltage difference between said input voltage at said input terminal and said voltage at said first power supply terminal, said second circuit that including a third current source connected to said second power supply terminal, said second circuit performing control of switching between activating said third current source to couple a current from said third current source to the other of a current input to said first floating current source circuit or to a current output from said first floating current source circuit, and deactivating said third current source, depending on whether or not a voltage difference between said output voltage of said output terminal and a voltage at said second power supply terminal is greater on comparison by more than a predetermined second preset value than a voltage difference between said input voltage at said input terminal and a voltage at said second power supply terminal.

2. The output circuit according to claim 1, wherein in said current control circuit, said second current source of said first circuit is connected between said first power supply terminal and said second current mirror, said first circuit performing control of switching between activating said second current source to couple said current from said second current source to a current on an input side of said second current mirror, and deactivating said second current source, depending on whether or not said voltage difference between said output voltage at said output terminal and said voltage at said first power supply terminal is greater on comparison by more than said predetermined first preset value than a voltage difference between said input voltage at said input terminal and said voltage at said first power supply terminal, and said third current source of said second circuit is connected between said second power supply terminal and said first current mirror, said second circuit performing control of switching between activating said third current source to couple said current from said third current source to a current on an input side of said first current mirror, and deactivating said third current source, depending on whether or not a voltage difference between said output voltage at said output terminal and said voltage at said second power supply terminal is greater on comparison by more than said predetermined second preset value than a voltage difference between said input voltage at said input terminal and said voltage at said second power supply terminal.

3. The output circuit according to claim 2, wherein in said current control circuit, said first circuit further includes a first switch connected in series with said second current source between said first power supply terminal and a preset node on said input side of said second current mirror, said first switch being respectively set on or off, depending on whether or not a voltage difference between said output voltage and said voltage at said first power supply terminal is greater on comparison by more than said first preset value than a voltage difference between said input voltage and said voltage at said first power supply terminal, and said second circuit further includes a second switch connected in series with said third current source between said second power supply terminal and a preset node on said input side of said first current mirror, said second switch being respectively set on or off, depending on whether or not a voltage difference between said output voltage and said voltage at said second power supply terminal is greater on comparison by more than said second preset value than a voltage difference between said input voltage and said voltage at said second power supply terminal.

4. The output circuit according to claim 2, wherein in said current control circuit, said first circuit further includes:

a first load element that has one end connected in common with one end of said second current source to said first power supply terminal;

a third transistor of said second conductivity type that has a first terminal connected to said output terminal, has a second terminal connected to the other end of said first load element, and has a control terminal connected to said input terminal; and a fourth transistor of said first conductivity type that has a first terminal connected to the other end of said second current source, has a second terminal connected to a predetermined preset node on an input side of said second current mirror, and has a control terminal connected to a connection node between the other end of said first load element and said second terminal of said third transistor, and wherein said second circuit further includes:

a second load element that has one end connected in common with one end of said third current source to said second power supply terminal;

a fifth transistor of said first conductivity type that has a first terminal connected to said output terminal, has a second terminal connected to the other end of said second load element, and has a control terminal connected to said input terminal; and a sixth transistor of said second conductivity type that has a first terminal connected to the other end of said third current source, has a second terminal connected to a predetermined preset node on said input side of said first current mirror, and has a control terminal connected to a connection node between the other end of said second load element and said second terminal of said fifth transistor.

5. The output circuit according to claim 1, wherein said first current mirror includes, as said pair transistors of said first conductivity type, a first stage pair of transistors of said first conductivity type that have first terminals connected in common to said first power supply terminal and have control terminals connected together; and a second stage pair of transistors of said first conductivity type that have first terminals connected to second terminals of said first stage pair of transistors of said first conductivity type, have second terminals connected respectively to said first node and to said second node, and have control terminals connected together, said second terminal of one of said second stage pair of transistors of said first conductivity type that is connected to said second node, being connected to said control terminals of said first stage pair of transistors of said first conductivity type, a pair of outputs of said first differential pair being connected respectively to a pair of connection nodes between said first stage pair of transistors of said first conductivity type and said second stage pair of transistors of said first conductivity type.

6. The output circuit according to claim 1, wherein said second current mirror includes, as said pair transistors of said second conductivity type, a first stage pair of transistors of said second conductivity type that have first terminals connected in common to said second power supply terminal, and have control terminals connected together; and a second stage pair of transistors of said second conductivity type that have first terminals connected to second terminals of said first stage pair of transistors of said second conductivity type, have second terminals connected respectively to said third node and to said fourth node, and have control terminals connected together, said second terminal of one of said second stage pair of transistors of said second conductivity type, that is connected to said fourth node, being connected to said control terminals of said first stage pair of transistors of said second conductivity type.

7. The output circuit according to claim 1, wherein said differential input stage further includes:

a second differential pair including a pair of transistors of a conductivity type opposite to a conductivity type of said first differential pair, said second differential pair having a pair of inputs connected in common to a pair of inputs of said first differential pair and having a pair of outputs connected respectively to preset nodes on input and output sides of said second current mirror; and a fourth current source that drives said second differential pair.

8. The output circuit according to claim 7, wherein said first current mirror includes, as said pair transistors of said first conductivity type, a first stage pair of transistors of said first conductivity type that have first terminals connected in common to said first power supply terminal and have control terminals connected together; and a second stage pair of transistors of said first conductivity type that have first terminals connected to second terminals of said first stage pair of transistors of said first conductivity type, have second terminals connected respectively to said first node and said second node, and have control terminals connected together, said second terminal of one of said second stage pair of transistors of said first conductivity type, that is connected to said second node, being connected to said control terminals of said first stage pair of transistors of said first conductivity type, a pair of outputs of said first differential pair being connected respectively to a pair of connection nodes of said first stage of transistors of said first conductivity type and said second stage pair of transistors of said first conductivity type, and wherein said second current mirror includes, as said pair of transistors of said second conductivity type, a first stage pair of transistors of said second conductivity type that have first terminals connected in common to said second power supply terminal, and have control terminals connected together; and a second stage pair of transistors of said second conductivity type that have first terminals connected to second terminals of said first stage pair of transistors of said second conductivity type, have second terminals connected to said third node and said fourth node, and have control terminals connected together, said second terminal of one of said second stage pair of transistors of said second conductivity type, that is connected to said fourth node, being connected to said control terminals of said first stage pair of transistors of said second conductivity type;

said pair of outputs of said second differential pair being connected respectively to a pair of connection nodes of said first stage transistors of said second conductivity type and said second stage pair of transistors of said second conductivity type.

9. The output circuit according to claim 4, wherein said second terminal of said fourth transistor of said first conductivity type is connected to said fourth node, to which an input of said second current mirror is connected, and said second terminal of said sixth transistor of said second conductivity type is connected to said second node, to which an input of said first current mirror is connected.

10. The output circuit according to claim 6, wherein said first circuit further comprises a fourth transistor of said first conductivity type, and a second terminal of said fourth transistor of said first conductivity type is connected to said first terminal of one of said second stage pair of transistors of said second conductivity type, that is connected to said fourth node.

11. The output circuit according to claim 5, wherein said second circuit further comprises a sixth transistor of said second conductivity type, and a second terminal of said sixth transistor of said second conductivity type is connected to said first terminal of one of said second stage pair of transistors of said first conductivity type connected to said second node.

12. The output circuit according to claim 1, wherein said first floating current source circuit includes a current source, and wherein said second floating current source circuit includes a third transistor of said first conductivity type that is connected between said first node and said third node and that has a control terminal supplied with a first bias voltage; and a fourth transistor of said second conductivity type that is connected between said first node and said third node and that has a control terminal supplied with a second bias voltage.

13. The output circuit according to claim 1, wherein in said current control circuit, said second current source of said first circuit is connected between said first power supply terminal and said first current mirror, said first circuit performing control of switching between activating said second current source to couple said current from said second current source to said current on an input side of said first current mirror, and deactivating said second current source, depending on whether or not a voltage difference between said output voltage of said output terminal and said voltage at said first power supply terminal is greater on comparison by more than said preset first value than a voltage difference between said input voltage at said input terminal and said voltage at said first power supply terminal, and said third current source of said second circuit is connected between said second power supply terminal and said second current mirror, said second circuit performing control of switching between activating said third current source to couple said current from said third current source to said current on an input side of said second current mirror, and deactivating said third current source, depending on whether or not a voltage difference between said output voltage of said output terminal and said voltage at said second power supply terminal is greater on comparison by more than said preset second value than a voltage difference between said input voltage at said input terminal and said voltage at said second power supply terminal.

14. The output circuit according to claim 13, wherein in said current control circuit, said first circuit further includes a first switch connected in series with said second current source between said first power supply terminal and a preset node on said input side of said first current mirror, said first switch being respectively set on or off, depending on whether or not a voltage difference between said output voltage and said voltage at said first power supply terminal is greater on comparison than a voltage difference between said input voltage and said voltage at said first power supply terminal by a value more than said preset first value, and said second circuit further includes a second switch connected in series with said third current source between said second power supply terminal and a preset node on said input side of said second current mirror, said second switch being respectively set on or off depending on whether or not a voltage difference between said output voltage and said voltage at said second power supply terminal is greater on comparison than a voltage difference between said input voltage and said voltage at said second power supply terminal by a value more than said second preset value.

15. The output circuit according to claim 13, wherein in said current control circuit, said first circuit further includes:

a first load element that has one end connected in common with one end of said second current source to said first power supply terminal;

a third transistor of said second conductivity type that has a first terminal connected to said output terminal, has a second terminal connected to the other end of said first load element, and has a control terminal connected to said input terminal; and a fourth transistor of said first conductivity type that has a first terminal connected to the other end of said second current source, has a second terminal connected to a preset node on an input side of said first current mirror, and has a control terminal connected to a connection node between the other end of said first load element and said second terminal of said third transistor, wherein said second circuit further includes:

a second load element that has one end connected in common with one end of said third current source to said second power supply terminal;

a fifth transistor of said first conductivity type that has a first terminal connected to said output terminal, has a second terminal connected to the other end of said second load element, and has a control terminal connected to said input terminal; and a sixth transistor of said second conductivity type that has a first terminal connected to the other end of said third current source, has a second terminal connected to a preset node on said input side of said second current mirror, and has a control terminal connected to a connection node between the other end of said second load element and said second terminal of said fifth transistor.

16. The output circuit according to claim 13, wherein said first current mirror includes, as said pair transistors of the first conductivity type, a first stage pair of transistors of said first conductivity type that have first terminals connected in common to said first power supply terminal, and have control terminals connected together; and a second stage pair of transistors of said first conductivity type that have first terminals connected to second terminals of said first stage pair of transistors of said first conductivity type, have second terminals connected respectively to said first node and to said second node, and have control terminals connected together, said second terminal of one of said second stage pair of transistors of said first conductivity type, that is connected to said second node, being connected to said control terminals of said first stage pair of transistors of said first conductivity type, a pair of outputs of said first differential pair being connected respectively to a pair of connection nodes between said first stage pair of transistors of said first conductivity type and said second stage pair of transistors of said first conductivity type.

17. The output circuit according to claim 13, wherein said second current mirror includes, as said pair transistors of said second conductivity type, a first stage pair of transistors of said second conductivity type that have first terminals connected in common to said second power supply terminal, and have control terminals connected together; and a second stage pair of transistors of said second conductivity type that have first terminals connected to second terminals of said first stage pair of transistors of said second conductivity type, have second terminals connected respectively to said third node and said fourth node and having control terminals connected together;

said second terminal of one of said second stage pair of transistors of said second conductivity type, that is connected to said fourth node, being connected to said control terminals of said first stage pair of transistors of said second conductivity type.

18. The output circuit according to claim 13, wherein said differential input stage further includes a second differential pair, that includes a pair of transistors of a conductivity type opposite to a conductivity type of said first differential pair, having pair inputs connected in common to a pair of inputs of said first differential pair and having a pair of outputs connected respectively to preset nodes on input and output sides of the second current mirror; and a fourth current source that drives said second differential pair.

19. The output circuit according to claim 18, wherein said first current mirror includes, as said pair of transistors of said first conductivity type, a first stage pair of transistors of said first conductivity type that have first terminals connected in common to said first power supply terminal, and have control terminals connected together; and a second stage pair of transistors of said first conductivity type that have first terminals connected to second terminals of said first stage pair of transistors of said first conductivity type, have second terminals connected respectively to said first node and said second node, and have control terminals connected together, said second terminal of one of said second stage pair of transistors of said first conductivity type, that is connected to said second node, being connected to said control terminals of said first stage pair of transistors of said first conductivity type, a pair of outputs of said first differential pair being connected to a pair of connection nodes between said first stage pair of transistors of said first conductivity type and second stage pair of transistors of said first conductivity type, wherein said second current mirror includes, as said pair of transistors of said second conductivity type, a first stage pair of transistors of said second conductivity type that have terminals connected in common to said second power supply terminal, and have control terminals connected together; and a second stage pair of transistors of said second conductivity type that have first terminals connected to second terminals of said first stage pair of transistors of said second conductivity type, have second terminals connected respectively to said third node and said fourth node, and have control terminals connected together, said second terminal of one of said second stage pair of transistors of said second conductivity type, that is connected to said fourth node, being connected to said control terminals of said first stage pair of transistors of said second conductivity type, said pair of outputs of said second differential pair being connected respectively to a pair of connection nodes between said first stage pair of transistors of said second conductivity type and said second stage pair of transistors of said second conductivity type.

20. The output circuit according to claim 15, wherein said second terminal of said fourth transistor of said first conductivity type is connected to said second node, to which an input of said first current mirror is connected, and said second terminal of said sixth transistor of said second conductivity type is connected to said fourth node, to which an input of said second current mirror is connected.

21. The output circuit according to claim 16, wherein said first circuit further comprises a fourth transistor of said first conductivity type, and a second terminal of said fourth transistor of said first conductivity type is connected to said first terminal of one of said second stage pair of transistors of said first conductivity type connected to said second node.

22. The output circuit according to claim 17, wherein said second circuit further comprises a sixth transistor of said second conductivity type, and a second terminal of said sixth transistor of said second conductivity type is connected to said first terminal of one of said second stage pair of transistors of said second conductivity type, that is connected to said fourth node.

23. The output circuit according to claim 4, wherein each of said first and second load elements includes a current source.

24. The output circuit according to claim 4, wherein each of said first and second load elements includes a diode.

25. The output circuit according to claim 4, wherein each of said first and second load elements includes a resistance element.

26. The output circuit according to claim 4, comprising in addition to said input terminal, (N−1) additional input terminals, N being an integer not less than 2, wherein said differential input stage includes, in addition to said first differential pair and said first current source, (N−1) differential pairs of the same conductivity type as said first differential pair, said (N−1) differential pairs having pair of outputs connected in common to said pair of outputs of said first differential pair; and (N−1) current sources that respectively drive said (N−1) differential pairs;

one input of a pair of inputs of said first differential pair being connected to said input terminal, one inputs of (N−1) pair of inputs of said (N−1) differential pairs being connected respectively to said N−1 input terminals, the other inputs of said (N−1) pair of inputs of said (N−1) differential pairs being connected in common to said output terminal along with the other input of said pair inputs of said first differential pair.

27. An output circuit comprising:

a differential input stage;

an output amplifier stage;

a current control circuit;

an input terminal;

an output terminal; and first to fourth power supply terminals, wherein said differential input stage includes:

a first differential pair including pair of transistors that have a pair of inputs for differentially receiving an input signal at said input terminal and an output signal at said output terminal;

a first current source that drives said first differential pair;

a first current mirror including a pair of transistors of a first conductivity type connected between said first power supply terminal and first and second nodes and receiving a pair of output currents of said first differential pair;

a second current mirror including a pair of transistors of a second conductivity type connected between said second power supply terminal and third and fourth nodes;

a first floating current source circuit connected between said second node, to which an input of said first current mirror is connected, and said fourth node, to which an input of said second current mirror is connected; and a second floating current source circuit connected between said first node, to which an output of said first current mirror is connected, and said third node, to which an output of said second current mirror is connected, wherein said output amplifier stage includes:

a first transistor of a first conductivity type connected between said third power supply terminal and said output terminal; a control terminal of said first transistor being connected to said first node; and a second transistor of a second conductivity type connected between said fourth power supply terminal and said output terminal; a control terminal of said second transistor being connected to said third node, and wherein said current control circuit includes:

a first load element and a second current source having one ends connected in common to said first power supply terminal;

a third transistor of a second conductivity type having a first terminal connected to said output terminal, having a second terminal connected to the other end of said first load element, and having a control terminal connected to said input terminal;

a fourth transistor of said first conductivity type having a first terminal connected to the other end of said second current source, having a second terminal connected to a predetermined node on an input side of said second current mirror, and having a control terminal connected to a connection node between the other end of said first load element and said second terminal of said third transistor;

a second load element and a third current source having one ends connected in common to said second power supply terminal;

a fifth transistor of said first conductivity type having a first terminal connected to said output terminal, having a second terminal connected to the other end of said second load element, and having a control terminal connected to said input terminal; and a sixth transistor of said second conductivity type having a first terminal connected to the other end of said third current source, having a second terminal connected to a predetermined preset node on an input side of said first current mirror, and having a control terminal connected to a connection node between the other end of said second load element and said second terminal of said fifth transistor.

28. An output circuit comprising:

a differential input stage;

an output amplifier stage;

a current control circuit;

an input terminal;

an output terminal; and first to fourth power supply terminals, wherein said differential input stage includes:

a first differential pair including pair of transistors that have a pair of inputs for differentially receiving an input signal at said input terminal and an output signal at said output terminal;

a first current source that drives said first differential pair;

a first current mirror including pair of transistors of said first conductivity type that connected between said first power supply terminal and first and second nodes and receiving a pair of output currents of said first differential pair;

a second current mirror including a pair of transistors of a second conductivity type, connected between said second power supply terminal and third and fourth nodes;

a first floating current source circuit connected between said second node, to which an input of said first current mirror is connected, and said fourth node, to which an input of said second current mirror is connected; and a second floating current source circuit connected between said first node, to which an output of said first current mirror is connected, and said third node, to which an output of said second current mirror is connected, wherein said output amplifier stage includes:

a first transistor of a first conductivity type connected between said third power supply terminal and said output terminal; a control terminal of said first transistor being connected to said first node; and a second transistor of a second conductivity type connected between said fourth power supply terminal and said output terminal; a control terminal of said second transistor being connected to said third node, and wherein said current control circuit includes:

a first load element and a second current source having one ends connected in common to said first power supply terminal;

a third transistor of a second conductivity type having a first terminal connected to said output terminal, a second terminal connected to the other end of said first load element and a control terminal connected to said input terminal;

a fourth transistor of a first conductivity type having a first terminal connected to the other end of said second current source, a second terminal connected to a predetermined preset node on an input side of said first current mirror and a control terminal connected to a connection node between the other end of said first load element and said second terminal of said third transistor;

a second load element and a third current source having one ends connected in common to said second power supply terminal;

a fifth transistor of said first conductivity type having a first terminal connected to said output terminal, having a second terminal connected to the other end of said second load element and having a control terminal connected to said input terminal; and a sixth transistor of said second conductivity type having a first terminal connected to the other end of said third current source, having a second terminal connected to a predetermined preset node on an input side of said second current mirror, and having a control terminal connected to a connection node between the other end of said second load element and said second terminal of said fifth transistor.

29. The output circuit according to claim 13, wherein said first floating current source circuit includes:

a third transistor of said first conductivity type; and a fourth transistor of said second conductivity type, connected in parallel with each other between said second node and said fourth node, said third transistor of said first conductivity type having a control terminal supplied with a first bias voltage, said fourth transistor of said second conductivity type having a control terminal supplied with a second bias voltage, wherein said second floating current source circuit includes:

a fifth transistor of said first conductivity type; and a sixth transistor of said second conductivity type, connected in parallel with each other between said first node and said third node, said fifth transistor of said first conductivity type having a control terminal supplied with a third bias voltage, said sixth transistor of said second conductivity type having a control terminal supplied with a fourth bias voltage.

30. A data driver comprising:

a decoder that receives a plurality of reference voltages to decode input video data to output a voltage out of said plurality of reference voltages, corresponding to said input video data; and the output circuit according to claim 1, having said input terminal supplied with said voltage output from said decoder and having said output terminal connected to a data line.

31. A display device comprising the data driver according to claim 30.

* * * * *